United States Patent
Park et al.

(10) Patent No.: US 11,776,485 B2
(45) Date of Patent: Oct. 3, 2023

(54) DISPLAY APPARATUS INCLUDING A BRANCHED GATE DRIVING CIRCUIT AND MULTI-SCREEN DISPLAY APPARATUS INCLUDING THE SAME

(71) Applicant: LG Display Co., Ltd., Seoul (KR)

(72) Inventors: EunJi Park, Paju-si (KR); KyungMin Kim, Paju-si (KR); YoungIn Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/565,361

(22) Filed: Dec. 29, 2021

(65) Prior Publication Data

US 2022/0208130 A1 Jun. 30, 2022

(30) Foreign Application Priority Data

Dec. 31, 2020 (KR) .................. 10-2020-0189730

(51) Int. Cl.
*G09G 3/3291* (2016.01)
*G09G 3/3258* (2016.01)

(52) U.S. Cl.
CPC ......... *G09G 3/3291* (2013.01); *G09G 3/3258* (2013.01); *G09G 2300/026* (2013.01)

(58) Field of Classification Search
None
See application file for complete search history.

(56) References Cited

U.S. PATENT DOCUMENTS

| | | | |
|---|---|---|---|
| 2012/0206499 A1* | 8/2012 | Cok | G09G 3/3208 345/690 |
| 2013/0321499 A1* | 12/2013 | Park | G09G 3/3674 345/698 |
| 2017/0117341 A1* | 4/2017 | Chen | G11C 19/184 |
| 2018/0151126 A1* | 5/2018 | Jeong | H01L 27/3258 |
| 2018/0323180 A1* | 11/2018 | Cok | H01L 23/5386 |
| 2020/0051966 A1* | 2/2020 | Lee | H01L 25/18 |

FOREIGN PATENT DOCUMENTS

| | | | |
|---|---|---|---|
| KR | 20110018801 A | * | 2/2011 |
| KR | 10-2019-0043799 A | | 4/2019 |
| KR | 20190043799 A | * | 4/2019 |

* cited by examiner

*Primary Examiner* — Kirk W Hermann
(74) *Attorney, Agent, or Firm* — SEED IP LAW GROUP LLP

(57) ABSTRACT

A display includes a display area having pixels arranged along a first direction and a second direction crossing the first direction over a substrate. Gate lines, data lines, and reference voltage lines are disposed at the display area and are coupled to the pixels. A gate driving circuit includes stage circuit units disposed at the display area and coupled to each of the gate lines. The stage circuit units include branch circuits divisionally disposed between the pixels along the first direction and a branch network disposed at a network line formation portion positioned at one side of each of the pixels disposed along the first direction. The branch network includes control node lines and network lines selectively coupled to the branch circuits. An additional pattern portion is disposed at the network line formation portion to overlap a reference voltage line disposed at each of some of the pixels.

21 Claims, 14 Drawing Sheets

DISPLAY APPARATUS INCLUDING A BRANCHED GATE DRIVING CIRCUIT AND MULTI-SCREEN DISPLAY APPARATUS INCLUDING THE SAME

CROSS-REFERENCE TO RELATED APPLICATIONS

This application claims the benefit of the Korean Patent Application No. 10-2020-0189730 filed on Dec. 31, 2020, which is hereby incorporated by reference as if fully set forth herein.

BACKGROUND

Technical Field

The present disclosure relates to a display apparatus and a multi-screen display apparatus including the same.

Description of the Related Art

Display apparatuses are equipped in home appliances or electronic devices such as televisions (TVs), monitors, notebook computers, smartphones, tablet personal computers (PCs), electronic pads, wearable devices, watch phones, portable information devices, navigation devices, and vehicle control display apparatus, and are used as a screen for displaying an image.

Display apparatuses include a display panel which includes a plurality of pixels each including a thin film transistor (TFT) connected to a data line and a gate line, a data driving circuit which supplies a data voltage to the data line, and a gate driving circuit which supplies a gate signal to the gate line.

Recently, display apparatuses having a gate-in panel (GIP) structure are being used where a gate driving circuit is embedded into a non-display area of a display panel simultaneously with a process of manufacturing a TFT of each pixel, for simplifying a configuration of a circuit element, decreasing the manufacturing cost, and reducing a bezel width.

A gate driving circuit having the GIP structure includes a plurality of stages for supplying a gate signal to a plurality of gate lines. The stages operate dependently based on signals supplied through a plurality of gate shift clock lines and a gate start signal line provided in the display panel.

A display panel including a gate driving circuit having a GIP structure includes a bezel area due to a gate driving circuit disposed in the non-display region. A display apparatus of the related art needs a bezel or a mechanism for covering a bezel area of a display panel.

Recently, multi-screen display apparatuses have been commercialized where a large screen is implemented by arranging the display apparatuses as a lattice type.

However, in a multi-screen display apparatus of the related art, a boundary portion such as a seam is formed between adjacent display apparatuses due to a bezel area or a bezel of each of a plurality of display apparatuses. The boundary portion may cause a sense of disconnected (or discontinuity) of an image when one image is being displayed on a total screen of the multi-screen display apparatus, and due to this, the immersion of a viewer watching the image may be reduced.

BRIEF SUMMARY

Accordingly, the present disclosure is directed to providing a display apparatus and a multi-screen display apparatus including the same that substantially obviate one or more problems due to limitations and disadvantages of the related art.

Embodiments of the present disclosure are directed to providing a display apparatus having a zero-bezel width and a multi-screen display apparatus including the same.

Embodiments of the present disclosure are directed to providing a display apparatus, which has a zero-bezel width and minimized or reduced line capacitance deviation of a pixel driving line, and a multi-screen display apparatus including the display apparatus.

Embodiments of the present disclosure are directed to providing a display apparatus and a multi-screen display apparatus including the same, which minimize or reduce a deviation of pieces of sensing data caused by a line capacitance deviation between pixel sensing lines.

Additional advantages and features of the disclosure will be set forth in part in the description which follows and in part will become apparent to those having ordinary skill in the art upon examination of the following or may be learned from practice of the disclosure.

The features and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display apparatus includes a display area including a plurality of pixels arranged along a first direction and a second direction crossing the first direction over a substrate, a plurality of gate lines, a plurality of data lines, and a plurality of reference voltage lines disposed at the display area and coupled to the plurality of pixels, and a gate driving circuit including a plurality of stage circuit units disposed at the display area and coupled to each of the plurality of gate lines, the plurality of stage circuit units includes a plurality of branch circuits divisionally disposed between the plurality of pixels along the first direction, a branch network disposed at a network line formation portion positioned at one side of each of the plurality of pixels disposed along the first direction, the branch network including a plurality of control node lines and a plurality of network lines selectively coupled to the plurality of branch circuits, and an additional pattern portion disposed at the network line formation portion to overlap a reference voltage line disposed at each of some of the plurality of pixels.

In another embodiment of the present disclosure, a multi-screen display apparatus includes a plurality of display devices disposed along at least one direction of a first direction and a second direction crossing the first direction. Each of the plurality of display devices includes a display apparatus. The display apparatus includes a display area configured to include a plurality of pixels arranged along a first direction and a second direction crossing the first direction over a substrate, a plurality of gate lines, a plurality of data lines, and a plurality of reference voltage lines disposed at the display area and coupled to the plurality of pixels, and a gate driving circuit configured to include a plurality of stage circuit units disposed at the display area and coupled to each of the plurality of gate lines, the plurality of stage circuit units includes a plurality of branch circuits divisionally disposed between the plurality of pixels along the first direction, a branch network disposed at a network line formation portion defined at one side of each of the plurality of pixels disposed along the first direction, the branch network including a plurality of control node lines and a plurality of network lines selectively coupled to the plurality of branch circuits, and an additional pattern portion disposed at the network line formation portion to overlap a reference voltage line disposed at each of some of the plurality of pixels.

Some embodiments of the present disclosure may provide a display apparatus having a zeroized bezel width and a multi-screen display apparatus including the display apparatus.

Some embodiments of the present disclosure may provide a display apparatus, where a line capacitance deviation of a pixel driving line is minimized or reduced, and a multi-screen display apparatus including the display apparatus.

Some embodiments of the present disclosure may provide a display apparatus and a multi-screen display apparatus including the same, which minimize or reduce a deviation of pieces of subpixel-based sensing data caused by a line capacitance deviation between pixel-based pixel sensing lines.

Some embodiments of the present disclosure may provide a display apparatus and a multi-screen display apparatus including the same, which display an image without a sense of discontinuity, in displaying one image on a whole screen.

It is to be understood that both the foregoing general description and the following detailed description of the present disclosure are examples and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
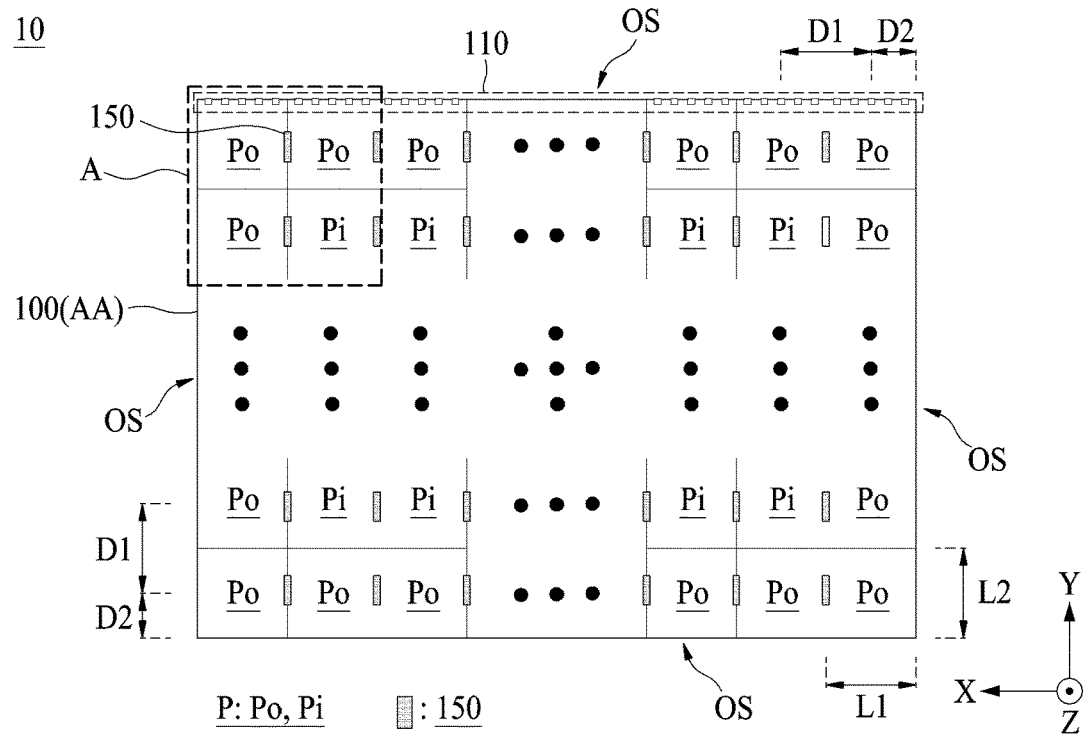
FIG. 1 is a plan view illustrating a display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the features and advantages of the embodiments, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Like reference numerals refer to like elements throughout. In the following description, when the detailed description of the relevant known function or configuration is determined to unnecessarily obscure features of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements.

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together with in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a plan view illustrating a display apparatus according to an embodiment of the present disclosure.

Referring to FIG. 1, the display apparatus (or a display panel) 10 according to an embodiments of the present disclosure may include a first substrate 100 including a display area AA, a plurality of pixels P in the display area AA of the first substrate 100, a first pad part 110, and a gate driving circuit 150 within the display area AA.

The first substrate 100 may be referred to as a first substrate, a base substrate, or a pixel array substrate. For example, the first substrate 100 may be a glass substrate, or may be a thin glass substrate or a plastic substrate, which is bendable or flexible.

The display area AA of the first substrate 100 may be an area which displays an image and may be referred to as an active portion, an active area, a display portion, or a display portion. A size of the display area AA may be the same as or substantially the same as the first substrate 100 (or the display apparatus or the display panel). For example, a size of the display area AA may be the same as a total size of the first surface of the first substrate 100. Therefore, the display area AA may be implemented (or disposed) on the whole front surface of the first substrate 100, and thus, the first substrate 100 may not include an opaque non-display area which is provided along a periphery portion (or an edge portion) of the first surface to surround all of the display area AA. Accordingly, a whole front surface of the display apparatus may implement the display area AA.

An end portion (or an outermost portion) of the display area AA may overlap or may be substantially aligned with the outer surface OS of the first substrate 100. For example, with respect to a thickness direction Z of the display apparatus, a lateral surface (or an end line) of the display area AA may be substantially aligned at a vertical extension line vertically extending from the outer surface OS of the first substrate 100. The lateral surface of the display area AA may not be surrounded by a separate mechanism and may only be abutting ambient air. For example, all lateral surfaces of the display area AA may be provided in a structure which directly contacts air without being surrounded by a separate mechanism. Therefore, the outer surface OS of the first substrate 100 corresponding to the end portion of the display area AA may be surrounded by only air (or abutting ambient air), and thus, the display apparatus according to an embodiments of the present disclosure may have an air-bezel structure or a non-bezel structure (or a zeroized bezel) where the end portion (or lateral surface) of the display area AA is surrounded by air instead of an opaque non-display area.

The plurality of pixels P may be arranged (or disposed) at the display area AA of the first substrate 100 to have the first interval D1 along a first direction X and a second direction Y. For example, the first direction X may traverse (or overlap or cross) to the second direction Y. The first direction X may be a widthwise direction, a horizontal direction, or a first length direction (for example, a widthwise length direction) of the first substrate 100 or the display apparatus.

Each of the plurality of pixels P may be implemented on a plurality of pixel areas defined (e.g., positioned) on the display area AA of the first substrate 100. Each of the plurality of pixels P may have a first length L1 parallel to the first direction X and a second length L2 parallel to the second direction Y. The first length L1 may be the same as the second length L2 or the first interval D1. The first length L1 and the second length L2 may be the same as the first interval D1. Therefore, the plurality of pixels (or pixel areas) P may all have the same size.

Two pixels P adjacent to each other along the first direction X and the second direction Y may have the same first interval D1 within an error range of a manufacturing process. The first interval D1 may be a pitch (or a pixel pitch) between two adjacent pixels P. For example, the first length L1 or the second length L2 of the pixel P may be referred to as the pixel pitch. For example, the first interval D1 may be a distance (or a length) between center portions of two adjacent pixels P. For example, the first interval (or the pixel pitch) D1 may be a shortest distance (or a shortest length) between center portions of two adjacent pixels P.

Each of the plurality of pixels P according to an embodiment may be include a circuit layer including a pixel circuit implemented in the pixel area of the first substrate 100, and a light emitting device layer disposed at the circuit layer and coupled to the pixel circuit. The pixel circuit outputs a data current corresponding to the data signal in response to the data signal and the scan signal supplied from the pixel driving lines disposed in the pixel area. The light emitting device layer may include a light emitting layer that emits light by the data current supplied from the pixel circuit. The pixel driving lines, the pixel circuit, and the light emitting device layer will be described below.

The plurality of pixels P may be divided (or classified) into outermost pixels Po and internal pixels (or inner pixels) Pi.

The outermost pixels Po may be pixels disposed closest to the outer surface OS of the first substrate 100 of the plurality of pixels P.

A second interval D2 between a center portion of each of the outermost pixels Po and the outer surface OS of the first substrate 100 may be half or less of the first interval D1. For example, the second interval D2 may be a distance (or a length) between a center portion of the outermost pixel Po and the outer surface OS of the first substrate 100. For example, the second interval D2 may be a shortest distance (or a shortest length) between a center portion of the outermost pixel Po and the outer surface OS of the first substrate 100.

When the second interval D2 is greater than half of the first interval D1, the first substrate 100 may have a greater size than the display area AA by a difference area between half of the first interval D1 and the second interval D2, and thus, an area between the end of the outermost pixel Po and the outer surface OS of the first substrate 100 may be configured as a non-display area surrounding all of the display area AA. For example, when the second interval D2 is greater than half of the first interval D1, the first substrate 100 may necessarily include a bezel area based on a non-display area surrounding all of the display area AA. On the other hand, when the second interval D2 is half or less of the first interval D1, the end of each of the outermost pixels Po may be aligned (or disposed) with the outer surface OS of the first substrate 100, or the end portion of the display area AA may be aligned (or disposed) with the outer surface OS of the first substrate 100, and thus, the display area AA may be implemented (or disposed) on the whole front surface of the first substrate 100.

The internal pixels Pi may be pixels other than the outermost pixels Po of the plurality of pixels P, or may be pixels surrounding by the outermost pixels Po of the plurality of pixels P. The internal pixels (or second pixels) Pi may be implemented to have a configuration or a structure, which differs from the outermost pixels (or first pixels) Po.

The first pad part 110 may be a first pad part or a front pad part. The first pad part 110 may include a plurality of first pads to receive a data signal, a gate control signal, a pixel driving power, a reference voltage, and a pixel common voltage, or the like from the driving circuit part.

The first pad part 110 may be included within the outmost pixels Po disposed at a first periphery portion of the first surface of the first substrate 100 parallel to the first direction X. That is, the outermost pixels Po disposed at the first periphery portion of the first substrate 100 may include at least one of the plurality of first pads. Therefore, the plurality of first pads may be disposed or included within the display area AA, and thus, a non-display area (or a bezel area) based on the first pad part 110 may not be formed or may not be on the first substrate 100. Therefore, the outermost pixel (or first pixels) Po may include the first pad part 110, and thus, may be implemented to have a configuration or a structure, which differs from the internal pixel (or second pixels) Pi including no the first pad part 110.

For example, when the first pad part 110 is not provided within the outermost pixels Po and is disposed between the outermost pixels Po and the outer surface OS of the first substrate 100, the first substrate 100 may include a non-display area (or a non-display portion) corresponding to an area where the first pad part 110 is provided, and due to the non-display area, the second interval D2 between the outermost pixels Po and the outer surface OS of the first substrate 100 may be greater than half of the first interval D1, all of the first substrate 100 may not be implemented as the display area AA, and a separate bezel (or a separate structure) for covering the non-display area may be needed. On the other hand, the first pad part 110 according to an embodiments of the present disclosure may be disposed between the outermost pixels Po and the outer surface OS of the first substrate 100 to be included within the outermost pixels Po, and thus, a non-display area (or a bezel area) based on the first pad part 110 may not be formed or may not be between the outermost pixels Po and the outer surface OS of the first substrate 100.

The first pad part 110 according to an embodiment may include a plurality of pixel driving power pads, a plurality of data pads, a plurality of reference voltage pads, and a plurality of pixel common voltage pads, but embodiments of the present disclosure are not limited thereto.

The gate driving circuit 150 may be disposed in the display area AA to supply a scan signal (or a gate signal) to the pixels P disposed on the first substrate 100. The gate driving circuit 150 may simultaneously supply the scan signal to pixels P disposed in a horizontal line parallel to the first direction X. For example, the gate driving circuit 150 may supply at least one scan signal to pixels P disposed in one horizontal line through at least one gate line.

The gate driving circuit 150 according to an embodiment may be implemented with a shift register including a plurality of stage circuit units. That is, the display apparatus according to an embodiments of the present disclosure may include a shift register which is disposed in the display area AA of the first substrate 100 to supply the scan signal to the pixel P.

Each of the plurality of stages may include a plurality of branch circuits which are arranged spaced apart from one another in each horizontal line of the first substrate 100 in a first direction X. Each of the plurality of branch circuits may include at least one thin film transistor (TFT) (or branch TFT) and may be disposed between two adjacent pixels of one or more pixels P (or a pixel area) in one horizontal line in the first direction X. Each of the plurality of stage circuit units may generate a scan signal through driving of the plurality of branch circuits based on a gate control signal supplied through gate control lines disposed spaced apart from one another between a plurality of pixels P in the display area AA and may supply the scan signal to pixels P arranged in a corresponding horizontal line.

Figure 2A:
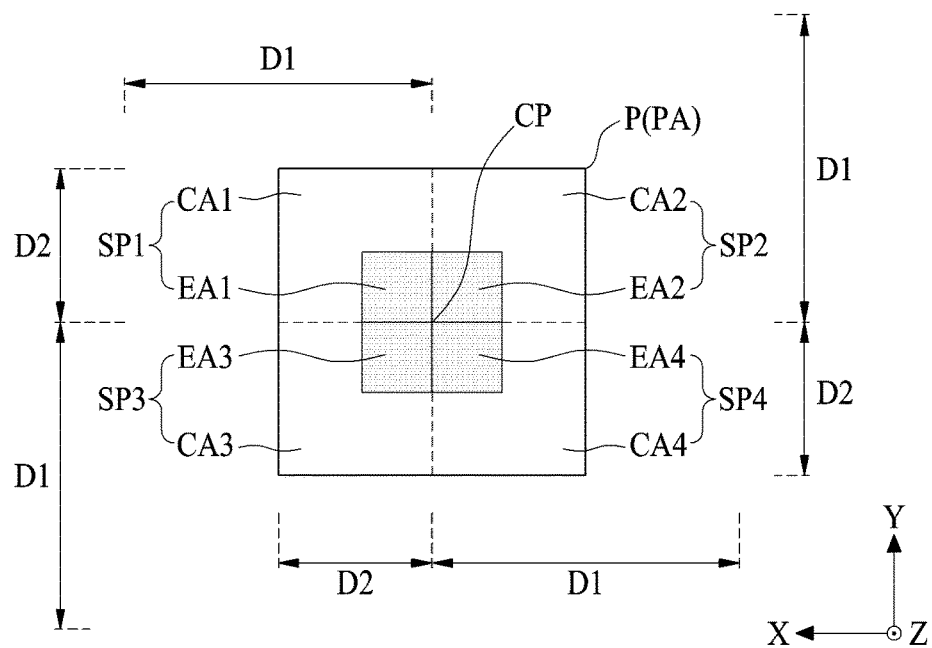
FIG. 2A is a diagram illustrating one pixel according to an embodiment of the present disclosure illustrated in FIG. 1.
Figure 2B:
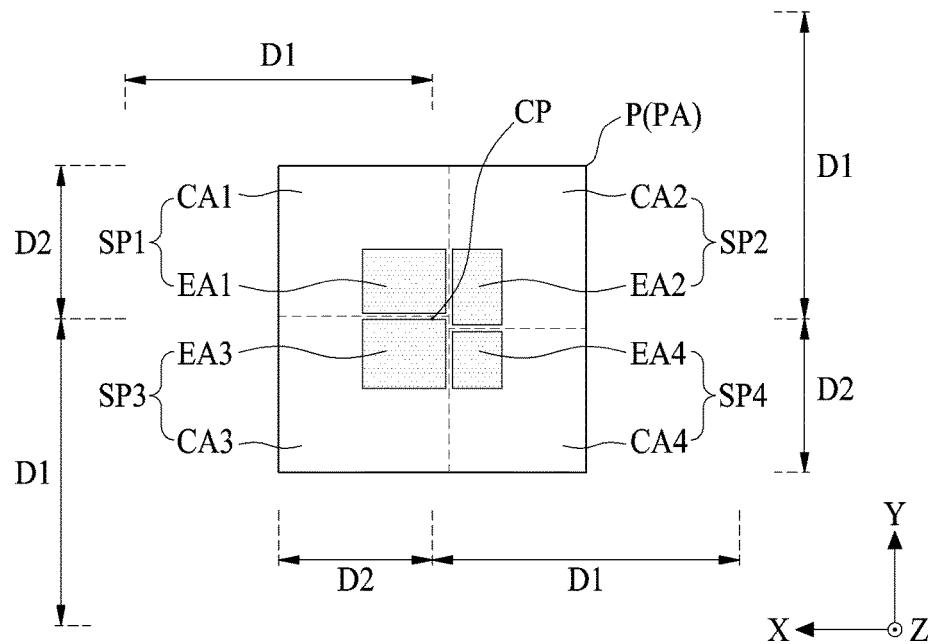
FIG. 2B is a diagram illustrating one pixel according to another embodiment of the present disclosure illustrated in FIG. 1.
Figure 2C:
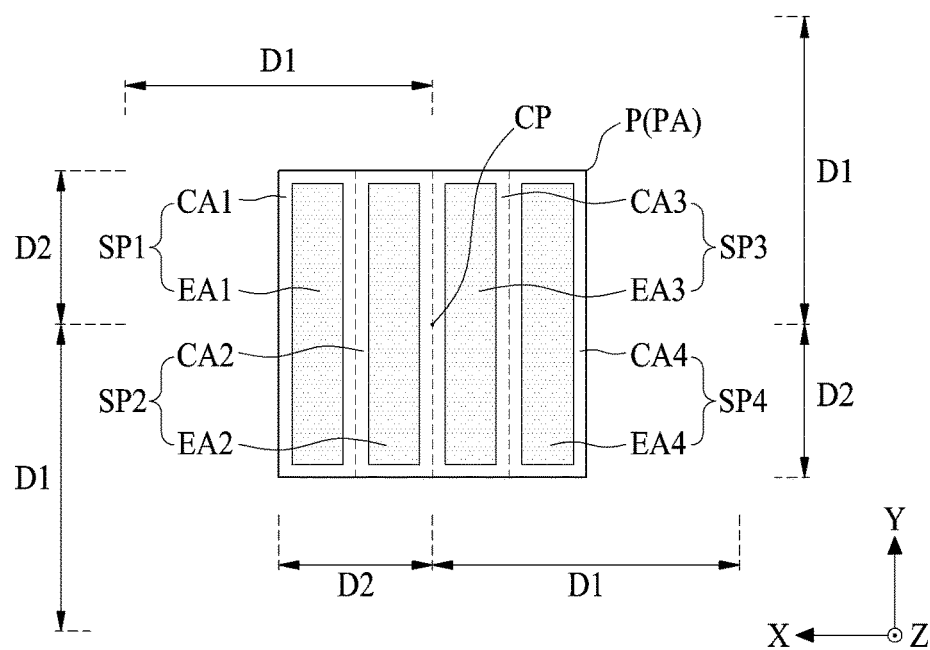
FIG. 2C is a diagram illustrating one pixel according to another embodiment of the present disclosure illustrated in FIG. 1.

FIG. 2A is a diagram illustrating one pixel according to an embodiment of the present disclosure illustrated in FIG. 1, FIG. 2B is a diagram illustrating one pixel according to another embodiment of the present disclosure illustrated in FIG. 1, and FIG. 2C is a diagram illustrating one pixel according to another embodiment of the present disclosure illustrated in FIG. 1.

FIG. 2A is a diagram illustrating one pixel according to an embodiment of the present disclosure illustrated in FIG. 1, FIG. 2B is a diagram illustrating one pixel according to another embodiment of the present disclosure illustrated in FIG. 1, and FIG. 2C is a diagram illustrating one pixel according to another embodiment of the present disclosure illustrated in FIG. 1.

Referring to FIGS. 1 and 2A, one pixel (or a unit pixel) P according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

The first to fourth subpixels SP1 to SP4 according to an embodiment may be disposed in a 2×2 form or a quad structure. The first to fourth subpixels SP1 to SP4 may each include a plurality of emission areas EA1 to EA4 and a plurality of circuit areas CA1 to CA4. For example, the emission areas EA1 to EA4 may be referred to as an opening area, an opening portion, or an emission portion.

The emission areas EA1 to EA4 of each of the first to fourth subpixels SP1 to SP4 may have a uniform quad structure to have a square shape having the same size (or same area). According to an embodiment, each of the emission areas EA1 to EA4 having a uniform quad structure may be disposed close to a center portion CP of the pixel P within a corresponding subpixel area to have a size which is less than each of four equal division regions of the pixel P or may be disposed to be concentrated at the center portion CP of the pixel P. According to another embodiment, each of the emission areas EA1 to EA4 having a uniform quad structure may be disposed at the center portion CP of the corresponding subpixel area to have a size which is less than each of four equal division regions of the pixel P.

Referring to FIGS. 1 and 2B, each of the first to fourth subpixels SP1 to SP4 according to another embodiment may have a non-uniform quad structure having different sizes. For example, each of the emission areas EA1 to EA4 of each of the first to fourth subpixels SP1 to SP4 may have a non-uniform quad structure having different sizes.

A size of each of the first to fourth subpixels SP1 to SP4 having a non-uniform quad structure may be set based on a resolution, emission efficiency, or image quality. According to another embodiment, when the emission areas EA1 to EA4 have a non-uniform quad structure, of the emission areas EA1 to EA4 of the first to fourth subpixels SP1 to SP4, the emission area EA4 of the fourth subpixel SP4 may have a smallest size, and the emission area EA3 of the third subpixel SP3 may have a largest size. For example, each of the emission areas EA1 to EA4 of each of the first to fourth subpixels SP1 to SP4 having a non-uniform quad structure may be disposed to be concentrated around (or near) the center portion CP of the pixel P.

Referring to FIGS. 1 and 2C, each of the first to fourth subpixels SP1 to SP4 according to another embodiment may have a 1×4 form or a uniform stripe structure. For example, the emission areas EA1 to EA4 of the first to fourth subpixels SP1 to SP4 may have a 1×4 form or a uniform stripe structure.

The emission areas EA1 to EA4 of the first to fourth subpixels SP1 to SP4 having the uniform stripe structure may each have a rectangular shape which includes a short side parallel to the first direction X and a long side parallel to the second direction Y.

According to an embodiment, each of the emission areas EA1 to EA4 having the uniform stripe structure may be disposed close to a center portion CP of the pixel P within a corresponding subpixel area to have a size which is less than each of four equal division regions of the pixel P or may be disposed to be concentrated at the center portion of the pixel P.

According to another embodiment, each of the emission areas EA1 to EA4 having the uniform stripe structure may be disposed at center portion CP of the corresponding subpixel area to have a size which is less than each of four equal division regions of the pixel P.

According to another embodiment, each of the emission areas EA1 to EA4 having the uniform stripe structure may be disposed at the whole corresponding subpixel area to have the same size as each of four equal division regions of the pixel P.

Alternatively, each of the emission areas EA1 to EA4 of each of the first to fourth subpixels SP1 to SP4 may have a non-uniform stripe structure having different sizes. According to an embodiment, when the emission areas EA1 to EA4 have a non-uniform stripe structure, of the emission areas EA1 to EA4 of the first to fourth subpixels SP1 to SP4, the emission area EA4 of the fourth subpixel SP4 may have a smallest size, and the emission area EA3 of the third subpixel SP3 may have a largest size, but embodiments of the present disclosure are not limited thereto.

Referring to FIGS. 2A and 2B, the circuit areas CA1 to CA4 of each of the first to fourth subpixels SP1 to SP4 may be disposed around (or near) a corresponding emission area of the emission areas EA1 to EA4. Each of the circuit areas CA1 to CA4 may include a pixel circuit and pixel driving lines for emitting a corresponding subpixel of the first to fourth subpixels SP1 to SP4. For example, the circuit areas CA1 to CA4 may be referred to as a non-emission area, a non-opening area, a non-emission portion, a non-opening portion, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, since the emission areas EA1 to EA4 of the first to fourth subpixels SP1 to SP4 have a top emission structure, each of the emission areas EA1 to EA4 may be arranged to overlap the corresponding circuit areas the circuit areas CA1 to CA4. In this case, each of the emission areas EA1 to EA4 may have a size which is equal to or greater than the corresponding circuit areas CA1 to CA4.

In FIGS. 2A to 2C, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. As an embodiment, the first color may be red, the second color may be blue, the third color may be white, and the fourth color may be green. As another embodiment, some of the first to fourth colors may be the same. For example, the first color may be red, the second color may be first green, the third color may be second green, and the fourth color may be blue.

Optionally, a white subpixel implemented to emit white light of the first to fourth subpixels SP1 to SP4 having a uniform stripe structure or a non-uniform stripe structure may be omitted.

Figure 3:
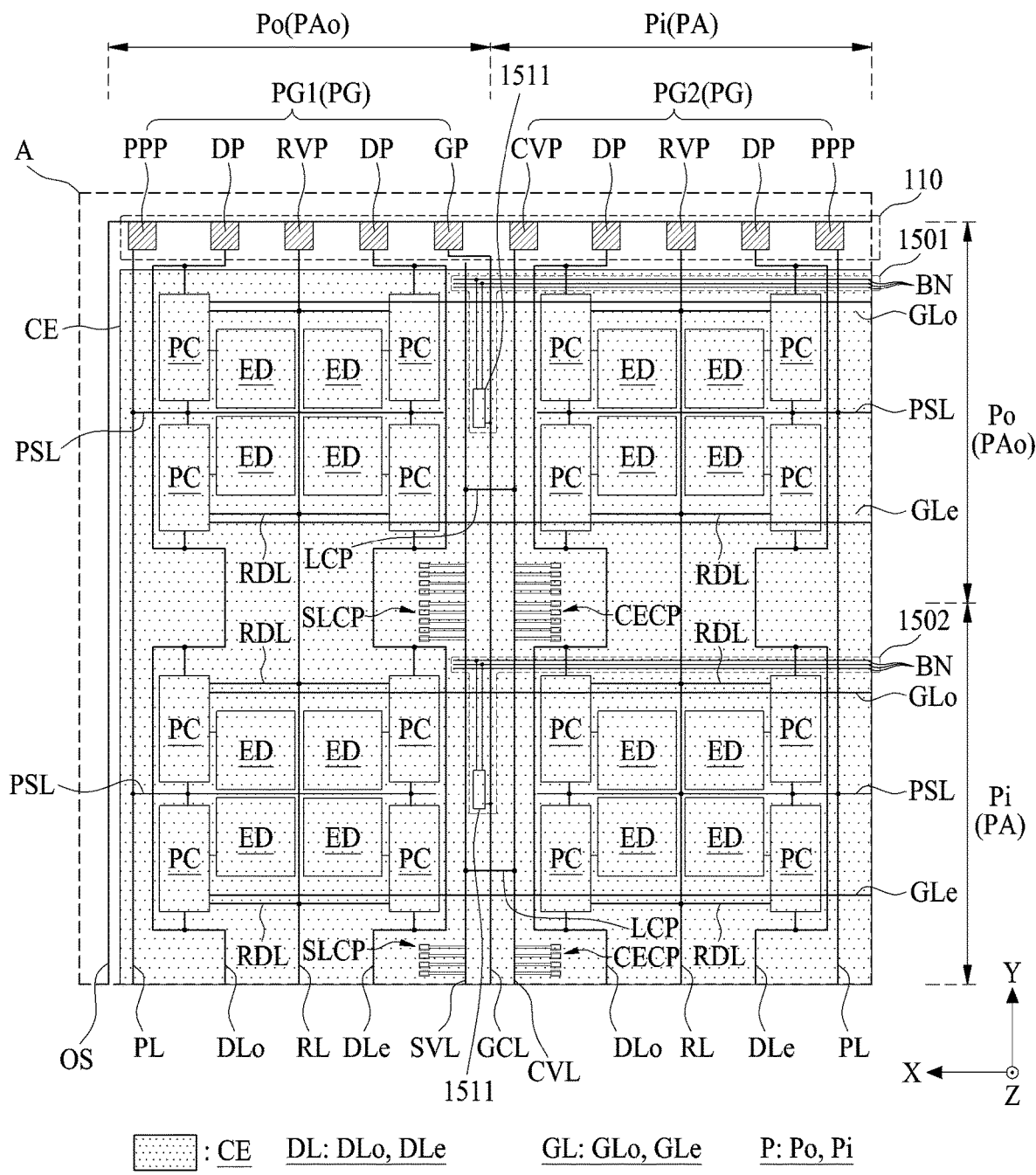
FIG. 3 is an enlarged view of a region 'A' illustrated in FIG. 1.
Figure 4:
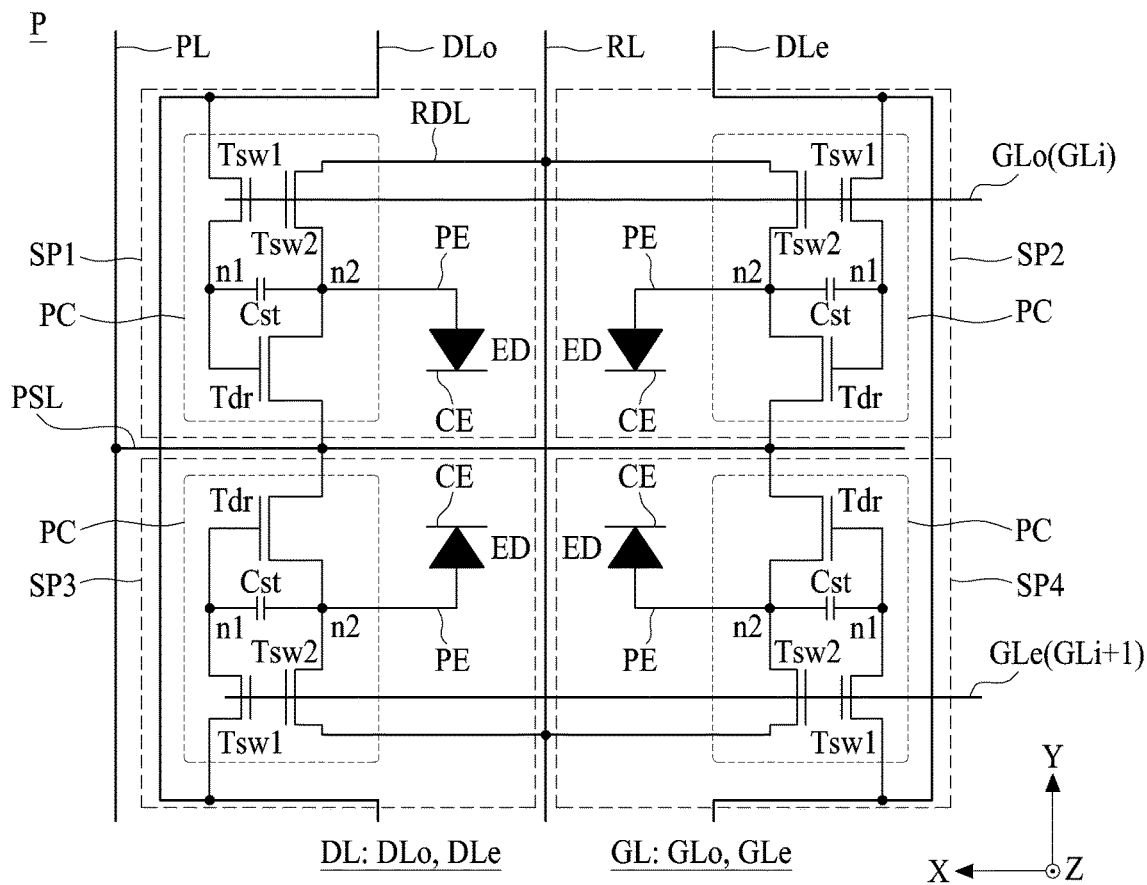
FIG. 4 is an equivalent circuit diagram illustrating one subpixel illustrated in FIGS. 1 and 3.

FIG. 3 is an enlarged view of a region 'A' illustrated in FIG. 1, and FIG. 4 is an equivalent circuit diagram illustrating one subpixel illustrated in FIGS. 1 and 3.

Referring to FIGS. 1, 3, and 4, a first substrate 100 according to an embodiment of the present disclosure may include pixel driving power lines DL, GL, PL, CVL, RL, and GCL, a plurality of pixels P, a common electrode CE, a plurality of common electrode connection portions CECP, and a first pad part 110.

The pixel driving power lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines RL, and gate control lines GCL.

In the Figures, where a reference number or letter is provided after which another reference number or letter is provided in parenthesis, this has the meaning that the number and/or letter in parenthesis is the general category or group of the item and the first number prior to it is a specific example of that item within the group. For example, the indication in FIG. 3 of PG1(PG) indicates that PG1, the first pad group, is a specific item within the broad pad group, PG. Similarly, in FIG. 5, the notation 150m(150) indicates that each of the circuits 1501, 1502, . . . 1511, 1512 etc. is driving circuit within the broad group of driving circuits 150. In addition, the notation 111(110) in FIGS. 13A-13D indicates that item 111 is one specific first pad within the group of first pads 110. Similar meanings apply to similar notations in the Figures and these are provided as examples to illustrate the meaning.

In a somewhat similar fashion, the legend below a particular figure provides a general group and is followed by a colon and then a list of items in that group as shown in the figure. For example, the notation P: Po, Pi below FIG. 1 indicates that P is the general group of a pixel and Po and Pi are specific items within that group of Pixels P. Also, below FIG. 3, the notations DL: DLo and DLe and GL: GLo and GLe indicate that each of these are specific items within the general group of data lines DL and gate lines GL, respectively.

The plurality of data lines DL may extend long in a second direction Y and may be disposed spaced apart from one another by a predetermined or selected interval in a display area AA of the first substrate 100 along the first direction X. For example, in the plurality of data lines DL, an odd-numbered data line DLo may be disposed at a first periphery portion of each of a plurality of pixel areas PA arranged at the first substrate 100 along the second direction Y, and an even-numbered data line DLe may be disposed at a second periphery portion of each of the plurality of pixel areas PA arranged at the first substrate 100 along the second direction Y, but embodiments of the present disclosure are not limited thereto.

The plurality of gate lines GL may extend long in the first direction X and may be disposed spaced apart from one another by a predetermined or selected interval in the display area AA of the first substrate 100 along the second direction Y. For example, an odd-numbered gate line GLo of the plurality of gate lines GL may be disposed at a third periphery portion of each of the plurality of pixel areas PA arranged on the first substrate 100 along the first direction X. An even-numbered gate line GLe of the plurality of gate lines GL may be disposed at a fourth periphery portion of each of the plurality of pixel areas PA arranged at the first substrate 100 along the first direction X, but embodiments of the present disclosure are not limited thereto.

The plurality of pixel driving power lines PL may extend long in the second direction Y and may be disposed spaced apart from one another by a predetermined or selected interval in the display area AA of the first substrate 100 along the first direction X. For example, in the plurality of pixel driving power lines PL, an odd-numbered pixel driving power line PL may be disposed at a first periphery portion of an odd-numbered pixel area PA with respect to the first direction X, and an even-numbered pixel driving power line PL may be disposed at a second periphery portion of an even-numbered pixel area PA with respect to the first direction X, but embodiments of the present disclosure are not limited thereto.

Two adjacent pixel driving power lines PL of the plurality of pixel driving power lines PL may be coupled to a plurality of power sharing lines PSL disposed in each of the pixel areas PA arranged in the second direction Y. For example, the plurality of pixel driving power lines PL may be electrically coupled to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented, reduced or minimized. Accordingly, the display apparatus according to an embodiments of the present disclosure may prevent, reduce or minimize the degradation in image quality caused by a deviation of the pixel driving power supplied to each of the pixels P arranged at the display area AA.

Each of the plurality of power sharing lines PSL may branch from an adjacent pixel driving power line PL in parallel with the first direction X and may be disposed in a middle region of each pixel area PA, but embodiments of the present disclosure are not limited thereto.

The plurality of pixel common voltage lines CVL may extend long in the second direction Y and may be disposed spaced apart from one another by a predetermined or selected interval in the display area AA of the first substrate 100 along the first direction X. For example, each of the plurality of pixel common voltage lines CVL may be disposed at a first periphery portion of an even-numbered pixel area PA with respect to the first direction X.

The plurality of reference voltage lines RL may extend long in the second direction Y and may be disposed spaced apart from one another by a predetermined or selected interval in the display area AA of the first substrate 100 in the first direction X. Each of the plurality of reference voltage lines RL may be disposed in a center region of each of the pixel areas PA arranged in the second direction Y.

Each of the plurality of reference voltage lines RL may be shared by two adjacent subpixels ((SP1, SP2) (SP3, SP4)) in the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) in the first direction X in each pixel area PA and may be electrically coupled to the two adjacent subpixels ((SP1, SP2) (SP3, SP4)).

Each of the plurality of gate control lines GCL may extend long in the second direction Y and may be disposed spaced apart from one another by a predetermined or selected interval in the display area AA of the first substrate 100 in the first direction X. For example, each of the plurality of gate control lines GCL may be disposed at between the plurality of pixel areas PA or a boundary region between two adjacent pixel areas PA with respect to the first direction X.

Each of the plurality of pixels P may include at least three subpixels. For example, each of the plurality of pixels P may include first to fourth subpixels SP1 to SP4.

Each of the first to fourth subpixels SP1 to SP4 may include a pixel circuit PC and a light emitting device layer.

The pixel circuit PC according to an embodiment may be disposed in a circuit area of the pixel area PA and may be coupled to a gate line GLo or GLe adjacent thereto, a data line DLo or DLe adjacent thereto, and the pixel driving power line PL. For example, a pixel circuit PC disposed in a first subpixel SP1 may be coupled to an odd-numbered data line DLo and an odd-numbered gate line GLo, a pixel circuit PC disposed in a second subpixel SP2 may be coupled to an even-numbered data line DLe and an odd-numbered gate line GLo, a pixel circuit PC disposed in a third subpixel SP3 may be coupled to an odd-numbered data line DLo and an even-numbered gate line GLe, and a pixel circuit PC disposed in a fourth subpixel SP4 may be coupled to an even-numbered data line DLe and an even-numbered gate line GLe.

The pixel circuit PC of each of the first to fourth subpixels SP1 to SP4 may sample a data signal supplied from a corresponding data line DLo or DLe in response to a scan signal supplied from a corresponding gate line GLo or GLe and may control a current flowing from the pixel driving power line PL to the light emitting device layer based on a sampled data signal.

The pixel circuit PC according to an embodiment may include a first switching thin film transistor Tsw1, a second switching thin film transistor Tsw2, a driving thin film transistor Tdr, and a storage capacitor Cst, but embodiments of the present disclosure are not limited thereto. In the following description, a thin film transistor may be referred to as a TFT.

The first switching TFT Tsw1 may include a gate electrode coupled to a corresponding gate line GL (GLo or GLe) a first source/drain electrode coupled to a corresponding data line DL (DLo or DLe), and a second source/drain electrode coupled to a gate node n1 of the driving TFT Tdr. The first switching TFT Tsw1 may be turned on by a scan signal supplied through corresponding gate line GL (GLo or GLe) and may transfer a data signal, supplied through corresponding data line DL (DLo or DLe), to the gate electrode n1 of the driving TFT Tdr.

The second switching TFT Tsw2 may include a gate electrode coupled to a corresponding gate line GL (GLo or GLe) a first source/drain electrode coupled to a source node n2 of the driving TFT Tdr, and a second source/drain electrode coupled to a corresponding reference voltage line RL. The second switching TFT Tsw2 may be turned on by a scan signal supplied through the corresponding gate line GL (GLo or GLe) and may transfer a reference voltage, supplied through the corresponding reference line RL, to the source node n2 of the driving TFT Tdr. For example, the second switching TFT Tsw2 may be turned on simultaneously with the first switching TFT Tsw1.

The storage capacitor Cst may be formed between the gate node n1 and the source node n2 of the driving TFT Tdr. The storage capacitor Cst according to an embodiment may include a first capacitor electrode coupled to the gate node n1 of the driving TFT Tdr, a second capacitor electrode coupled to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) coupled to the second source/drain electrode of the first switching TFT Tsw1 and the first capacitor electrode of the storage capacitor Cst in common, a first source/drain electrode (or the source node n2) coupled to the first source/drain electrode of the second switching TFT Tsw2, the second capacitor electrode of the storage capacitor Cst, and a pixel electrode PE of the light emitting device layer in common, and a second source/drain electrode (or a drain node) coupled to a corresponding pixel driving power line PL. The driving TFT Tdr may be turned on based on a voltage of the storage capacitor Cst and may control the amount of current flowing from the pixel driving power line PL to the light emitting device layer.

The pixel circuit PC of each of the first to fourth subpixels SP1 to SP4 according to another embodiment may be implemented as a pixel driving chip through a semiconductor manufacturing process, disposed in a circuit area CA of a corresponding pixel area PA, and connected to gate lines GLo or GLe adjacent thereto, data lines DLo or DLe adjacent thereto, and the pixel driving power line PL. For example, the pixel driving chip may be a microchip or a chip set which corresponds to a minimum unit and may be a semiconductor packaging device which has a fine size and includes two or more transistors and one or more capacitors. The pixel driving chip may sample a data signal supplied through corresponding data lines DLo or DLe in response to the scan signal supplied through corresponding gate lines GLo or GLe and may control a current flowing from the pixel driving power line PL to the light emitting device layer based on the sampled data signal.

The light emitting device layer may be disposed in an emission area EA of the pixel area PA and electrically coupled to the pixel circuit PC.

The light emitting device layer according to an embodiment of the present disclosure may include a pixel electrode PE electrically coupled to the pixel circuit PC, a common electrode CE electrically coupled to the pixel common voltage line CVL, and a self-emitting device ED interposed between the pixel electrode PE and the common electrode CE.

The pixel electrode PE may be referred to as an anode electrode, a reflective electrode, a lower electrode, an anode, or a first electrode, of the self-emitting device ED.

The pixel electrode PE may overlap an emission area EA of each of the plurality of subpixels SP. The pixel electrode PE may be patterned in an island shape and disposed in each subpixel SP, and may be electrically coupled to the first source/drain electrode of the driving TFT Tdr of a corresponding pixel circuit PC. One side of the pixel electrode PE may extend onto the first source/drain electrode of the driving TFT Tdr and may be electrically coupled to the first source/drain electrode of the driving TFT Tdr through a contact hole provided at the planarization layer over the driving TFT Tdr.

The pixel electrode PE may include a metal material which is low in work function and is good in reflective efficiency. For example, the pixel electrode PE may be formed in a three-layer structure of IZO/MoTi/ITO or ITO/MoTi/ITO, or may be formed in a four-layer structure of ITO/Cu/MoTi/ITO, or may be formed in a five-layer structure of ITO/Ag/ITO/MoTi/ITO.

The self-emitting device ED may be disposed over the pixel electrode PE and may directly contact the pixel electrode PE. The self-emitting device ED may be a common layer or a common device layer which is formed in common in each of a plurality of subpixels SP so as not to be distinguished by subpixel SP units. The self-emitting device ED may react on a current flowing between the pixel electrode PE and the common electrode CE to emit white light or blue light. The self-emitting device ED according to an embodiment may include an organic light emitting device or an inorganic light emitting device, or may include a stacked or a combination structure of an organic light emitting device (or an inorganic light emitting device) and a quantum dot light emitting device. For example: the self-emitting device ED according to another embodiment may include an organic light emitting layer or an inorganic light emitting layer, or may include a stacked or a combination structure of an organic light emitting layer (or an inorganic light emitting layer) and a quantum dot light emitting layer.

The organic light emitting device according to an embodiment may include two or more light emitting material layers (or a light emitting portion) for emitting white light. For example, the organic light emitting device may include a first light emitting material layer and a second light emitting material layer, for emitting white light based on a combination of first light and second light. Here, the first light emitting material layer may include at least one of a blue light emitting material, a green light emitting material, a red light emitting material, a yellow light emitting material, and a yellow-green light emitting material. The second light emitting material layer may include at least one of a blue light emitting material, a green light emitting material, a red light emitting material, a yellow light emitting material, and a yellow-green light emitting material, for emitting second light which is combined with first light to generate white light.

The organic light emitting device according to an embodiment may further include one or more function layers for enhancing emission efficiency and/or lifetime. For example, the function layer may be disposed above and/or under a light emitting material layer.

The inorganic light emitting device according to an embodiment may include a semiconductor light emitting diode, a micro light emitting diode, or a quantum dot light emitting diode. For example, when the light emitting device ED is the inorganic light emitting device, the light emitting device ED may have a scale of 1 µm or 100 µm, but embodiments of the present disclosure are not limited thereto.

The common electrode CE may be disposed over the display area AA of the first substrate 100 and may be electrically coupled to the self-emitting device ED each of the plurality of pixels P. For example, the common electrode CE may be disposed over the remaining display area AA of the first substrate 100 except for the first pad part 110 of the first substrate 100. For example, the common electrode CE may be disposed over the remaining display area AA of the first substrate 100 except for the periphery portion of the first substrate 100.

The common electrode CE may be referred to as a cathode electrode, a transparent electrode, an upper electrode, a cathode, or a second electrode of the self-emitting device ED. The common electrode CE may be formed over the self-emitting device ED and may directly contact the self-emitting device ED or may electrically and directly contact the self-emitting device ED. The common electrode CE can include a transparent conductive material which transmits light emitted from the self-emitting device ED. The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or SnO2:Sb.

Each of the plurality of common electrode connection portions CECP may be disposed between the plurality of pixels P respectively overlapping the plurality of pixel common voltage lines CVL and may electrically couple the common electrode CE to each of the plurality of pixel common voltage lines CVL. With respect to the second direction Y, each of the plurality of common electrode connection portions CECP according to an embodiment of the present disclosure may be electrically coupled to each of the plurality of pixel common voltage lines CVL at a portion between the plurality of the pixels P (or at the boundary between a plurality of pixels P) and may be electrically coupled to a portion of the common electrode CE, and thus, may electrically couple the common electrode CE to each of the plurality of pixel common voltage lines CVL. For example, the common electrode CE may be coupled to each of the plurality of common electrode connection portions CECP by a side contact structure corresponding to an undercut structure.

Each of the plurality of common electrode connection portions CECP may be disposed a portion between the plurality of the pixels P to electrically couple the common electrode CE to each of the plurality of pixel common voltage lines CVL, and thus, may prevent, reduce or minimize the voltage drop (IR drop) of the pixel common voltage caused by a surface resistance of the common electrode CE. Accordingly, the display apparatus according to an embodiments of the present disclosure may prevent, reduce or minimize the degradation in image quality caused by a deviation of the pixel common voltage supplied to each of the pixels P arranged in the display area AA.

According to an embodiment of the present disclosure, each of the plurality of common electrode connection portions CECP may be formed along with a pixel electrode PE having at least two-layer structure so as to be electrically coupled to each of the plurality of pixel common voltage lines CVL. Each of the plurality of common electrode connection portions CECP may be coupled to the common electrode CE through a side contact structure having a "("-shaped cross-sectional structure or a "⟨"-shaped cross-sectional structure. For example, when each of the plurality of common electrode connection portions CECP is formed of first and second metal layers, each of the plurality of common electrode connection portions CECP may include a side contact structure corresponding to an undercut structure or a tapered structure formed over the lateral surface of the first metal layer by an etching speed difference between the first metal layer and the second metal layer. For example, when each of the plurality of common electrode connection portions CECP is formed of first to third metal layers, each of the plurality of common electrode connection portions CECP may include a side contact structure corresponding to an undercut structure or a tapered structure formed at the lateral surface of the first metal layer and/or the second metal layer by an etching speed difference between the first and second metal layers.

The first pad part 110 may be disposed at a first periphery portion of the first surface of the first substrate 100 parallel to the first direction X. The first pad part 110 may be disposed at a third periphery portion of each of outermost pixel areas PAo disposed at the first periphery portion of the first substrate 100. With respect to the second direction Y, an end portion of the first pad part 110 may overlap or may be aligned with an end portion of each of the outermost pixel areas PAo. Therefore, the first pad part 110 may be included (or disposed) in each of the outermost pixel areas PAo disposed at the first periphery portion of the first substrate 100, and thus, a non-display area (or a bezel area) based on the first pad part 110 may not be formed or may not be in the first substrate 100.

The first pad part 110 may include a plurality of first pads which are disposed in parallel with one another along the first direction X at the first periphery portion of the first substrate 100. The plurality of first pads may be divided (or classified) into a first data pads DP, a first gate pads GP, a first pixel driving power pads PPP, a first reference voltage pads RVP, and a first pixel common voltage pads CVP.

Each of the first data pads DP may be individually (or a one-to-one relationship) coupled to one side of each of the plurality of data lines Dlo and DLe disposed at the first substrate 100.

Each of the first gate pads GP may be individually (or a one-to-one relationship) coupled to one side of each of the gate control lines GCL disposed at the first substrate 100. The first gate pads GP according to an embodiment may be divided (or classified) into a first start signal pad, a plurality of first shift clock pads, a plurality of first carry clock pads, at least one first gate driving power pad, and at least one first gate common power pad.

Each of the first pixel driving voltage pads PPP may be individually (or a one-to-one relationship) coupled to one side end of each of the plurality of pixel driving power lines PL disposed at the first substrate 100.

Each of the first reference voltage pads RVP may be individually (or a one-to-one relationship) coupled to one side end of each of the plurality of reference voltage lines RL disposed at the first substrate 100.

Each of the first pixel common voltage pads CVP may be individually (or a one-to-one relationship) coupled to one side end of each of the plurality of pixel common voltage lines CVL disposed at the first substrate 100.

The first pad part 110 according to an embodiment may include a plurality of pad groups PG which are arranged in the order of a first pixel driving power pad PPP, a first data pad DP, a first reference voltage pad RVP, a first data pad DP, a first gate pad GP, a first pixel common voltage pad CVP, a first data pad DP, a first reference voltage pad RVP, a first data pad DP, and a first pixel driving power pad PPP along the first direction X. Each of the plurality of pad groups PG may be coupled to two adjacent pixels P disposed along the first direction X. For example, the plurality of pad groups PG may include a first pad group PG1 including a first pixel driving power pad PPP, a first data pad DP, a first reference voltage pad RVP, a first data pad DP, and a first gate pad GP continuously disposed in an odd-numbered pixel area PA along the first direction X, and a second pad group PG2 including a first pixel common voltage pad CVP, a first data pad DP, a first reference voltage pad RVP, a first data pad DP, and a first pixel driving power pad PPP continuously disposed in an even-numbered pixel area PA along the first direction X.

The first substrate 100 according to an embodiments of the present disclosure may further include a plurality of secondary voltage lines SVL and a plurality of secondary line connection portions SLCP. For example, the secondary voltage lines may be referred to as an additional voltage lines or an auxiliary voltage lines, or the like.

Each of the plurality of secondary voltage lines SVL may extend long along the second direction Y and may be disposed adjacent to a corresponding pixel common voltage line CVL of the plurality of pixel common voltage lines CVL. Each of the plurality of secondary voltage lines SVL may be electrically coupled to an adjacent pixel common voltage line CVL without being electrically coupled to the pixel common voltage pad CVP and may be supplied with a pixel common voltage through the adjacent pixel common voltage line CVL. To this end, the first substrate 100 according to an embodiments of the present disclosure may further include a plurality of line connection patterns LCP which electrically couple a pixel common voltage line CVL and a secondary voltage lines SVL adjacent to each other.

Each of the plurality of line connection patterns LCP may be disposed at the first substrate 100 so that the line connection pattern LCP and a pixel common voltage line CVL and a secondary voltage lines SVL adjacent to each other overlap each other and may electrically couple a pixel common voltage line CVL and a secondary voltage lines SVL adjacent to each other by using a line jumping structure. For example, one side of each of the plurality of line connection patterns LCP may be electrically coupled to a portion of the secondary voltage lines SVL through a first line contact hole formed at an insulation layer over the secondary voltage lines SVL, and the other side of each of the plurality of line connection patterns LCP may be electrically coupled to a portion of the pixel common voltage line CVL through a second line contact hole formed at the insulation layer over the pixel common voltage line CVL.

Each of the plurality of secondary line connection portions SLCP may electrically couple the common electrode CE to each of the plurality of secondary voltage lines SVL at between the plurality of pixels P overlapping each of the plurality of secondary voltage lines SVL. With respect to the second direction Y, each of the plurality of secondary line connection portions SLCP according to an embodiment may be electrically coupled to each of the plurality of secondary voltage lines SVL at a portion between the plurality of pixels P or a boundary region between the plurality of pixels P, and may be electrically coupled to a portion of the common electrode CE, and thus, may electrically couple the common electrode CE to each of the plurality of secondary voltage lines SVL. Therefore, the common electrode CE may be additionally coupled to each of the plurality of secondary voltage lines SVL through the secondary line connection portions SLCP. Accordingly, the display apparatus according to an embodiment of the present disclosure may prevent, reduce or minimize the degradation in image quality caused by a deviation of the pixel common voltage supplied to each of the pixels P arranged in the display area AA. Also, in the display apparatus according to an embodiments of the present disclosure, although the pixel common voltage pad CVP coupled to each of the plurality of secondary voltage lines SVL is not additionally disposed (or formed), the pixel common voltage may be supplied to each of the plurality of secondary voltage lines SVL through each of the pixel common voltage lines CVL and the plurality of line connection patterns LCP.

The first substrate 100 according to an embodiment of the present disclosure may further include a dam portion, an encapsulation layer, a wavelength conversion layer 107, and a functional film 108.

The dam portion may be disposed along a periphery portion of the first substrate 100. The dam portion may be implemented in a closed loop shape (or a closed loop line shape) at the periphery portion of the first substrate 100. The dam portion may be included in outermost pixels Po, or may be disposed at periphery portions of the outermost pixels Po.

The encapsulation layer may be implemented to surround a light emitting device layer. The encapsulation layer according to an embodiment may include a first inorganic encapsulation layer (or a first encapsulation layer) disposed over the light emitting device layer and the dam portion, a second inorganic encapsulation layer (or a third encapsulation layer) disposed over the first inorganic encapsulation layer, and an organic encapsulation layer (or a second encapsulation layer) disposed between the first inorganic encapsulation layer and the second inorganic encapsulation layer disposed over the light emitting device layer surrounding by the dam portion.

The dam portion may define or limit an arrangement region (or an encapsulation region) of the organic encapsulation layer covering a front surface (or a top surface) of the light emitting device layer. The dam portion may block or prevent the spread or overflow of the organic encapsulation layer.

The wavelength conversion layer may convert a wavelength of light which is incident thereon from an emission area EA of each pixel area PA. For example, the wavelength conversion layer may convert white light (or blue light), which is incident thereon from the emission area EA, into color light corresponding to the subpixel or may transmit only color light corresponding to the subpixel. For example, the wavelength conversion layer 107 may include at least one of a wavelength conversion member and a color filter layer.

The wavelength conversion layer according to an embodiment may include a plurality of wavelength conversion members and an overcoat layer (or a protection layer).

The plurality of wavelength conversion members according to an embodiment may be disposed over the encapsulation layer disposed at the emission area EA of each of the plurality of subpixel areas. For example, each of the plurality of wavelength conversion members may be implemented to have the same size as or wider than the emission area EA of each subpixel area.

The overcoat layer may be implemented to cover the wavelength conversion members and to provide a flat surface over the wavelength conversion members. For example, the overcoat layer may be disposed to cover the wavelength conversion members and the encapsulation layer where the wavelength conversion members are not disposed. The overcoat layer according to an embodiment may include an organic material. Alternatively, the protection layer may further include a getter material for adsorbing water and/or oxygen.

Optionally, the wavelength conversion layer according to another embodiment may include a quantum dot member disposed between the wavelength conversion members and the encapsulation layer. The quantum dot member may be configured to re-emit colored light set in the subpixel by re-emitting white light or blue light incident from the light emitting device layer.

Alternatively, the wavelength conversion layer may be changed to a wavelength conversion sheet having a sheet form and may be disposed over the encapsulation layer. In this case, the wavelength conversion sheet (or a quantum dot sheet) may include the wavelength conversion members disposed between a pair of films. For example, the wavelength conversion members of the wavelength conversion sheet may include a quantum dot member configured to re-emit colored light set in the subpixel by re-emitting white light or blue light incident from the light emitting device layer.

The functional film may be disposed over the wavelength conversion layer. For example, the functional film may be bonded to the wavelength conversion layer by a transparent adhesive member. The functional film according to an embodiment may include at least one of an anti-reflection layer (or an anti-reflection film), a barrier layer (or a barrier film), a touch sensing layer, and a light path control layer (or a light path control film).

The anti-reflection layer may include a circular polarization layer (or a circular polarization film) which prevents external light, reflected by TFTs and/or the pixel driving lines disposed at the first substrate 100, from traveling to the outside.

The barrier layer may include a material (for example, a polymer material) which is low in water transmission rate, and may primarily prevent the penetration of water or oxygen.

The touch sensing layer may include a touch electrode layer based on a mutual capacitance method or a self-capacitance method, and may output touch data corresponding to a user's touch through the touch electrode layer.

The light path control layer may include a stacked structure where a high refraction layer and a low refraction layer are alternately stacked and may change a path of light incident from each pixel P to minimize or reduce a color shift based on a viewing angle.

Figure 5:
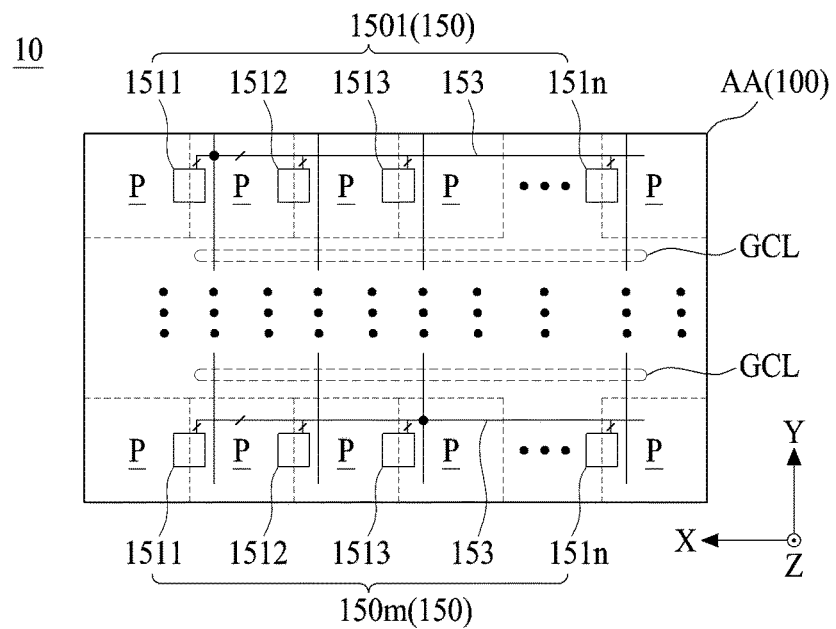
FIG. 5 is a diagram illustrating a gate driving circuit illustrated in FIGS. 1 and 3.

FIG. 5 is a diagram illustrating a gate driving circuit illustrated in FIGS. 1 and 3.

Referring to FIGS. 1, 3, and 5, a gate driving circuit 150 according to another embodiment of the present disclosure may be implemented (or embedded) within the display area AA of the first substrate 100. The gate driving circuit 150 may generate a scan signal based on gate control signals supplied through the first pad part 110 and the gate control lines GCL, and sequentially supply the scan signal to the plurality of gate lines GL.

The gate control lines GCL may include a start signal line, a plurality of shift clock lines, at least one gate driving voltage line, and at least one gate common voltage line. The gate control lines GCL may extend long along a second direction Y and may be disposed spaced apart from one another by a predetermined or selected interval in a display area AA of the first substrate 100 along the first direction X. For example, the gate control lines GCL may be disposed between at least one or more pixels P along the first direction X.

The gate driving circuit 150 according to an embodiment of the present disclosure may be implemented with a shift register including a plurality of stage circuit portions 1501 to 150*m*, where m is an integer of 2 or more.

Each of the plurality of stage circuit portions 1501 to 150*m* may be individually disposed in each horizontal line of a first surface of the first substrate 100 along the first direction X and may be dependently coupled to one another along the second direction Y. Each of the plurality of stage circuit portions 1501 to 150m may generate a scan signal in a predetermined or selected order in response to gate control signals supplied through the first pad part 110 and the gate control lines GCL and may supply the scan signal to a corresponding gate line GL.

Each of the plurality of stage circuit portions 1501 to 150m according to an embodiment may include a plurality of branch circuits 1511 to 151n and a branch network 153.

The plurality of branch circuits 1511 to 151n may be selectively coupled to the lines of the gate control lines GCL through the branch network 153 and may be electrically coupled to one another through the branch network 153. Each of the plurality of branch circuits 1511 to 151n may generate the scan signal based on a gate control signal supplied through the gate control lines GCL and a voltage of the branch network 153, and may supply the scan signal to a corresponding gate line GL.

Each of the plurality of branch circuits 1511 to 151n may include at least one TFT (or branch TFT) of a plurality of TFTs configuring one stage circuit portion of the stage circuit portions 1501 to 150m. Any one branch circuit of the plurality of branch circuits 1511 to 151n may include a pull-up TFT coupled to the gate line GL. The other branch circuit of the plurality of branch circuits 1511 to 151n may include a pull-down TFT coupled to the gate line GL.

Each of the plurality of branch circuits 1511 to 151n according to an embodiment of the present disclosure may be disposed at a circuit area between two adjacent pixels P or at a circuit area between at least two adjacent pixels P, in each horizontal line of the first substrate 100, but embodiments of the present disclosure are not limited thereto. For example, each of the plurality of branch circuits 1511 to 151n may be disposed at a circuit area (or a boundary region) between at least one or more adjacent pixels P according to an embodiments of the number of TFTs configuring each of the stage circuit portions 1501 to 150m and the number of pixels P disposed one horizontal line.

The branch network 153 may be disposed at each horizontal line of the first substrate 100 and may electrically couple the plurality of branch circuits 1511 to 151n to each other. The branch network 153 according to an embodiment of the present disclosure may include a plurality of control node lines and a plurality of network line.

The plurality of control node lines may be disposed at each horizontal line of the first substrate 100 and may be selectively coupled to the plurality of branch circuits 1511 to 151n in one horizontal line. For example, the plurality of control node lines may be disposed at an upper periphery edge region (or a lower edge region) of pixel areas arranged at each horizontal line of the first substrate 100.

The plurality of network line may be selectively coupled to the gate control lines GCL disposed at the first substrate 100 and may be selectively coupled to the plurality of branch circuits 1511 to 151n. For example, the plurality of network line may transfer the gate control signal supplied from the gate control lines GCL to corresponding branch circuits 1511 to 151n and may transfer a signal between the plurality of branch circuits 1511 to 151n.

As described above, according to an embodiment of the present disclosure, because the gate driving circuit 150 is disposed within the display area AA of the first substrate 100, a second interval D2 between a center portion of the outermost pixel area PAo and the outer surfaces OS of the first substrate 100 may be equal to or less than half of a first interval (or a pixel pitch) D1 between adjacent pixel areas PA. For example, when the gate driving circuit 150 is not disposed in the display area AA of the first substrate 100 and is disposed at a periphery portion of the first substrate 100, the second interval D2 may not be equal to or less than half of the first interval D1. Accordingly, in the light emitting display apparatus according to an embodiment of the present disclosure, the gate driving circuit 150 may be disposed in the display area AA of the first substrate 100, and thus, the second interval D2 may be implemented to be equal to or less than half of the first interval D1.

Figure 6:
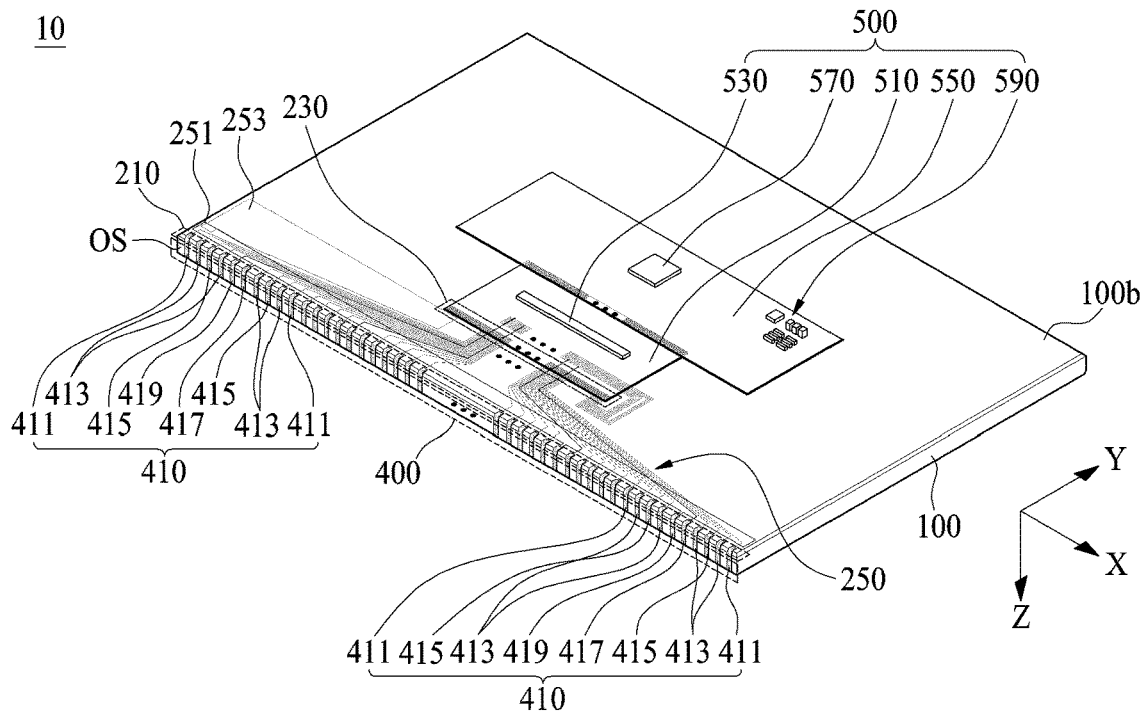
FIG. 6 is a diagram illustrating a rear surface of a display apparatus according to an embodiment of the present disclosure.

FIG. 6 is a diagram illustrating a rear surface of an display apparatus according to an embodiment of the present disclosure.

Referring to FIGS. 1, 3, and 6, a display apparatus according to an embodiment of the present disclosure may further include a second pad portion 210 disposed at a rear surface (a backside surface) 100b of the first substrate 100.

The second pad portion 210 may be disposed at one periphery portion (or a first rear periphery portion) of a rear surface 100b of the first substrate 100 overlapping the first pad part 110 disposed at a front surface 100a of the first substrate 100.

The second pad part 210 may include a plurality of second pads (or routing pads) which are arranged at a certain interval along the first direction X to respectively overlap the pads of the first pad part 110.

The plurality of second pads may be divided (or classified) into second pixel driving power pads overlapping each of the first pixel driving power pads PPP, second data pads overlapping each of the first data pads DP, second reference voltage pads overlapping each of the first reference voltage pads RVP, second gate pads overlapping each of the first gate pads GP, and second pixel common voltage pads overlapping each of the first pixel common voltage pads CVP.

The display apparatus according to an embodiment of the present disclosure may further include at least one third pad part 230 and a link line part 250 which are disposed over the rear surface 100b of the first substrate 100.

The at least one third pad part 230 (or an input pad part) may be disposed at the rear surface 100b of the first substrate 100. For example, the at least one third pad part 230 may be disposed at a middle portion adjacent to the first periphery portion of the rear surface 100b of the first substrate 100. The at least one third pad part 230 according to an embodiment may include a plurality of third pads (or input pads) which are spaced apart from one another by a certain interval. For example, the at least one third pad part 230 may include third pixel driving power pads, third data pads, third reference voltage pads, third gate pads, and third pixel common voltage pads.

The link line part 250 may include a plurality of link lines disposed between the second pad part 210 and the at least one third pad part 230.

The link line part 250 according to an embodiment of the present disclosure may include a plurality of pixel driving power link lines which individually (or a one-to-one relationship) couple the second pixel driving power pads to the third pixel driving power pads, a plurality of data link lines which individually (or a one-to-one relationship) couple the second data pads to the third data pads, a plurality of reference voltage link lines which individually (or a one-to-one relationship) couple the second reference voltage pads to the third reference voltage pads, a plurality of gate link lines which individually (or a one-to-one relationship) couple the second gate pads to the third gate pads, and a plurality of pixel common voltage link lines which individually (or a one-to-one relationship) couple the second pixel common voltage pads to the third pixel common voltage pads.

Each of the plurality of pixel common voltage link lines may include a first common link line 251 and a second common link line 253. The first common link line 251 may be disposed between the second pad part 210 and the at least one third pad part 230 and commonly coupled to the plurality of second pixel common voltage pads. The second common link line 253 may be commonly coupled to the plurality of third pixel common voltage pads and electrically coupled to the first common link line 251. The second common link line 253 may be disposed on a different layer from the first common link line 251 and may be electrically coupled to the first common link line 251 through a via hole. A size of the second common link line 253 may progressively increase in a direction from the third pad part 230 to the periphery portion of the first substrate 100 in order to reduce (or minimize) the voltage drop of the pixel common voltage.

The display apparatus according to an embodiment of the present disclosure may further include a routing portion 400 which is disposed at an outer surface OS of the first substrate 100.

The routing portion 400 may be disposed to surround the first pad part 110, the outer surface OS, and the second pad part 210 of the first substrate 100.

The routing portion 400 according to an embodiment may include a plurality of routing lines 410. Each of the plurality of routing lines 410 may be disposed at a certain interval along the first direction X, may be formed to surround the first pad part 110, the outer surface OS, and the second pad part 210 of the first substrate 100, and may be electrically coupled to the first pad part 110 and the second pad part 210 in one-to-one relationship. According to an embodiment, each of the plurality of routing lines 410 may be formed by a printing process using a conductive paste. According to another embodiment, each of the plurality of routing lines 410 may be formed by a transfer process that transfers the conductive paste pattern to a transfer pad made of a flexible material and transfers the conductive paste pattern transferred to the transfer pad to the routing portion 400. For example, the conductive paste may be an Ag paste, but embodiments of the present disclosure are not limited thereto.

Each of the plurality of routing lines 410 may be electrically coupled to each of the first pads of the first pad part 110 and the second pads of the second pad part 210 in one-to-one relationship.

The plurality of routing lines 410 according to an embodiment may be divided (classified) into a plurality of pixel power routing lines 411, a plurality of data routing lines 413, a plurality of reference voltage routing lines 415, a plurality of gate routing lines 417, and a plurality of pixel common voltage routing lines 419.

The plurality of pixel power routing lines 411 may be formed to surround the first pad part 110, the outer surface OS, and the second pad part 210, and may be electrically coupled to the plurality of first pixel driving power pads of the first pad part 110 and the plurality of second pixel driving power pads of the second pad part 210 in a one-to-one relationship.

The plurality of data routing lines 413 may be formed to surround the first pad part 110, the outer surface OS, and the second pad part 210, and may be electrically coupled to the plurality of first data pads of the first pad part 110 and the plurality of second data pads of the second pad part 210 in a one-to-one relationship.

The plurality of reference voltage routing lines 415 may be formed to surround the first pad part 110, the outer surface OS, and the second pad part 210, and may be electrically coupled to the plurality of first reference voltage pads of the first pad part 110 and the plurality of second reference voltage pads of the second pad part 210 in a one-to-one relationship.

The plurality of data routing lines 417 may be formed to surround the first pad part 110, the outer surface OS, and the second pad part 210, and may be electrically coupled to the plurality of first gate pads of the first pad part 110 and the plurality of second gate pads of the second pad part 210 in a one-to-one relationship.

The plurality of pixel common voltage routing lines 419 may be formed to surround the first pad part 110, the outer surface OS, and the second pad part 210, and may be electrically coupled to the plurality of first pixel common voltage pads CVP of the first pad part 110 and the plurality of second pixel common voltage pads of the second pad part 210 in a one-to-one relationship.

The display apparatus or the routing portion 400 according to an embodiment of present disclosure may further include an edge coating layer.

The edge coating layer may be implemented to cover the plurality of routing portion 400. The edge coating layer according to an embodiment may be implemented to cover all of the first periphery portion and the first outer surface OS of the first substrate 100 as well as the plurality of routing lines 410. The edge coating layer may prevent the corrosion of each of the plurality of routing lines 410 including a metal material or electrical short circuit between the plurality of routing lines 410. Also, the edge coating layer may prevent, reduce or minimize the reflection of external light caused by the plurality of routing lines 410 and the first pads of the first pad part 110. The edge coating layer according to an embodiment may include a light blocking material including black ink. For example, the edge coating layer may be an edge protection layer or an edge insulating layer.

The display apparatus according to an embodiment of the present disclosure may further include a driving circuit part 500.

The driving circuit part 500 may drive (or emit light) the pixels P disposed on the first substrate 100 based on digital video data and a timing synchronization signal supplied from a display driving system to allow the display area AA to display an image corresponding to image data. The driving circuit part 500 may be coupled to the at least one third pad part 230 disposed at the rear surface 100b of the first substrate 100 and may output, to the at least one third pad part 230, a data signal, a gate control signal, and a driving power for driving (or emitting light) the pixels P disposed at the first substrate 100.

The driving circuit part 500 according to an embodiment may include a flexible circuit film 510, a driving integrated circuit (IC) 530, a printed circuit board (PCB) 550, a timing controller 570, and a power circuit 590.

The flexible circuit film 510 may be coupled to the at least one third pad part 230 disposed at the rear surface 100b of the first substrate 100.

The driving IC 530 may be mounted on the flexible circuit film 510. The driving IC 530 may receive subpixel data and a data control signal provided from the timing controller 570, and convert the subpixel data into an analog data signal based on the data control signal to supply the analog data signal to a corresponding data line DL. The data signal may be supplied to a corresponding third data pads in the at least one third pad part 230 through the flexible circuit film 510.

The driving IC 530 may sense a characteristic value of a driving TFT disposed in the subpixel SP through the plurality of reference voltage lines RL (or pixel sensing line) disposed at the first substrate 100, generate sensing raw data corresponding to a sensing value for each subpixel, and provide the sensing raw data for each subpixel to the timing controller 570.

The PCB 550 may be coupled to the other side periphery portion of the flexible circuit film 510. The PCB 550 may transfer a signal and power between elements of the driving circuit part 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board coupled between the PCB 550 and the display driving system.

The timing controller 570 may align the digital video data based on the timing synchronization signal to generate pixel data matching a pixel arrangement structure disposed in the display area AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal. For example, the timing synchronization signal may include a vertical synchronization signal, a horizontal synchronization signal, a data enable signal, and a main clock (or a dot clock).

The data control signal according to an embodiment of the present disclosure may include a source start pulse, a source shift clock, and a source output signal, or the like. The data control signal may be supplied to the driving IC 530 through the flexible circuit film 510.

The gate control signal according to an embodiment may include a start signal (or a gate start pulse), a plurality of shift clocks, a forward driving signal, and a reverse driving signal. In this case, the plurality of shift clocks may include a plurality of scan clocks where phases thereof are sequentially shifted and a plurality of carry clocks where phases thereof are sequentially shifted. Additionally, the gate control signal according to an embodiment may further include an external sensing line selection signal, an external sensing reset signal, and an external sensing control signal for sensing a characteristic value of the driving TFT disposed in the subpixel SP. The gate control signal may be supplied to the gate driving circuit 150 through the flexible circuit film 510, the at least one third pad part 230, the link line part 250, the second pad part 210, the routing portion 400, the first pad part 110, and gate control limes GCL.

The timing controller 570 may drive each of the driving IC 530 and the gate driving circuit 150 based on an external sensing mode during a predetermined or selected external sensing period, generate compensation data of each subpixel for compensating for a characteristic variation of the driving TFT of each subpixel based on the sensing raw data provided from the driving IC 530, and modulate pixel data of each subpixel based on the generated compensation data of each subpixel. For example, the timing controller 570 may drive each of the driving IC 530 and the gate driving circuit 150 based on the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 570 according to an embodiment may store the sensing raw data of each subpixel, provided from the driving IC 530, in a storage circuit based on the external sensing mode. Also, in a display mode, the timing controller 570 may correct pixel data which is to be supplied to each subpixel, based on the sensing raw data stored in the storage circuit and may provide corrected pixel data to the driving IC 530. Here, sensing raw data of each subpixel may include sequential variation information about each of a driving TFT and a self-emitting device, which are disposed in a corresponding subpixel. Therefore, in the external sensing mode, the timing controller 570 may sense a characteristic value (for example, a threshold voltage or mobility) of a driving TFT disposed in each subpixel and based thereon, may correct pixel data which is to be supplied to each subpixel, thereby minimizing or preventing the degradation in image quality caused by a characteristic value deviation of driving TFTs of a plurality of subpixels. The external sensing mode of a display apparatus may be technology known to those skilled in the art, and thus, its detailed description is omitted. For example, the display apparatus according to an embodiments of the present disclosure may sense a characteristic value of the driving TFT disposed in each subpixel P based on a sensing mode disclosed in Korean Patent Publication No. 10-2016-0093179, 10-2017-0054654, or 10-2018-0002099.

The power circuit 590 may be mounted on the PCB 550 and may generate various source voltages needed for displaying an image on the pixels P by using an input power supplied from the outside to provide the generated source voltage to a corresponding circuit. For example, the power circuit 590 may generate and output a logic source voltage needed for driving of each of the timing controller 570 and the driving IC 530, the plurality of reference gamma voltages provided to the driving IC 530, and at least one gate driving power and at least one gate common power needed for driving of the gate driving circuit 150. Also, the power circuit 590 may generate and output the pixel driving power and the pixel common voltage, but embodiments of the present disclosure are not limited thereto. For example, the driving IC 530 may generate and output the pixel driving power and the pixel common voltage based on the plurality of reference gamma voltages.

Figure 7:
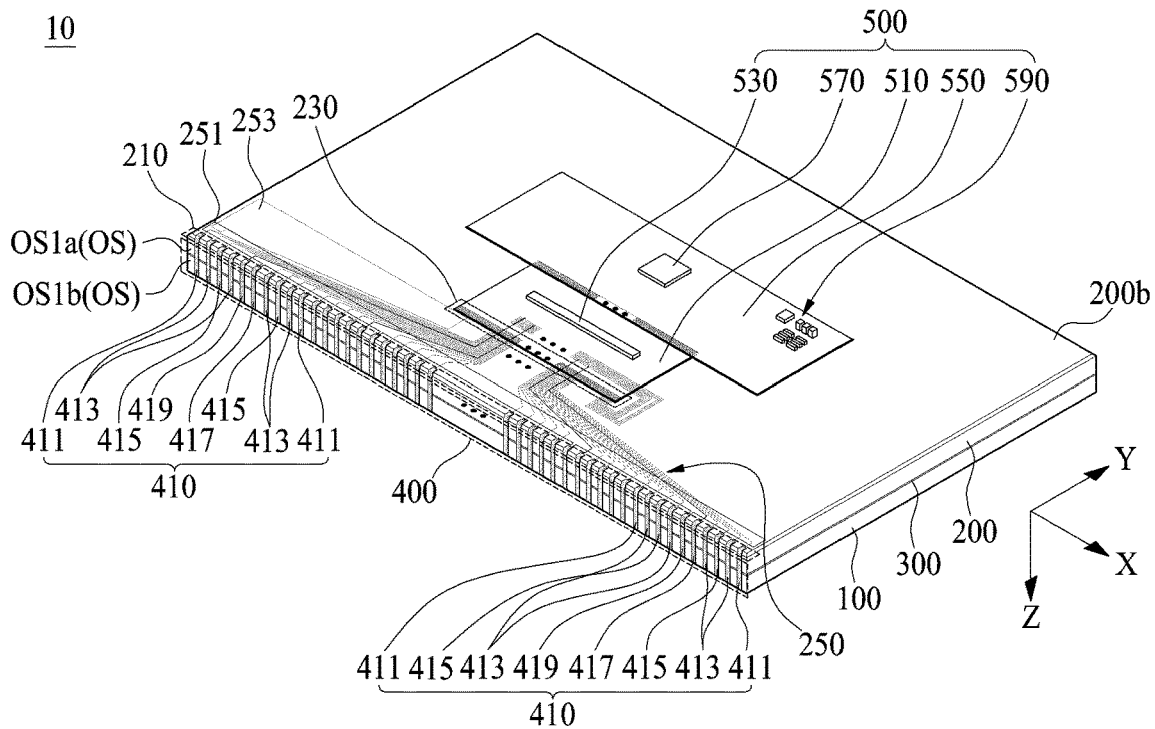
FIG. 7 is a diagram illustrating a rear surface of a display apparatus according to another embodiment of the present disclosure.

FIG. 7 is a rear perspective view illustrating a display apparatus according to another embodiment of the present disclosure, and illustrates an embodiment where a wiring substrate is additionally provided in the display apparatus illustrated in FIGS. 1 to 6.

Referring to FIG. 7, a display apparatus according to another embodiment of the present disclosure may include a first substrate 100, a second substrate 200, a coupling member 300, and a routing portion 400.

The first substrate 100 may be referred to as a display substrate, a pixel array substrate, an upper substrate, a front substrate, or a base substrate. The first substrate 100 may be a glass substrate, or may be a thin glass substrate or a plastic substrate, which is bendable or flexible.

The first substrate 100 may be substantially the same as the first substrate 100 of the display apparatus illustrated in FIGS. 1 to 6, and thus, like reference numerals refer to like elements and their repetitive descriptions may be omitted.

The second substrate 200 may be referred to as a wiring substrate, a line substrate, a link substrate, a lower substrate, a rear substrate, or link glass. The second substrate 200 may be a glass substrate, or may be a thin glass substrate or a plastic substrate, which is bendable or flexible. For example, the second substrate 200 may include the same material as the first substrate 100. A size of the second substrate 200 may be the same as or substantially the same as the first substrate 100, but embodiments of the present disclosure are not limited thereto, the size of the second substrate 200 may have a smaller than the first substrate 100. For example, the second substrate 200 may be configured to have the same size as the first substrate 100 in order to maintain or secure the stiffness of the first substrate 100.

The second substrate 200 may include a second pad part 210, at least one third pad part 230, and a link line portion 250. Except for that the second pad part 210, the at least one third pad part 230, and the link line portion 250 are disposed at a rear surface (or a backside surface) 200b of the second substrate 200, each of the second pad part 210, the at least one third pad part 230, and the link line portion 250 may substantially the same as each of the second pad part 210, the at least one third pad part 230, and the link line portion 250 illustrated in FIG. 6, and thus, like reference numerals refer to like elements and their repetitive descriptions may be omitted.

The second substrate 200 may be coupled (or connected) to a second surface 100b of the first substrate 100 by using the coupling member 300. The the coupling member 300 may be interposed between the first substrate 100 and the second substrate 200. Thus, the first substrate 100 and the second substrate 200 may be opposite-bonded to each other by the coupling member 300.

The routing portion 400 may be referred to as a side routing portion, a side wiring portion, a printing wiring portion, or a printing line portion. The routing portion 400 according to an embodiment may include a plurality of routing lines 410 which are disposed at each of a first outer surface (or one surface) OS1a among the outer surface OS of the first substrate 100 and a first outer surface (or one surface) OS1b among the outer surface OS of the second substrate 200. Except for that the plurality of routing lines 410 is disposed to surround the first pad part 110 and the first outer surface OS1a of the first substrate 100 and the second pad portion 210 and the first outer surface OS1b of the second first substrate 100, the routing portion 400 may substantially the same as the routing portion 400 illustrated in FIG. 6, and thus, like reference numerals refer to like elements and their repetitive descriptions may be omitted.

The display apparatus according to another embodiment of the present disclosure may further include a driving circuit part 500.

The driving circuit part 500 may include a flexible circuit film 510, a driving integrated circuit (IC) 530, a printed circuit board (PCB) 550, a timing controller 570, and a power circuit 590. Except for that the flexible circuit film 510 is coupled to the third pad part 230 disposed at the rear surface 200b of the second substrate 200, the driving circuit part 500 having such a configuration may be substantially the same as the driving circuit part 500 illustrated in FIG. 6, and thus, like reference numerals refer to like elements and their repetitive descriptions may be omitted.

Figure 8:
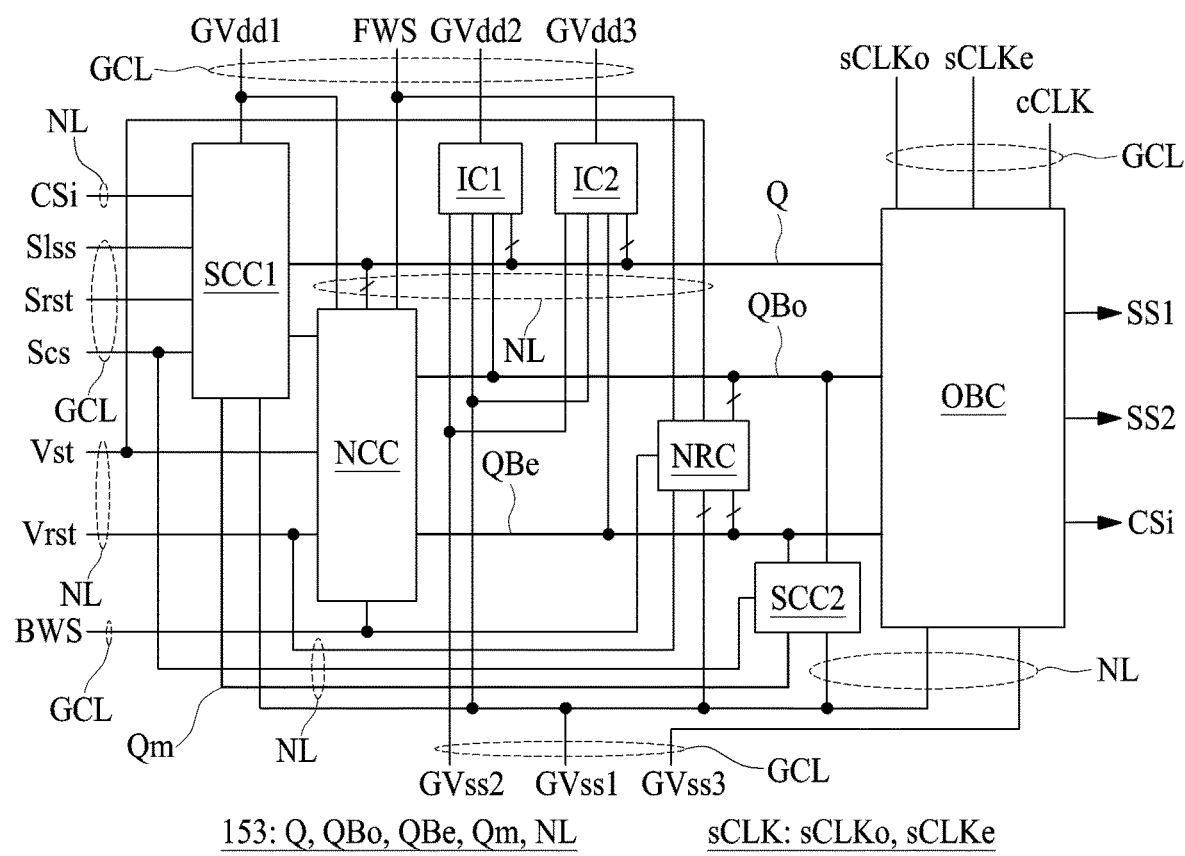
FIG. 8 is a circuit diagram illustrating an $i^{th}$ stage circuit unit illustrated in FIG. 5.

FIG. 8 is a circuit diagram illustrating an $i^{th}$ stage circuit unit illustrated in FIG. 5.

Referring to FIGS. 3 to 5, and 8, an $i^{th}$ stage circuit unit 150i according to an embodiment of the present disclosure may output two scan signals SSi and SSi+1 and a carry signal CSi in response to a gate control signal supplied from gate control lines GCL disposed over the substrate (or first substrate) 100.

The gate control signal according to an embodiment may include a start signal Vst, a plurality of shift clocks including a plurality of scan clocks sCLK and a plurality of carry clocks cCLK, first to third gate driving powers GVdd1, GVdd2, and GVdd3, and first to third gate common powers GVss1, GVss2, and GVss3. In this case, the gate control lines GCL may include a start signal line, a plurality of scan clock lines, a plurality of carry clock lines, first to third gate driving power lines, and first to third second gate common power lines.

The gate control signal according to an embodiment may include first to $j^{th}$ carry clocks and first to $j^{th}$ scan clocks. For example, j may be 4, but embodiments of the present disclosure are not limited thereto and may be an even number of 6, 8, or 10 or more.

When the gate control signal includes the first to fourth carry clocks, the first carry clock may be applied to a $4k-3^{th}$ (where k is a natural number) stage circuit unit, the second carry clock may be applied to a $4k-2^{th}$ stage circuit unit, the third carry clock may be applied to a $4k-1^{th}$ stage circuit unit, and the fourth carry clock may be applied to a $4k^{th}$ stage circuit unit. When the gate control signal includes the first to fourth scan clocks, the first and second scan clocks may be applied to an odd-numbered stage circuit unit, and the third and fourth scan clocks may be applied to an even-numbered stage circuit unit.

Moreover, the gate control signal according to an embodiment may further include a forward driving signal FWS and a backward driving signal BWS. In this case, the gate control lines GCL may further include a forward driving signal line and a backward driving signal line.

The gate control signal according to an embodiment may further include an external sensing line selection signal Slss, an external sensing reset signal Srst, and an external sensing control signal Scs for an external sensing mode. In this case, the gate control lines GCL may further include an external sensing selection signal line, an external sensing reset signal line, and an external sensing control signal line.

The $i^{th}$ stage circuit unit 150i according to an embodiment of the present disclosure may include a branch network 153, a node control circuit NCC, a first inverter circuit IC1, a second inverter circuit IC2, a node reset circuit NRC, and an output buffer circuit OBC.

The branch network 153 may be implemented to form a circuit connection between the node control circuit NCC, the first inverter circuit IC1, the second inverter circuit IC2, the node reset circuit NRC, and the output buffer circuit OBC and to be selectively connected to the lines of the gate control lines GCL.

The branch network 153 may be selectively coupled to the lines of the gate control lines GCL. The branch network 153 according to an embodiment may include first to third control node lines Q, QBo, and QBe and a network line NL.

Each of the first to third control node lines Q, QBo, and QBe may be disposed at an upper edge region (or a lower edge region) of each of the pixel areas arranged at an $i^{th}$ horizontal line of the first substrate 100. Each of the first to third control node lines Q, QBo, and QBe may be disposed in parallel with a first direction X or a gate line GL. For example, each of the first to third control node lines Q, QBo, and QBe may be disposed adjacent to the gate line GL The network line NL may be selectively coupled to the lines of the gate control lines GCL and may be selectively coupled to the first to third control node lines Q, QBo, and QBe. Also, the network line NL may be selectively coupled between circuits configuring the stage circuit unit 150$i$.

The node control circuit NCC may be implemented to control a voltage of each of the first to third control node lines Q, QBo, and QBe.

The node control circuit NCC according to an embodiment may be coupled to each of the first to third control node lines Q, QBo, and QBe through the network line NL and may be implemented to control the voltage of each of the first to third control node lines Q, QBo, and QBe in response to the start signal Vst, the reset signal Vrst, and the first gate driving power GVdd1 supplied through the network line NL. As an embodiment, the start signal Vst may be an i-$2^{th}$ carry signal CSi-2 output from the i-$2^{th}$ stage circuit unit 150$i$-2. The reset signal Vrst may be an i+$2^{th}$ carry signal CSi+2 output from an i+$2^{th}$ stage circuit unit 150$i$+2.

According to another embodiment, the node control circuit NCC may be coupled to each of the first to third control node lines Q, QBo, and QBe through the network line NL and may control the voltage of each of the first to third control node lines Q, QBo, and QBe in response to the start signal Vst, the reset signal Vrst, the forward driving signal FWS, the backward driving signal BWS, and the first gate driving power GVdd1 supplied through the network line NL.

As an embodiment, when the forward driving signal FWS has a high voltage level (or a high potential voltage level), the backward driving signal BWS may have a low voltage level (or a low potential voltage level), and when the forward driving signal FWS has a low voltage level (or a low potential voltage level), the backward driving signal BWS may have a high voltage level (or a high potential voltage level). For example, when the forward driving signal FWS has a high voltage level, the gate driving circuit 150 may supply a scan signal up to a last gate line from a first gate line based on forward scan driving, and when the backward driving signal BWS has a high voltage level, the gate driving circuit 150 may supply the scan signal up to the first gate line from the last gate line based on backward scan driving. Herein, a high voltage level may be referred to as a first voltage level, a high potential voltage level, a gate turn-on voltage level, or a transistor on voltage level, and a low voltage level may be referred to as a second voltage level, a low potential voltage level, a gate turn-off voltage level, or a transistor off voltage level.

The first inverter circuit IC1 may control or discharge the voltage of the second control node line QBo based on the voltage of the first control node line Q supplied through the network line NL. The first inverter circuit IC1 according to an embodiment may be coupled to the second gate driving power GVdd2, the first control node line Q, the second control node line QBo, the first gate common power GVss1, and the second gate common power GVss2 through the network line NL. In response to the second gate common power GVss2 and the voltage of the first control node line Q, the first inverter circuit IC1 may supply the first gate common power GVss1 to the second control node line QBo to discharge the voltage of the second control node line QBo.

The second inverter circuit IC2 may control or discharge the voltage of the third control node line QBe based on the voltage of the first control node line Q supplied through the network line NL. The second inverter circuit IC2 according to an embodiment may be coupled to the third gate driving power GVdd3, the first control node line Q, the third control node line QBe, the first gate common power GVss1, and the second gate common power GVss2 through the network line NL. In response to the third gate common power GVss3 and the voltage of the first control node line Q, the second inverter circuit IC2 may supply the first gate common power GVss1 to the third control node line QBe to discharge the voltage of the third control node line QBe.

The second gate driving power GVdd2 and the third gate driving power GVdd3 may have voltage levels which are inverted (or opposite to each other) therebetween. For example, when the second gate driving power GVdd2 has a high voltage level, the third gate driving power GVdd3 may have a low voltage level, and when the second gate driving power GVdd2 has a low voltage level, the third gate driving power GVdd3 may have a high voltage level.

The second gate common power GVss2 and the first gate common power GVss1 may have the same voltage level or different voltage levels.

The node reset circuit NRC may maintain a voltage level of each of the second control node line QBo and the third control node line QBe while the voltage of the first control node line Q has a high voltage level.

The node reset circuit NRC according to an embodiment may simultaneously reset the voltage of the second control node line QBo and the voltage of the third control node line QBe in response to the start signal Vst and the reset signal Vrst supplied through the network line NL. As an embodiment, the node reset circuit NRC may supply the first gate common power GVss1 to the second control node line QBo and the third control node line QBe in response to the start signal Vst and the reset signal Vrst, and thus, may maintain the second control node line QBo and the third control node line QBe at a voltage level of the first gate common power GVss1.

According to another embodiment, the node reset circuit NRC may simultaneously reset the voltage of the second control node line QBo and the voltage of the third control node line QBe in response to the start signal Vst, the reset signal Vrst, the forward driving signal FWS, and the backward driving signal BWS supplied through the network line NL. As an embodiment, the node reset circuit NRC may supply the first gate common power GVss1 to the second control node line QBo and the third control node line QBe in response to the start signal Vst, the reset signal Vrst, the forward driving signal FWS, and the backward driving signal BWS, and thus, may maintain each of the second control node line QBo and the third control node line QBe at a voltage level of the first gate common power GVss1.

The output buffer circuit OBC may be implemented to sequentially output two scan signals having a gate-on voltage level or to sequentially output two scan signals having a gate-off voltage level in response to the voltage of each of the first to third control node lines Q, QBo, and QBe based on the carry clock cCLK, the scan clock sCLK, the first gate common power GVss1, and the third gate common power GVss3 supplied through the network line NL.

The output buffer circuit OBC may be implemented to sequentially output two scan signals having a gate-on voltage level or to sequentially output two scan signals having a gate-off voltage level in response to the voltage of each of the first to third control node lines Q, QBo, and QBe based on the carry clock cCLK, the scan clock sCLK, the first gate common power GVss1, and the third gate common power GVss3 supplied through the network line NL.

When the voltage of the first control node line Q has a high voltage level and the voltage of each of the second and third control node lines QBo and QBe has a low voltage level, the output buffer circuit OBC according to an embodiment may output each of an $i^{th}$ carry signal CSi corresponding to the carry clock cCLK, an $i^{th}$ scan signal SSi corresponding to an odd-numbered scan clock sCLKo, and an $i+1^{th}$ scan signal SSi+1 corresponding to an even-numbered scan clock sCLKe. As an embodiment, the $i^{th}$ carry signal CSi may be supplied as the start signal Vst to the $i+2^{th}$ stage circuit unit, the $i^{th}$ scan signal SSi may be supplied to an odd-numbered gate line GLo (or an $i^{th}$ gate line GLi), and the $i+1^{th}$ scan signal SSi+1 may be supplied to an even-numbered gate line GLe (or an $i+1^{th}$ gate line GLi+1).

When the voltage of each of the first and third control node lines Q and QBe has a low voltage level and the voltage of the second control node line QBo has a high voltage level, the output buffer circuit OBC according to an embodiment may output each of the $i^{th}$ scan signal SSi and the $i+1^{th}$ scan signal SSi+1 each having a gate-off voltage level corresponding to a voltage level of the third gate common power GVss3 and may output the $i^{th}$ carry signal CSi having a gate-off voltage level corresponding to a voltage level of the first gate common power GVss1.

When the voltage of each of the first and second control node lines Q and QBo has a low voltage level and the voltage of the third control node line QBe has a high voltage level, the output buffer circuit OBC according to an embodiment may output each of the $i^{th}$ scan signal SSi and the $i+1^{th}$ scan signal SSi+1 each having a gate-off voltage level corresponding to a voltage level of the third gate common power GVss3 and may output the $i^{th}$ carry signal CSi having a gate-off voltage level corresponding to a voltage level of the first gate common power GVss1.

The output buffer circuit OBC according to an embodiment may be disposed in a center region of the $i^{th}$ horizontal line parallel to the first direction X. For example, when the output buffer circuit OBC is disposed adjacent to one end (or the other end) of a horizontal line, a voltage level of the scan signal may decrease in a direction from one end of a gate line to the other end thereof due to a line resistance of a horizontal line, and thus, in order to prevent such a problem, the output buffer circuit OBC should be disposed in the center region of the $i^{th}$ horizontal line parallel to the first direction X, but embodiments of the present disclosure are not limited thereto and may be disposed at one side or the other side of the $i^{th}$ horizontal line when a total length of the gate line is relatively short.

The first to third gate common powers GVss1, GVss2, and GVss3 may have the same voltage level or different voltage levels.

The $i^{th}$ stage circuit unit 150$i$ according to an embodiment of the present disclosure may further include a fourth control node line Qm, a first sensing control circuit SCC1, and a second sensing control circuit SCC2.

The fourth control node line Qm may be implemented to be electrically connected between the first sensing control circuit SCC1 and the second sensing control circuit SCC2. The fourth control node line Qm may be included in the branch network 153 and may be electrically connected between the first sensing control circuit SCC1 and the second sensing control circuit SCC2 through the network line NL.

The first sensing control circuit SCC1 may be implemented to control a voltage of each of the first control node line Q and the fourth control node line Qm in response to the $i^{th}$ carry signal CSi, the external sensing line selection signal Slss, the external sensing control signal Scs, the external sensing reset signal Srst, and the first gate driving power GVdd1 supplied through the branch network 153. As an embodiment, the first sensing control circuit SCC1 may charge the first gate driving power GVdd1 into the fourth control node line Qm in response to the $i^{th}$ carry signal CSi having a high voltage level and the external sensing line selection signal Slss having a high voltage level, and then, may control the voltage of the first control node line Q in response to a voltage charged into the fourth control node line Qm, the external sensing control signal Scs having a high voltage level supplied during a fore period of a vertical blank period, and the first gate driving power GVdd1. Therefore, the output buffer circuit OBC may output each of the $i^{th}$ carry signal CSi corresponding to the carry clock cCLK, the $i^{th}$ scan signal SSi corresponding to the odd-numbered scan clock sCLKo, and the $i+1^{th}$ scan signal SSi+1 corresponding to the even-numbered scan clock sCLKe during the vertical blank period based on the voltage of the first control node line Q.

Moreover, the first sensing control circuit SCC1 may discharge the voltage of the first control node line Q in response to the external sensing reset signal Srst supplied through the branch network 153. As an embodiment, the first sensing control circuit SCC1 may supply the first gate common power GVss1 to the first control node line Q to reset or initialize the voltage of the first control node line Q in response to the external sensing reset signal Srst having a high voltage level supplied during a latter period of the vertical blank period.

The second sensing control circuit SCC2 may be implemented to discharge the voltage of each of the second control node line QBo and the third control node line QBe in response to the voltage of the fourth control node line Qm and the external sensing control signal Scs supplied through the branch network 153. As an embodiment, the second sensing control circuit SCC2 may supply the first gate common voltage GVss1 to each of the second control node line QBo and the third control node line QBe to simultaneously discharge the second control node line QBo and the third control node line QBe, in response to the voltage of the fourth control node line Qm having a high voltage level and the external sensing control signal Scs having a high voltage level.

Figure 9:
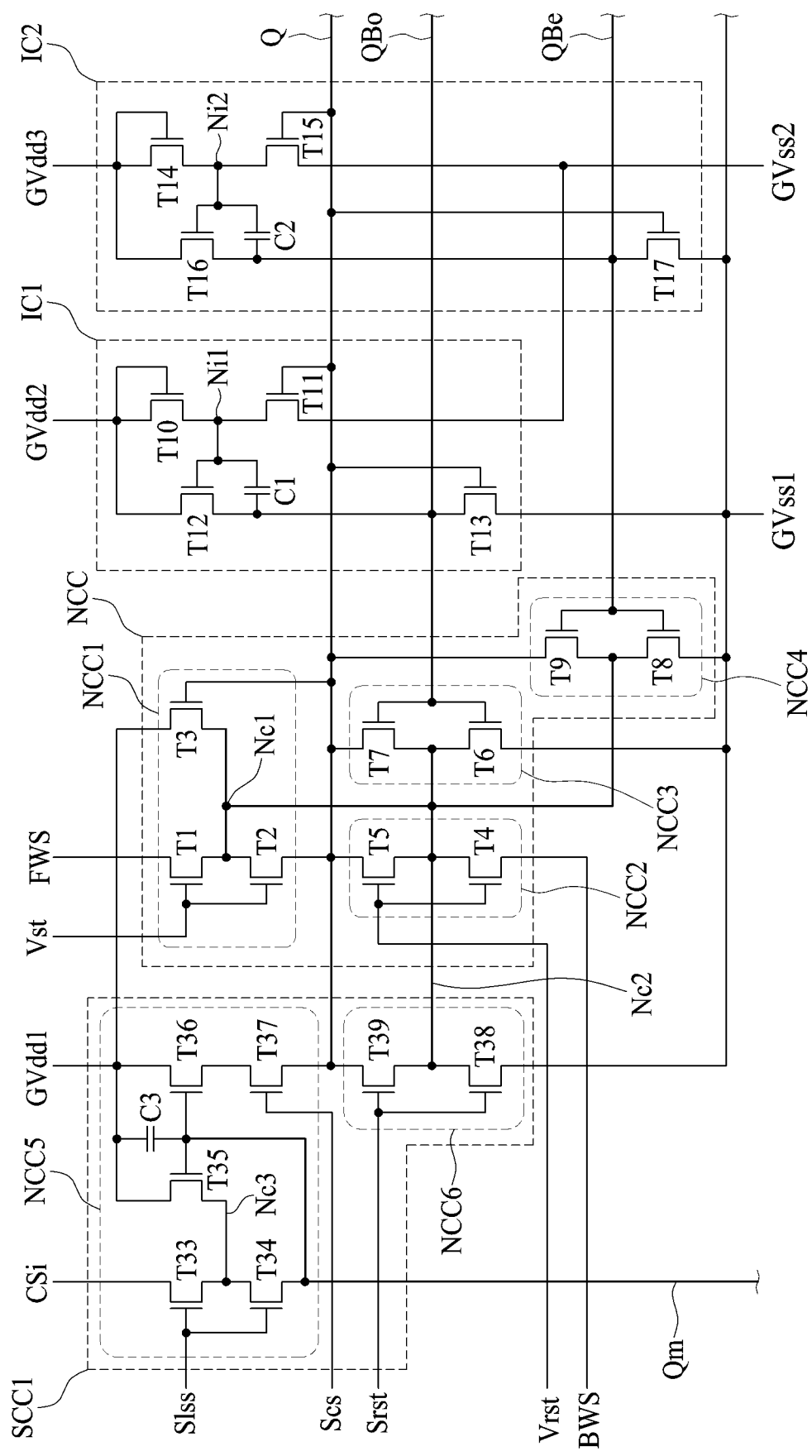
FIG. 9 is a circuit diagram illustrating a node control circuit, a first inverter circuit, a second inverter circuit, and a first sensing control circuit illustrated in FIG. 8.

FIG. 9 is a circuit diagram illustrating the node control circuit, the first inverter circuit, the second inverter circuit, and the first sensing control circuit each illustrated in FIG. 8.

Referring to FIGS. 8 and 9, a node control circuit NCC according to an embodiment may include first to fourth node control circuits NCC1 to NCC4.

In forward scan driving, the first node control circuit NCC1 may charge a high voltage level of a forward driving signal FWS into a first control node line Q in response to a start signal Vst having a high voltage level and the forward driving signal FWS having a high voltage level. Also, in backward scan driving, the first node control circuit NCC1 may electrically connect a forward driving signal line having a low voltage level to the first control node line Q to discharge a voltage, charged into the first control node line Q, to a low voltage level in response to the start signal Vst having a high voltage level and the forward driving signal FWS having a low voltage level.

The first node control circuit NCC1 according to an embodiment may include first to third TFTs T1 to T3.

The first TFT T1 may output the forward driving signal FWS to a first connection node Nc1 in response to the start signal Vst. For example, the first TFT T1 may be turned on based on the start signal Vst having a high voltage level and may output the forward driving signal FWS, supplied through the forward driving signal line, to the first connection node Nc1.

The second TFT T2 may electrically connect the first connection node Nc1 to a first control node line Q in response to the start signal Vst. For example, the second TFT T2 may be turned on based on the start signal Vst having a high voltage level and may output the forward driving signal FWS, supplied through the first TFT T1 and the first connection node Nc1, to the first control node line Q.

The third TFT T3 may supply a first gate driving power GVdd1, supplied through a first gate driving power line, to the first connection node Nc1 in response to a voltage of the first control node line Q. For example, the third TFT T3 may be turned on based on the voltage of the first control node line Q having a high voltage level and may transfer the first gate driving power GVdd1 to the first connection node Nc1 between the first TFT T1 and the second TFT T2, thereby preventing the voltage leakage of the first control node line Q. For example, the third TFT T3 may increase a voltage difference between a gate voltage of the second TFT T2 and the voltage of the first connection node Nc1 to turn off the second TFT T2 which has been turned off based on the start signal Vst having a low voltage level, and thus, may prevent the voltage drop of the first control node line Q through the turned-off second TFT T2, thereby stably maintaining the voltage of the first control node line Q.

In backward scan driving, the second node control circuit NCC2 may charge a high voltage level of a backward driving signal BWS into the first control node line Q in response to a reset signal Vrst having a high voltage level and the backward driving signal BWS having a high voltage level. Also, in forward scan driving, the second node control circuit NCC2 may electrically connect a backward driving signal line having a low voltage level to the first control node line Q to discharge a voltage, charged into the first control node line Q, to a low voltage level in response to the reset signal Vrst having a high voltage level and the backward driving signal BWS having a low voltage level.

The second node control circuit NCC2 according to an embodiment may include a fourth TFT T4 and a fifth TFT T5.

The fourth TFT T4 may output the backward driving signal BWS in response to the reset signal Vrst. For example, the fourth TFT T4 may be turned on based on the reset signal Vrst having a high voltage level and may output the backward driving signal BWS, supplied through a backward driving signal line, to a second connection node Nc2.

The fifth TFT T5 may electrically connect the second connection node Nc2 to the first control node line Q in response to the reset signal Vrst. For example, the fifth TFT T5 may be turned on based on the reset signal Vrst having a high voltage level and may output the backward driving signal BWS, supplied through the fourth TFT T4 and the second connection node Nc2, to the first control node line Q.

The second connection node Nc2 between the fourth TFT T4 and the fifth TFT T5 may be electrically connected to the first connection node Nc1. Therefore, the second connection node Nc2 may be supplied with the first gate driving power GVdd1, supplied through the first gate driving power line, through the third TFT T3 of the first node control circuit NCC1. Therefore, the third TFT T3 of the first node control circuit NCC1 may increase a voltage difference between a gate voltage of the fifth TFT T5 of the second node control circuit NCC2 and the voltage of the second connection node Nc2 to completely turn off the fifth TFT T5 which has been turned off based on the reset signal Vrst having a low voltage level, and thus, may prevent the voltage drop (or the current leakage) of the first control node line Q through the turned-off fifth TFT T5, thereby stably maintaining the voltage of the first control node line Q.

The third node control circuit NCC3 may discharge the voltage of the first control node line Q in response to a voltage of a second control node line QBo. For example, the third node control circuit NCC3 may form a current path between the first control node line Q and a first gate common power line based on a high voltage level of the second control node line QBo to discharge the voltage of the first control node line Q to the first gate common power line.

The third node control circuit NCC3 according to an embodiment may include a sixth TFT T6 and a seventh TFT T7.

The sixth TFT T6 may supply the second connection node Nc2 with the first gate common power GVss1 supplied through the first gate common power line in response to the voltage of the second control node line QBo. For example, the sixth TFT T6 may be turned on based on a high voltage level of the second control node line QBo and may electrically connect the second connection node Nc2 to the first gate common power line.

The seventh TFT T7 may electrically connect the second connection node Nc2 to the first control node line Q in response to the voltage of the second control node line QBo. For example, the seventh TFT T7 may be turned on based on a high voltage level of the second control node line QBo and may electrically connect the second connection node Nc2 to the first control node line Q.

The seventh TFT T7 may be turned off based on a low voltage level of the second control node line QBo, and a voltage difference between a gate voltage of the turned-off seventh TFT T7 and a voltage of the second connection node Nc2 may increase based on the first gate driving power GVdd1 supplied to the second connection node Nc2 through the third TFT T3 of the first node control circuit NCC1, whereby the seventh TFT T7 turned off based on the low voltage level of the second control node line QBo may be completely turned off based on the first gate driving power GVdd1 supplied to the second connection node Nc2. Accordingly, the voltage drop (or current leakage) of the first control node line Q through the third node control circuit NCC3 may be prevented because the seventh TFT T7 is completely turned off, thereby stably maintaining the voltage of the first control node line Q.

The fourth node control circuit NCC4 may discharge the voltage of the first control node line Q in response to a voltage of a third control node line QBe. For example, the fourth node control circuit NCC4 may form a current path between the first control node line Q and the first gate common power line based on a high voltage level of the third control node line QBe to discharge the voltage of the first control node line Q to the first gate common power line.

The fourth node control circuit NCC4 according to an embodiment may include an eighth TFT T8 and a ninth TFT T9.

The eighth TFT T8 may supply the second connection node Nc2 with the first gate common power GVss1 supplied through the first gate common power line in response to the voltage of the third control node line QBe. For example, the eighth TFT T8 may be turned on based on a high voltage level of the third control node line QBe and may electrically connect the second connection node Nc2 to the first gate common power line.

The ninth TFT T9 may electrically connect the second connection node Nc2 to the first control node line Q in response to the voltage of the third control node line QBe. For example, the ninth TFT T9 may be turned on based on a high voltage level of the third control node line QBe and may electrically connect the second connection node Nc2 to the first control node line Q.

The ninth TFT T9 may be turned off based on a low voltage level of the third control node line QBe, and a voltage difference between a gate voltage of the turned-off ninth TFT T9 and a voltage of the second connection node Nc2 may increase based on the first gate driving power GVdd1 supplied to the second connection node Nc2 through the third TFT T3 of the first node control circuit NCC1, whereby the ninth TFT T9 turned off based on the low voltage level of the third control node line QBe may be completely turned off based on the first gate driving power GVdd1 supplied to the second connection node Nc2. Accordingly, the voltage drop (or current leakage) of the first control node line Q through the fourth node control circuit NCC4 may be prevented because the ninth TFT T9 is completely turned off, thereby stably maintaining the voltage of the first control node line Q.

The first inverter circuit IC1 may discharge the voltage of the second control node line QBo in response to the voltage of the first control node line Q and a second gate driving power GVdd2. For example, the first inverter circuit IC1 may form a current path between the second control node line QBo and the first gate common power line based on a high voltage level of the first control node line Q to discharge the voltage of the second control node line QBo to the first gate common power line.

The first inverter circuit IC1 according to an embodiment may include tenth to thirteenth TFTs T10 to T13 and a first capacitor C1.

The tenth TFT T10 may be turned on or off based on the second gate driving power GVdd2 and may output the second gate driving power GVdd2, which has a high voltage level when turned on, to a first internal node Ni1. The tenth TFT T10 according to an embodiment may be diode-connected between the second gate driving power GVdd2 and the first internal node Ni1.

The eleventh TFT T11 may be turned on or off based on the voltage of the first control node line Q, and when turned on, may discharge a voltage of the first internal node Ni1 to a second gate common power line.

The twelfth TFT T12 may be turned on or off based on the voltage of the first internal node Ni1, and when turned on, may supply the second gate driving power GVdd2 to the second control node line QBo.

The thirteenth TFT T13 may be turned on or off based on the voltage of the first control node line Q, and when turned on, may supply the voltage of the second control node line QBo to the first gate common power line.

The first capacitor C1 may be formed between the first internal node Ni1 and a node (or the second control node line QBo) between the twelfth TFT T12 and the thirteenth TFT T13. For example, the first capacitor C1 may allow bootstrapping to occur in the first internal node Ni1 based on a voltage variation of the second gate driving power GVdd2. Therefore, when a voltage level of the second gate driving power GVdd2 varies, the voltage of the first internal node Ni1 may further vary by a voltage variation of the second gate driving power GVdd2 due to bootstrapping caused by coupling of the first capacitor C1 and the second gate driving power GVdd2, thereby more enhancing an output characteristic of the twelfth TFT T12.

The second inverter circuit IC2 may discharge the voltage of the third control node line QBe in response to the voltage of the first control node line Q and a third gate driving power GVdd3. For example, the second inverter circuit IC2 may form a current path between the third control node line QBe and the first gate common power line based on a high voltage level of the first control node line Q to discharge the voltage of the third control node line QBe to the first gate common power line.

The second inverter circuit IC2 according to an embodiment may include fourteenth to seventeenth TFTs T14 to T17 and a second capacitor C2.

The fourteenth TFT T14 may be turned on or off based on the third gate driving power GVdd3 and may output the third gate driving power GVdd3, which has a high voltage level when turned on, to a second internal node Ni2. The fourteenth TFT T14 according to an embodiment may be diode-connected between the third gate driving power GVdd3 and the second internal node Ni2.

The fifteenth TFT T15 may be turned on or off based on the voltage of the first control node line Q, and when turned on, may discharge a voltage of the second internal node Ni2 to the second gate common power line.

The sixteenth TFT T16 may be turned on or off based on the voltage of the second internal node Ni2, and when turned on, may supply the third gate driving power GVdd3 to the third control node line QBe.

The seventeenth TFT T17 may be turned on or off based on the voltage of the first control node line Q, and when turned on, may supply the voltage of the third control node line QBe to the first gate common power line.

The second capacitor C2 may be formed between the second internal node Ni2 and a node (or the third control node line QBe) between the sixteenth TFT T16 and the seventeenth TFT T17. For example, the second capacitor C2 may allow bootstrapping to occur in the second internal node Ni2 based on a voltage variation of the third gate driving power GVdd3. Therefore, when a voltage level of the third gate driving power GVdd3 varies, the voltage of the second internal node Ni2 may further vary by a voltage variation of the third gate driving power GVdd3 due to bootstrapping caused by coupling of the second capacitor C2 and the third gate driving power GVdd3, thereby more enhancing an output characteristic of the sixteenth TFT T16.

The first sensing control circuit SCC1 may be implemented to control a voltage of each of the first control node line Q and the fourth control node line Qm in response to an $i^{th}$ carry signal CSi, an external sensing line selection signal Slss, an external sensing control signal Scs, an external sensing reset signal Srst, and the first gate driving power GVdd1.

The first sensing control circuit SCC1 according to an embodiment may include a fifth node control circuit NCC5 and a sixth node control circuit NCC6.

The fifth node control circuit NCC5 may control the voltage of each of the first control node line Q and the fourth control node line Qm in response to the $i^{th}$ carry signal CSi, the external sensing line selection signal Slss, the external sensing control signal Scs, and the first gate driving power GVdd1.

The fifth node control circuit NCC5 according to an embodiment may include thirty-third to thirty-seventh TFT T33 to T37 and a third capacitor C3.

The thirty-third TFT T33 may output the $i^{th}$ carry signal CSi to a third connection node Nc3 in response to the external sensing line selection signal Slss supplied along with the start signal Vst. For example, the thirty-third TFT T33 may be turned on based on the external sensing line selection signal Slss having a high voltage level and may output the $i^{th}$ carry signal CSi to the third connection node Nc3.

The thirty-fourth TFT T34 may electrically connect the third connection node Nc3 to the fourth control node line Qm in response to the external sensing line selection signal Slss. For example, the thirty-fourth TFT T34 may be turned on based on the external sensing line selection signal Slss having a high voltage level and may supply the $i^{th}$ carry signal CSi, supplied through the thirty-third TFT T33 and the third connection node Nc3, to the fourth control node line Qm. The third connection node Nc3 may be a connection line between the thirty-third TFT T33 and the thirty-fourth TFT T34.

The thirty-fifth TFT T35 may supply the first gate driving power GVdd1 to the third connection node Nc3 in response to the voltage of the fourth control node line Qm. For example, the thirty-fifth TFT T35 may be turned on based on the voltage of the fourth control node line Qm having a high voltage level and may supply the first gate driving power GVdd1 to the third connection node Nc3, thereby preventing the voltage leakage of the fourth control node line Qm. For example, the thirty-fifth TFT T35 may increase a voltage difference between a gate voltage of the thirty-fourth TFT T34 and a voltage of the third connection node Nc3, and thus, may completely turn off the thirty-fourth TFT T34 which has been turned off based on the external sensing line selection signal Slss having a low voltage level, thereby preventing the voltage drop (or current leakage) of the fourth control node line Qm through the turned-off thirty-fourth TFT T34 to stably maintain the voltage of the fourth control node line Qm.

The thirty-sixth TFT T36 may output the first gate driving power GVdd1 to the thirty-seventh TFT T37 in response to the voltage of the fourth control node line Qm. For example, the thirty-sixth TFT T36 may be turned on based on the voltage of the fourth control node line Qm having a high voltage level and may supply the first gate driving power GVdd1 to the thirty-seventh TFT T37.

The thirty-seventh TFT T37 may electrically connect the thirty-sixth TFT T36 to the first control node line Q in response to the external sensing control signal Scs. For example, the thirty-seventh TFT T37 may be turned on based on the external sensing control signal Scs having a high voltage level and may supply the first gate driving power GVdd1, supplied through the thirty-sixth TFT T36, to the first control node line Q to charge a voltage level of the first gate driving power GVdd1 into the first control node line Q.

The third capacitor C3 may be formed between the fourth control node line Qm and the first gate driving power line and may store a difference voltage between the fourth control node line Qm and the first gate driving power line. For example, a first electrode of the third capacitor C3 may be electrically connected to the fourth control node line Qm which is connected to a gate electrode of the thirty-fifth TFT T35 and a gate electrode of the thirty-sixth TFT T36 in common, and a second electrode of the third capacitor C3 may be electrically connected to the first gate driving power line. The third capacitor C3 may store the $i^{th}$ carry signal CSi according to the turn-on of the thirty-third, thirty-fourth, and thirty-fifth TFTs T33 to T35, and when the thirty-third, thirty-fourth, and thirty-fifth TFTs T33 to T35 are turned off, the third capacitor C3 may maintain the voltage of the fourth control node line Qm at a high voltage level by using the stored voltage. For example, the third capacitor C3 may maintain the voltage of the fourth control node line Qm at a high voltage level by using the stored voltage during one horizontal period.

The sixth node control circuit NCC6 may discharge the voltage of the first control node line Q in response to the external sensing reset signal Srst. As an embodiment, the sixth node control circuit NCC6 may supply the first gate common power GVss1 to the first control node line Q in response to the external sensing reset signal Srst having a high voltage level, thereby resetting or initializing the voltage of the first control node line Q.

The sixth node control circuit NCC6 according to an embodiment may include a thirty-eighth TFT T38 and a thirty-ninth TFT T39.

The thirty-eighth TFT T38 may supply the first gate common power GVss1, supplied through the first gate common power line, to the second connection node Nc2 in response to the external sensing reset signal Srst. For example, the thirty-eighth TFT T38 may be turned on based on the external sensing reset signal Srst having a high voltage level and may output the first gate common power GVss1 to the second connection node Nc2.

The thirty-ninth TFT T39 may electrically connect the second connection node Nc2 to the first control node line Q in response to the external sensing reset signal Srst. For example, the thirty-ninth TFT T39 may be turned on based on the external sensing reset signal Srst having a high voltage level and may supply the first gate common power GVss1, supplied through the thirty-eighth TFT T38 and the second connection node Nc2, to the first control node line Q.

The second connection node Nc2 between the thirty-eighth TFT T38 and the thirty-ninth TFT T39 may be electrically connected to the first connection node Nc1. Therefore, the second connection node Nc2 may be supplied with the first gate driving power GVdd1 through the third TFT T3 of the first node control circuit NCC1. Therefore, the third TFT T3 of the first node control circuit NCC1 may increase a voltage difference between a gate voltage of the thirty-ninth TFT T39 of the sixth node control circuit NCC6 and the voltage of the second connection node Nc2 to completely turn off the thirty-ninth TFT T39 which has been turned off based on the external sensing reset signal Srst having a low voltage level, and thus, may prevent the voltage drop (or the current leakage) of the first control node line Q through the turned-off thirty-ninth TFT T39, thereby stably maintaining the voltage of the first control node line Q.

Figure 10:
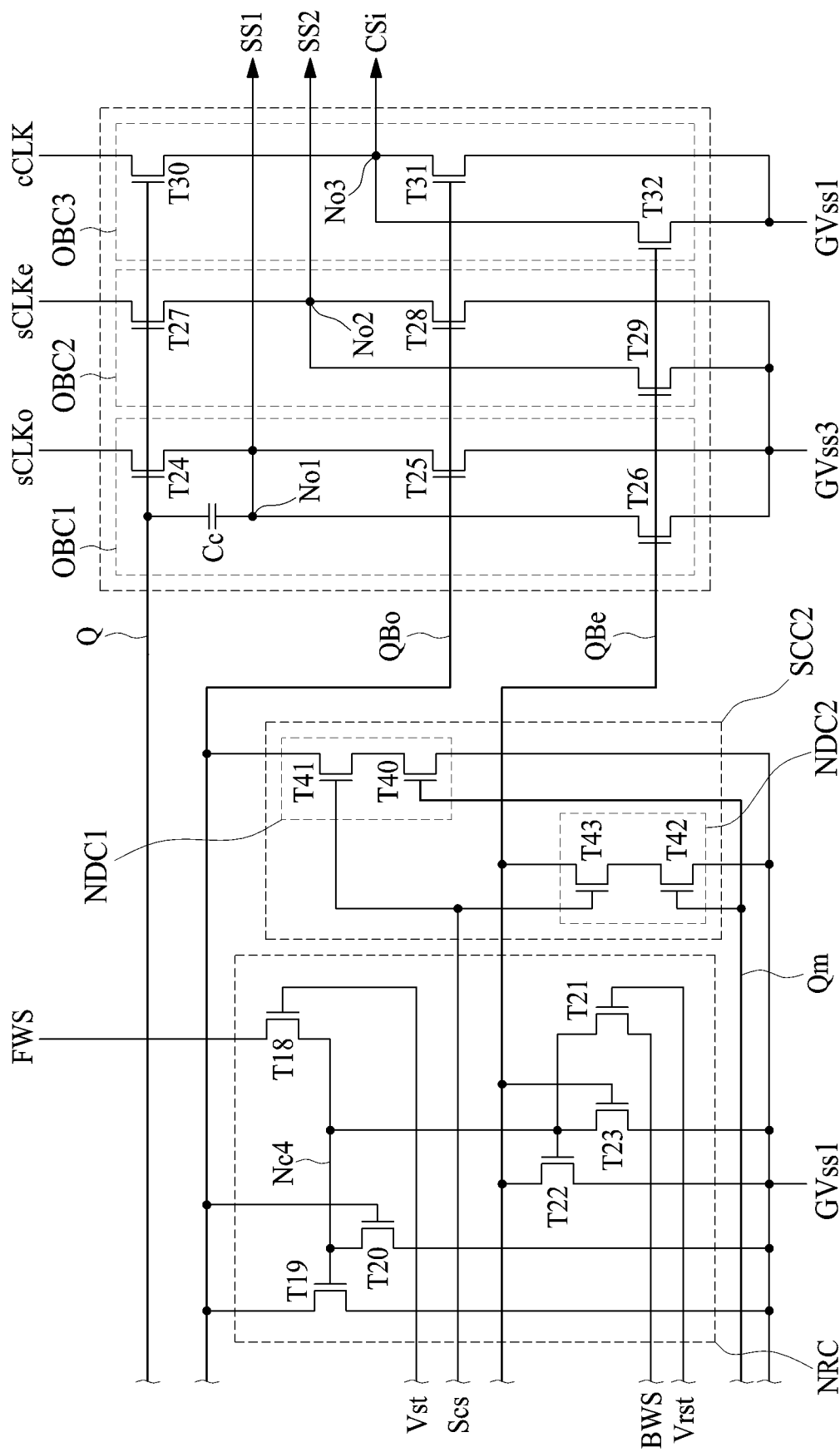
FIG. 10 is a circuit diagram illustrating a noise removal circuit, an output buffer circuit, and a second sensing control circuit illustrated in FIG. 8.

FIG. 10 is a circuit diagram illustrating the node reset circuit, the output buffer circuit, and the second sensing control circuit each illustrated in FIG. 8.

Referring to FIGS. 8 and 10, a node reset circuit NRC according to an embodiment may maintain a voltage level of each of a second control node line QBo and a third control node line QBe while a voltage of a first control node line Q has a high voltage level.

The node reset circuit NRC according to an embodiment may include eighteenth to twenty-third TFTs T18 to T23.

The eighteenth TFT T18 may electrically connect a fourth connection node Nc4 to a forward driving signal line in response to a start signal Vst and a forward driving signal FWS. As an embodiment, the eighteenth TFT T18 may be turned on based on the start signal Vst having a high voltage level and may supply the forward driving signal FWS to the fourth connection node Nc4.

The nineteenth TFT T19 may electrically connect a second control node line QBo to a first gate common power line in response to a voltage of a fourth connection node Nc4. As an embodiment, the nineteenth TFT T19 may be turned on based on a voltage of the fourth connection node Nc4 and may form a current path between the second control node line QBo and a first gate common power line to discharge a voltage of the second control node line QBo to the first gate common power line, thereby resetting the voltage of the second control node line QBo to a voltage level of a first gate common power GVss1.

The twentieth TFT T20 may electrically connect the fourth connection node Nc4 to the first gate common power line in response to the voltage of the second control node line QBo. As an embodiment, the twentieth TFT T20 may be turned on based on a high voltage level of the second control node line QBo and may form a current path between the fourth connection node Nc4 and the first gate common power line to discharge a voltage of the fourth connection node Nc4 to the first gate common power line, thereby resetting the voltage of the fourth connection node Nc4 to the voltage level of the first gate common power GVss1. Accordingly, when the voltage of the second control node line QBo has a high voltage level, the twentieth TFT T20 may reset the voltage of the fourth connection node Nc4 to the voltage level of the first gate common power GVss1 to turn off the nineteenth TFT T19, and thus, may prevent the voltage of the second control node line QBo from being discharged to the first gate common power line through the nineteenth TFT T19.

The twenty-first TFT T21 may electrically connect the fourth connection node Nc4 to a backward driving signal line in response to a reset signal Vrst and a backward driving signal BWS. As an embodiment, the twenty-first TFT T21 may be turned on based on the reset signal Vrst having a high voltage level and may supply the backward driving signal BWS having a high voltage level to the fourth connection node Nc4.

The twenty-second TFT T22 may electrically connect the third control node line QBe to the first gate common power line in response to the voltage of the fourth connection node Nc4. As an embodiment, the twenty-second TFT T22 may be turned on based on the voltage of the fourth connection node Nc4 and may form a current path between the third control node line QBe and the first gate common power line to discharge a voltage of the third control node line QBe to the first gate common power line, thereby resetting the voltage of the third control node line QBe to the voltage level of the first gate common power GVss1.

The twenty-third TFT T23 may electrically connect the fourth connection node Nc4 to the first gate common power line in response to the voltage of the third control node line QBe. As an embodiment, the twenty-third TFT T23 may be turned on based on a high voltage level of the third control node line QBe and may form a current path between the fourth connection node Nc4 and the first gate common power line to discharge the voltage of the fourth connection node Nc4 to the first gate common power line, thereby resetting the voltage of the fourth connection node Nc4 to the voltage level of the first gate common power GVss1. Accordingly, when the voltage of the third control node line QBe has a high voltage level, the twenty-third TFT T23 may reset the voltage of the fourth connection node Nc4 to the voltage level of the first gate common power GVss1 to turn off the twenty-second TFT T22, and thus, may prevent the voltage of the third control node line QBe from being discharged to the first gate common power line through the twenty-second TFT T22.

The nineteenth TFT T19 and the twenty-second TFT T22 may be simultaneously turned on or off based on the voltage of the fourth connection node Nc4.

As an embodiment, in forward scan driving of the gate driving circuit 150, the nineteenth TFT T19 and the twenty-second TFT T22 may be simultaneously turned on based on a high voltage level of the forward driving signal FWS supplied to the fourth connection node Nc4 through the eighteenth TFT T18 turned on based on the start signal Vst having a high voltage level and may be simultaneously turned off based on the first gate common power GVss1 supplied to the fourth connection node Nc4 through the twentieth TFT T20 turned on based on a high voltage level of the second control node line QBo or may be simultaneously turned off based on the first gate common power GVss1 supplied to the fourth connection node Nc4 through the twenty-third TFT T23 turned on based on a high voltage level of the third control node line QBe.

As another embodiment, in backward scan driving of the gate driving circuit 150, the nineteenth TFT T19 and the twenty-second TFT T22 may be simultaneously turned on based on a high voltage level of the backward driving signal BWS supplied to the fourth connection node Nc4 through the twenty-first TFT T21 turned on based on the reset signal Vrst having a high voltage level and may be simultaneously turned off based on the first gate common power GVss1 supplied to the fourth connection node Nc4 through the twenty-third TFT T23 turned on based on a high voltage level of the third control node line QBe or may be simultaneously turned off based on the first gate common power GVss1 supplied to the fourth connection node Nc4 through the twentieth TFT T20 turned on based on a high voltage level of the second control node line QBo.

The output buffer circuit OBC may receive a carry clock cCLK, an odd-numbered scan clock sCLKo, an even-numbered scan clock sCLKe, a first gate common power GVss1, the second gate common power GVss2, and a third gate common power GVss3 and may output an $i^{th}$ scan signal SSi, an $i+1^{th}$ scan signal SSi+1, and an $i^{th}$ carry signal CSi based on the carry clock cCLK, the scan clock sCLK, and the third gate common power GVss3 in response to the voltage of each of the first to third control node lines Q, QBo, and QBe. For example, when the voltage of the first control node line Q has a high voltage level, the output buffer circuit OBC may output the $i^{th}$ carry signal CSi corresponding to the carry clock cCLK, the $i^{th}$ scan signal SSi corresponding to the odd-numbered scan clock sCLKo, and the $i+1^{th}$ scan signal SSi+1 corresponding to the even-numbered scan clock sCLKe.

The output buffer circuit OBC according to an embodiment may include first to third output buffer circuits OBC1 to OBC3.

The first output buffer circuit OBC1 may output the $i^{th}$ scan signal SSi having a voltage level of the odd-numbered scan clock sCLKo or a voltage level of the third gate common power GVss3 based on the voltage of each of the first to third control node lines Q, QBo, and QBe.

The first output buffer circuit OBC1 according to an embodiment may include twenty-fourth to twenty-sixth TFTs T24 to T26 and a coupling capacitor Cc.

The twenty-fourth TFT T24 (or a first pull-up TFT) may transfer the odd-numbered scan clock sCLKo to the $i^{th}$ gate line GLi through a first output node No1 based on the voltage of the first control node line Q. For example, the twenty-fourth TFT T24 may include a gate electrode connected to the first control node line Q, a first source/drain electrode connected to the first output node No1, and a second source/drain electrode connected to an odd-numbered scan clock line.

The twenty-fifth TFT T25 (or an odd first pull-down TFT) may transfer the third gate common power GVss3 to the $i^{th}$ gate line GLi through the first output node No1 based on the voltage of the second control node line QBo. For example, the twenty-fifth TFT T25 may include a gate electrode connected to the second control node line QBo, a first source/drain electrode connected to the first output node No1, and a second source/drain electrode connected to a third gate common power line.

The twenty-sixth TFT T26 (or an even first pull-down TFT) may transfer the third gate common power GVss3 to the $i^{th}$ gate line GLi through the first output node No1 based on the voltage of the third control node line QBe. For example, the twenty-sixth TFT T26 may include a gate electrode connected to the third control node line QBe, a first source/drain electrode connected to the first output node No1, and a second source/drain electrode connected to a third gate common power line.

The coupling capacitor Cc may be formed between the first control node line Q and the first output node No1. For example, the coupling capacitor Cc may be a parasitic capacitor between a gate electrode of the twenty-fourth TFT T24 and the first output node No1. The coupling capacitor Cc may allow bootstrapping to occur in the first control node line Q based on a phase shift (or variation) of the odd-numbered scan clock sCLKo. Accordingly, when the odd-numbered scan clock sCLKo is shifted from a low voltage level to a high voltage level, the voltage of the first control node line Q may be boosted to a higher voltage by a high voltage level of the odd-numbered scan clock sCLKo based on bootstrapping caused by coupling between the coupling capacitor Cc and the odd-numbered scan clock sCLKo having a high voltage level. For example, as the odd-numbered scan clock sCLKo having a high voltage level is supplied to the second source/drain electrode of the twenty-fourth TFT T24, the voltage of the first control node line Q pre-charged with a voltage level of the forward driving signal FWS by the first node control circuit NCC1 may be boosted to a higher voltage, and thus, the twenty-fourth TFT T24 may be completely turned on and the odd-numbered scan clock sCLKo having a high voltage level may be supplied to, as the $i^{th}$ scan signal SSi, the $i^{th}$ gate line GLi through the first output node No1 and the turned-on twenty-fourth TFT T24 without voltage loss.

The second output buffer circuit OBC2 may output the $i+1^{th}$ scan signal SSi+1 having a voltage level of the even-numbered scan clock sCLKe or a voltage level of the third gate common power GVss3 based on the voltage of each of the first to third control node lines Q, QBo, and QBe.

The second output buffer circuit OBC2 according to an embodiment may include twenty-seventh to twenty-ninth TFTs T27 to T29.

The twenty-seventh TFT T27 (or a second pull-up TFT) may transfer the even-numbered scan clock sCLKe to the $i+1^{th}$ gate line GLi+1 through a second output node No2 based on the voltage of the first control node line Q. For example, the twenty-seventh TFT T27 may include a gate electrode connected to the first control node line Q, a first source/drain electrode connected to the second output node No2, and a second source/drain electrode connected to an even-numbered scan clock line. The twenty-seventh TFT T27 may be turned on based on the bootstrapped voltage of the first control node line Q, and thus, may transfer the even-numbered scan clock sCLKe having a high voltage level, supplied through an even-numbered scan clock line, to the $i+1^{th}$ gate line GLi+1 as the $i+1^{th}$ scan signal SSi+1 through the second output node No2 without voltage loss.

The twenty-eighth TFT T28 (or an odd second pull-down TFT) may transfer the third gate common power GVss3 to the $i+1^{th}$ gate line GLi+1 through the second output node No2 based on the voltage of the second control node line QBo. For example, the twenty-eighth TFT T28 may include a gate electrode connected to the second control node line QBo, a first source/drain electrode connected to the second output node No2, and a second source/drain electrode connected to the third gate common power line.

The twenty-ninth TFT T29 (or an even second pull-down TFT) may transfer the third gate common power GVss3 to the $i+1^{th}$ gate line GLi+1 through the second output node No2 based on the voltage of the third control node line QBe. For example, the twenty-ninth TFT T29 may include a gate electrode connected to the third control node line QBe, a first source/drain electrode connected to the second output node No2, and a second source/drain electrode connected to the third gate common power line.

The third output buffer circuit OBC3 may output the $i^{th}$ carry signal CSi having a voltage level of the carry clock cCLK or a voltage level of the first gate common power GVss1 based on the voltage of each of the first to third control node lines Q, QBo, and QBe.

The third output buffer circuit OBC3 according to an embodiment may include thirtieth to thirty-second TFTs T30 to T32.

The thirtieth TFT T30 (or a third pull-up TFT) may output, as the $i^{th}$ carry signal CSi, the carry clock cCLK through a third output node No3 based on the voltage of the first control node line Q. For example, the thirtieth TFT T30 may include a gate electrode connected to the first control node line Q, a first source/drain electrode connected to the third output node No3, and a second source/drain electrode connected to a carry clock line. The thirtieth TFT T30 may be turned on based on the bootstrapped voltage of the first control node line Q and may output, as the $i^{th}$ carry signal CSi, the carry clock cCLK having a high voltage level, supplied through the carry clock line, through the third output node No3 without voltage loss.

The thirty-first TFT T31 (or an odd third pull-down TFT) may output, as the $i^{th}$ carry signal CSi, the first gate common power GVss1 through the third output node No3 based on the voltage of the second control node line QBo. For example, the thirty-first TFT T31 may include a gate electrode connected to the second control node line QBo, a first source/drain electrode connected to the third output node No3, and a second source/drain electrode connected to the first gate common power line.

The thirty-second TFT T32 (or an even third pull-down TFT) may output, as the $i^{th}$ carry signal CSi, the first gate common power GVss1 through the third output node No3 based on the voltage of the third control node line QBe. For example, the thirty-second TFT T32 may include a gate electrode connected to the third control node line QBe, a first source/drain electrode connected to the third output node No3, and a second source/drain electrode connected to the first gate common power line.

Alternatively, the coupling capacitor Cc may be formed between the first control node line Q and the third output node No3. Furthermore, the coupling capacitor Cc may be formed in at least one of a region between the first control node line Q and the first output node No1, a region between the first control node line Q and the second output node No2, and a region between the first control node line Q and the third output node No3.

The second sensing control circuit SCC2 may be implemented to discharge the voltage of each of the second control node line QBo and the third control node line QBe in response to the voltage of the fourth control node line Qm and the external sensing control signal Scs.

The second sensing control circuit SCC2 according to an embodiment may include a first node discharging circuit NDC1 and a second node discharging circuit NDC2.

The first node discharging circuit NDC1 may discharge the voltage of the second control node line QBo in response to the voltage of the fourth control node line Qm and the external sensing control signal Scs. As an embodiment, the first node discharging circuit NDC1 may supply the first gate common power GVss1 to the second control node line QBo in response to the voltage of the fourth control node line Qm having a high voltage level and the external sensing control signal Scs having a high voltage level, and thus, may discharge the voltage of the second control node line QBo to the first gate common power line or may reset the voltage of the second control node line QBo to the first gate common power GVss1.

The first node discharging circuit NDC1 according to an embodiment may include a fortieth TFT T40 and a forty-first TFT T41.

The fortieth TFT T40 may transfer the first gate common power GVss1 to the forty-first TFT T41 in response to the voltage of the fourth control node line Qm. As an embodiment, the fortieth TFT T40 may be turned on based on a high voltage level of the fourth control node line Qm and may form a current path between the forty-first TFT T41 and the first gate common power GVss1.

The forty-first TFT T41 may electrically connect the second control node line QBo to the fortieth TFT T40 in response to the external sensing control signal Scs. As an embodiment, the forty-first TFT T41 may be turned on based on the external sensing control signal Scs having a high voltage level and may form a current path between the second control node line QBo and the fortieth TFT T40. The forty-first TFT T41 may be turned on based on the external sensing control signal Scs having a high voltage level in a state where the fortieth TFT T40 is turned on based on a high voltage level of the fourth control node line Qm, and thus, the voltage of the second control node line QBo may be discharged to the first gate common power line or may be reset to the first gate common power GVss1 through each of the forty-first TFT T41 and the fortieth TFT T40.

The second node discharging circuit NDC2 may discharge the voltage of the third control node line QBe in response to the voltage of the fourth control node line Qm and the external sensing control signal Scs. As an embodiment, the second node discharging circuit NDC2 may supply the first gate common power GVss1 to the third control node line QBe in response to the voltage of the fourth control node line Qm having a high voltage level and the external sensing control signal Scs having a high voltage level, and thus, may discharge the voltage of the third control node line QBe to the first gate common power line or may reset the voltage of the third control node line QBe to the first gate common power GVss1

The second node discharging circuit NDC2 according to an embodiment may include a forty-second TFT T42 and a forty-third TFT T43.

The forty-second TFT T42 may transfer the first gate common power GVss1 to the forty-third TFT T43 in response to the voltage of the fourth control node line Qm. As an embodiment, the forty-second TFT T42 may be turned on based on a high voltage level of the fourth control node line Qm and may form a current path between the forty-third TFT T43 and the first gate common power GVss1.

The forty-third TFT T43 may electrically connect the third control node line QBe to the forty-second TFT T42 in response to the external sensing control signal Scs. As an embodiment, the forty-third TFT T43 may be turned on based on the external sensing control signal Scs having a high voltage level and may form a current path between the third control node line QBe and the forty-second TFT T42. The forty-third TFT T43 may be turned on based on the external sensing control signal Scs having a high voltage level in a state where the forty-second TFT T42 is turned on based on a high voltage level of the fourth control node line Qm, and thus, the voltage of the third control node line QBe may be discharged to the first gate common power line or may be reset to the first gate common power GVss1 through each of the forty-third TFT T43 and the forty-second TFT T42.

Alternatively, the second sensing control circuit SCC2 may be omitted along with the first sensing control circuit SCC1. That is, each of the first sensing control circuit SCC1 and the second sensing control circuit SCC2 may be a circuit which is used for sensing a characteristic value of a driving TFT disposed in a subpixel of a pixel based on an external sensing mode of the pixel, and when the pixel is not driven in the external sensing mode, each of the first sensing control circuit SCC1 and the second sensing control circuit SCC2 may be an undesired element and thus may be omitted.

The first to forty-third TFTs T1 to T43 illustrated in FIGS. 9 and 10 may be separately disposed (or distributedly disposed) at one horizontal line of the display area AA and may be connected to one another through the branch network 153, and thus, may configure the plurality of branch circuits 1511 to 151$n$ illustrated in FIG. 5. For example, each of the stage circuit units 1501 to 150$m$ may include first to n$^{th}$ (where n is 43) branch circuits 1511 to 151$n$ where one of the first to forty-third TFTs T1 to T43 is disposed or provided, but embodiments of the present disclosure are not limited thereto and each of the plurality of branch circuits 1511 to 151$n$ may be implemented with at least one of the first to forty-third TFTs T1 to T43 based on the number of pixels disposed in one horizontal line.

Additionally, in the stage circuit unit 150$i$ illustrated in FIGS. 8 to 10, when the first switching TFT Tsw1 and the second switching TFT Tsw2 disposed in the pixel circuit PC of each of the plurality of subpixels SP1 to SP4 illustrated in FIG. 4 are turned on based on different first and second scan signals, the i$^{th}$ scan signal SSi may be used as a first scan signal supplied through a first gate line of the odd-numbered gate line GLo and the i+1$^{th}$ scan signal SSi+1 may be used as the first scan signal supplied through a first gate line of the even-numbered gate line GLe. Therefore, the output buffer circuit OBC of the stage circuit unit 150$i$ illustrated in FIGS. 8 to 10 may further include a fourth output buffer circuit and a fifth output buffer circuit.

The fourth output buffer circuit may be implemented to output a second scan signal to a second gate line of the odd-numbered gate line GLo, and the fifth output buffer circuit may be implemented to output the second scan signal to a second gate line of the even-numbered gate line GLe.

The fourth output buffer circuit according to an embodiment may output an i$^{th}$ second scan signal having a voltage level of a second scan odd-numbered scan clock or a voltage level of the third gate common power GVss3 based on the voltage of each of the first to third control node lines Q, QBo, and QBe. Except for that the fourth output buffer circuit outputs the $i^{th}$ second scan signal based on the second scan odd-numbered scan clock, the fourth output buffer circuit may include three TFTs which are substantially the same as those of the first output buffer circuit OBC1 illustrated in FIG. 10, and thus, its detailed description is omitted.

The fifth output buffer circuit according to an embodiment may output an $i+1^{th}$ second scan signal having a voltage level of a second scan even-numbered scan clock or a voltage level of the third gate common power GVss3 based on the voltage of each of the first to third control node lines Q, QBo, and QBe. Except for that the fifth output buffer circuit outputs the $i+1^{th}$ second scan signal based on the second scan even-numbered scan clock, the fifth output buffer circuit may include three TFTs which are substantially the same as those of the second output buffer circuit OBC2 illustrated in FIG. 10, and thus, its detailed description is omitted.

In the stage circuit unit 150i illustrated in FIGS. 8 and 10, the odd-numbered scan clock sCLKo may be referred to as a first scanning odd-numbered scan clock, and the even-numbered scan clock sCLKe may be referred to as a first scanning even-numbered scan clock. For example, a first scanning scan clock and a second scanning scan clock may have the same phase or different phases. Also, the first scanning scan clock and the second scanning scan clock may have the same clock width or different clock widths.

Figure 11:
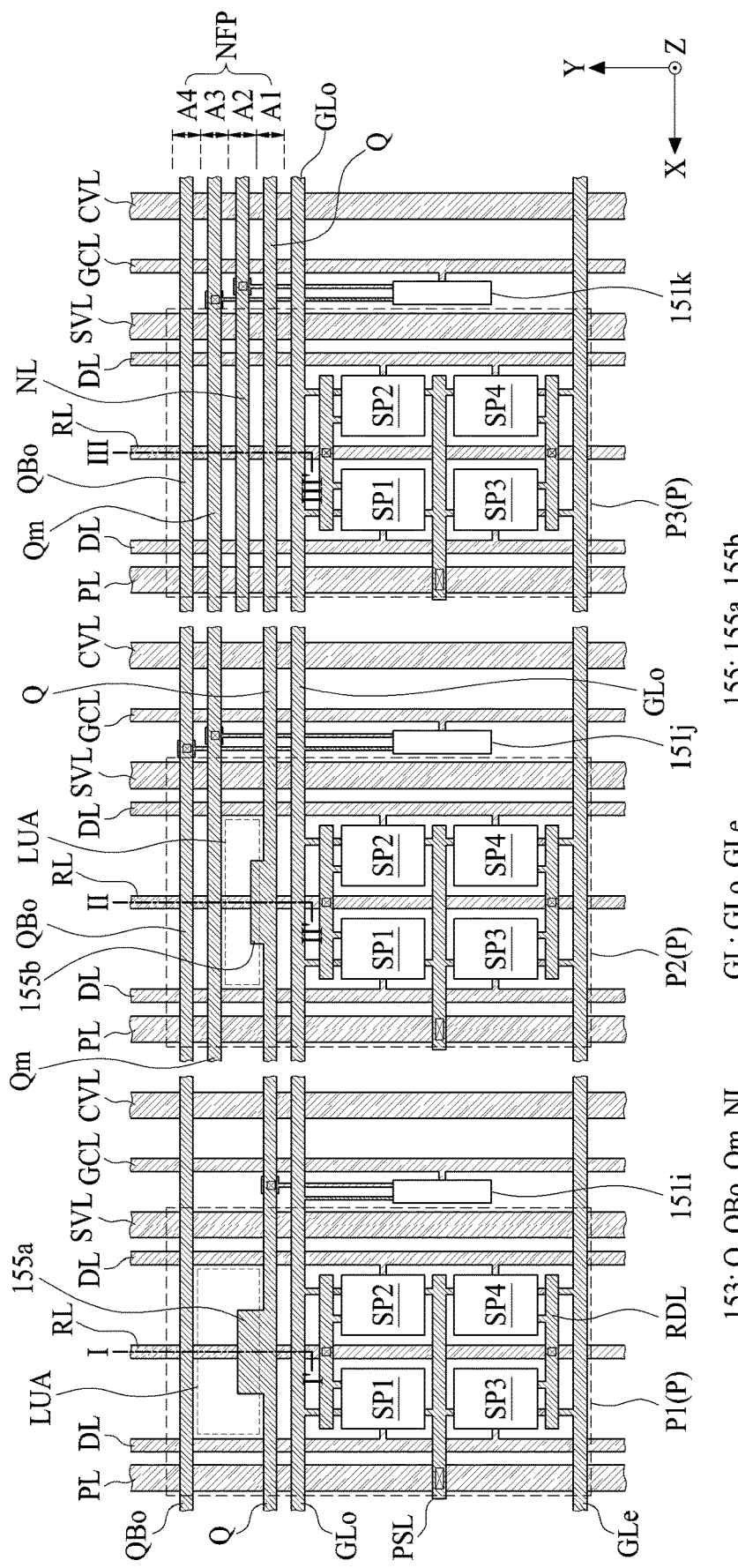
FIG. 11 is a diagram illustrating a branch network and an additional pattern according to an embodiment illustrated in FIGS. 5 and 8 to 10.
Figure 12A:
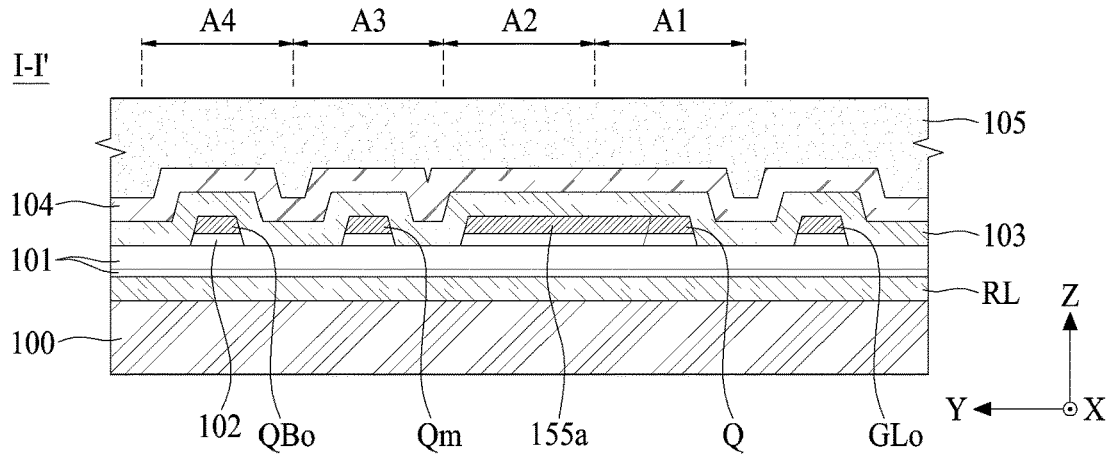
FIG. 12A is a cross-sectional view taken along line I-I' illustrated in FIG. 11.
Figure 12B:
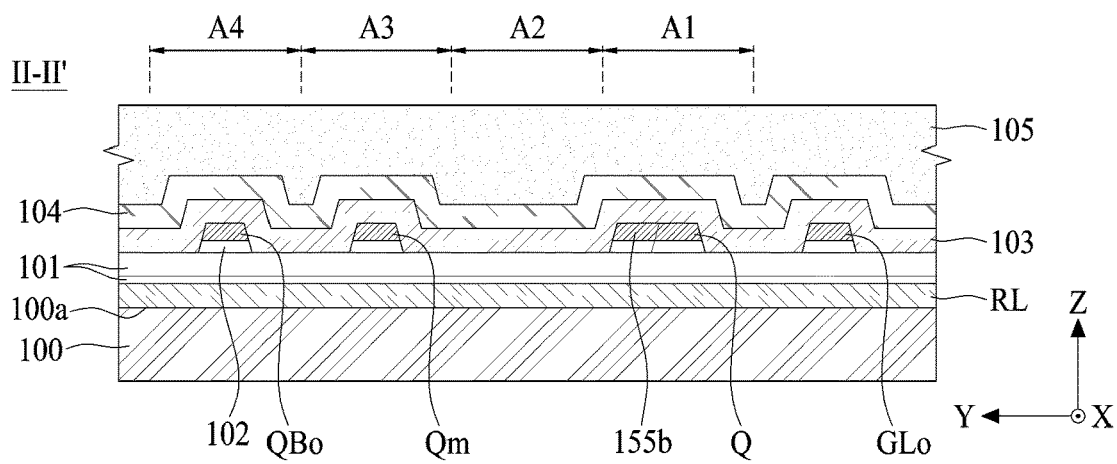
FIG. 12B is a cross-sectional view taken along line II-II' illustrated in FIG. 11.
Figure 12C:
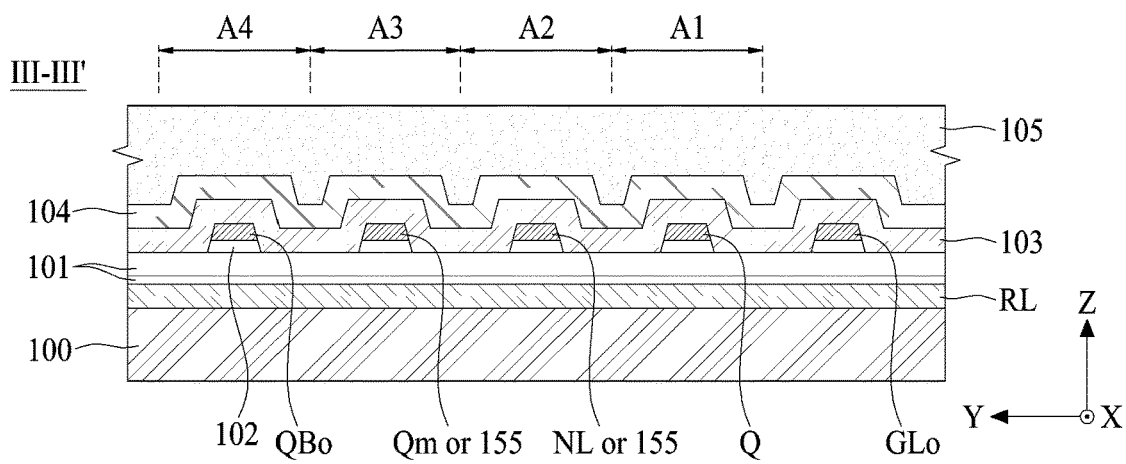
FIG. 12C is a cross-sectional view taken along line III-III' illustrated in FIG. 11.

FIG. 11 is a diagram illustrating a branch network and an additional pattern according to an embodiment of the present disclosure illustrated in FIGS. 5 and 8 to 10, FIG. 12A is a cross-sectional view taken along line I-I' illustrated in FIG. 11, FIG. 12B is a cross-sectional view taken along line II-II' illustrated in FIG. 11, and FIG. 12C is a cross-sectional view taken along line III-III' illustrated in FIG. 11.

Referring to FIGS. 5 and 8 to 11, in a display apparatus according to an embodiment of the present disclosure, a branch network 153 of a gate driving circuit 150 may be disposed at a network line formation portion NFP which is defined (e.g., positioned) at one side of each of a plurality of pixels P disposed along a first direction X.

The network line formation portion NFP may include a plurality of line formation areas A1 to A4 which are parallel to the first direction X or parallel to a gate line GL. The network line formation portion NFP according to an embodiment may include first to fourth line formation areas A1 to A4. For example, the first line formation area A1 of the first to fourth line formation areas A1 to A4 may be closest to the gate line GL.

According to an embodiment, a network line NL and first to third control node lines Q, QBo, and QBe included in the branch network 153 may be respectively disposed at the first to fourth line formation areas A1 to A4. For example, the first control node line Q may be disposed at the first line formation area A1, the network line NL may be disposed at the second line formation area A2, the fourth control node line QBm may be disposed at the third line formation area A3, and the second control node line QBo may be disposed at the fourth line formation area A4. For example, the network line formation portion NFP may further include a fifth line formation area where the third control node line QBe is disposed. The fifth line formation area may be disposed between the third line formation area A3 and the fourth line formation area A4.

A plurality of pixels P disposed at one horizontal line may be divided (or classified) into first pixels P1, second pixels P2, and third pixels P3 based on the number of control node lines Q, QBo, and Qm and network lines NL disposed at the network line formation portion NFP or the branch network 153 of the gate driving circuit. For example, each of the first pixels (or first pixel group) P1, the second pixels (or second pixel group) P2, and the third pixels (or third pixel group) P3 may include a different number of network lines NL of a plurality of network lines NL. For example, the number of lines of the branch network 153 disposed at the network line formation portion NFP of each of the first pixels P1, the second pixels P2, and the third pixels P3 may differ.

In the branch network 153, each of the first and second control node lines Q and QBo may be disposed at all of the first pixels P1, the second pixels P2, and the third pixels P3. The fourth control node line Qm may be disposed at all of the second pixels P2 and the third pixels P3. The network line NL may be disposed at the third pixels P3.

According to an embodiment, the first pixels P1 may include the first and second control node lines Q and QBo respectively disposed at the first and fourth line formation areas A1 and A4. The second pixels P2 may include the first, third, and fourth control node lines Q, QBo, and Qm respectively disposed at the first, third, and fourth line formation areas A1, A3, and A4. The third pixels P3 may include the first, third, and fourth control node lines Q, QBo, and Qm and the network line NL respectively disposed at the first to fourth line formation areas A1 to A4.

The lines disposed at each of the first pixels P1, the second pixels P2, and the third pixels P3 and the number of these lines are not limited to the number of lines illustrated in FIG. 11. For example, when the branch network 153 includes z (where z is a natural number of 4 or more) number of lines, the network line formation portion NFP may include first to $z^{th}$ line formation areas. In this case, the first pixels P1 may include x (where x is a natural number less than z) number of lines disposed at x number of line formation areas of the first to $z^{th}$ line formation areas, the second pixels P2 may include y (where y is a natural number less than x) number of lines disposed at y number of line formation areas of the first to $z^{th}$ line formation areas, and the third pixels P3 may include z number of lines disposed at the first to $z^{th}$ line formation areas.

The network line formation portion NFP of each of the first pixels P1 and the second pixels P2 may include a line non-disposition area LUA (or an empty space) where the network line NL is not disposed. For example, the line non-disposition LUA at the first pixels P1 may be the second and third line formation areas A2 and A3. The line non-disposition LUA at the second pixels P2 may be the second line formation area A2.

In the display apparatus 10 according to an embodiment of the present disclosure, due to the line non-disposition area LUA of the network line formation portion NFP disposed at each of horizontal lines, a deviation of the number of lines of the branch network 153 crossing reference voltage lines RL may occur, and due to this, a deviation of a reference voltage supplied to the reference voltage lines RL or a deviation of sensing raw data sensed through the reference voltage lines RL may occur due to a line capacitance deviation between the reference voltage lines RL for each of the pixels P1, P2, and P3. For example, when a deviation of the sensing raw data sensed through the reference voltage lines RL occurs, the accuracy of subpixel-based sensing row data may be reduced, and sensing raw data corresponding to a characteristic change of a driving thin film transistor (TFT)

of each subpixel may not be accurately sensed. In order to prevent, reduce or minimize the line capacitance deviation between the reference voltage lines RL, the display apparatus 10 or the gate driving circuit 150 according to an embodiment of the present disclosure may further include an additional pattern portion 155. For example, the additional pattern portion 155 may be a compensation pattern portion, a dummy pattern portion, a capacitance compensation pattern part, an auxiliary pattern part, or a deviation compensation pattern part.

The additional pattern portion 155 may be disposed at the network line formation portion NFP to overlap the reference voltage lines RL respectively disposed at some of a plurality of pixels P. The additional pattern portion 155 may not be electrically coupled to each of a plurality of branch circuits 1511 to 151n.

The addition pattern portion 155 may be implemented to compensate for, reduce or minimize a deviation between line capacitances of the reference voltage lines RL disposed at the first pixels P1 and line capacitances of the reference voltage lines RL disposed at the third pixels P3 and may be implemented to compensate for, reduce or minimize a deviation between line capacitances of the reference voltage lines RL disposed at the second pixels P2 and line capacitances of the reference voltage lines RL disposed at the third pixels P3.

According to an embodiment, the additional pattern portion 155 may be implemented to have different sizes at each of the first pixels P1 and the second pixels P2. For example, the additional pattern portion 155 may overlap the reference voltage lines RL to have different sizes (or areas) at each of the first pixels P1 and the second pixels P2, based on an overlap area between the reference voltage lines RL and the branch network 153 at each of the third pixels P3. Therefore, in each of the first pixels P1 and the second pixels P2, a size of an overlap area (or a size of an overlap area) between the reference voltage line RL and each of the branch network 153 and the additional pattern portion 155 may be the same as a size of an overlap area between the reference voltage line RL and the branch network 153 at the third pixels P3.

According to an embodiment, the additional pattern portion 155 may be disposed at the line non-disposition area LUA of each of the first pixels P1 and the second pixels P2 to overlap the reference voltage line RL. For example, the additional pattern portion 155 may be implemented to overlap the reference voltage line RL and to have different sizes (or areas) at the line non-disposition area LUA of each of the first pixels P1 and the second pixels P2.

According to an embodiment, the additional pattern portion 155 may compensate for a line capacitance deviation between the reference voltage lines RL respectively disposed at the plurality of pixels P. For example, the additional pattern portion 155 may compensate for a deviation between line capacitances of the reference voltage lines RL disposed at each of the first pixels P1 and the second pixels P2 and line capacitances of the reference voltage lines RL disposed at the third pixels P3.

The additional pattern portion 155 according to an embodiment may include a first additional pattern 155a disposed at each of the first pixels P1, and a second additional pattern 155b disposed at each of the second pixels P2. For example, the first additional pattern 155a may be a first compensation pattern, a first dummy pattern portion, a first capacitance compensation pattern part, a first auxiliary pattern part, or a first deviation compensation pattern part. The second additional pattern 155b may be a second compensation pattern, a second dummy pattern portion, a second capacitance compensation pattern part, a second auxiliary pattern part, or a second deviation compensation pattern part.

Referring to FIGS. 11 and 12A, the first additional pattern 155a may be disposed at the line non-disposition area LUA of the network line formation portion NFP to overlap the reference voltage lines RL disposed at the first pixels P1. For example, the first additional pattern 155a may be disposed at the second and third line formation areas A2 and A3 between the first line formation area A1 and the fourth line formation area A4 to overlap the reference voltage lines RL.

The first additional pattern 155a may be electrically coupled to one of the lines Q and QBo disposed at adjacent line formation areas A1 and A4. The first additional pattern 155a according to an embodiment may extend or protrude from one of the lines Q and QBo disposed at the adjacent line formation areas A1 and A4 to overlap the reference voltage lines RL. As an embodiment, the first additional pattern 155a may extend or protrude toward the fourth line formation area A4 from the first control node line Q disposed at the first line formation area A1 to overlap the reference voltage lines RL. As another embodiment, the first additional pattern 155a may extend or protrude toward the first line formation area A1 from the second control node line QBo disposed at the fourth line formation area A4 to overlap the reference voltage lines RL.

The first additional pattern 155a may have a width which is wider than the reference voltage line RL, with respect to the first direction X. A size of an overlap area between the first additional pattern 155a and the reference voltage line RL of the first pixel P1 may be equal to or correspond to a size obtained by subtracting a size of an overlap area between the branch network 153 and the reference voltage line RL of the first pixel P1 from a size of an overlap area between the branch network 153 and the reference voltage line RL of the third pixel P3. Accordingly, the first additional pattern 155a may overlap the reference voltage line RL, and thus, may compensate for, reduce or minimize a deviation between line capacitances of the reference voltage lines RL disposed at the first pixels P1 and line capacitances of the reference voltage lines RL disposed at the third pixels P3.

Referring to FIGS. 11 and 12B, the second additional pattern 155b may be disposed at the line non-disposition area LUA of the network line formation portion NFP to overlap the reference voltage lines RL disposed at the second pixels P2. For example, the second additional pattern 155b may be disposed at the second line formation area A2 between the first line formation area A1 and the third line formation area A3 to overlap the reference voltage lines RL.

The second additional pattern 155b may have a size (or an area) which differs from the first additional pattern 155a. For example, the second additional pattern 155b may have a size (or an area) which is less than the first additional pattern 155a.

The second additional pattern 155b may be electrically coupled to one of the lines Q and Qm disposed at adjacent line formation areas A1 and A3. The second additional pattern 155b according to an embodiment may extend or protrude from one of the lines Q and Qm disposed at the adjacent line formation areas A1 and A3 to overlap the reference voltage lines RL. As an embodiment, the second additional pattern 155b may extend or protrude toward the third line formation area A3 from the first control node line Q disposed at the first line formation area A1 to overlap the reference voltage lines RL. As another embodiment, the second additional pattern 155b may extend or protrude toward the first line formation area A1 from the fourth control node line Qm disposed at the third line formation area A3 to overlap the reference voltage lines RL.

The second additional pattern 155b may have a width which is wider than the reference voltage line RL, with respect to the first direction X. A size of an overlap area between the second additional pattern 155b and the reference voltage line RL of the second pixel P2 may be equal to or correspond to a size obtained by subtracting a size of an overlap area between the branch network 153 and the reference voltage line RL of the second pixel P2 from a size of an overlap area between the branch network 153 and the reference voltage line RL of the third pixel P3. Accordingly, the second additional pattern 155b may overlap the reference voltage line RL, and thus, may compensate for, reduce or minimize a deviation between line capacitances of the reference voltage lines RL disposed at the second pixels P2 and line capacitances of the reference voltage lines RL disposed at the third pixels P3.

Referring to FIGS. 11 and 12A to 12C, a plurality of reference voltage lines RL may be disposed over a first surface 100a of a first substrate 100 and may be covered by at least one buffer layer 101 disposed over the first substrate 100.

A branch network 153 and an additional pattern 155 may be disposed over a buffer layer 101. Each of the branch network 153 and the additional pattern 155 may be disposed over the buffer layer 101 with a gate insulation layer 102 therebetween. Also, the branch network 153 and the additional pattern 155 may be covered by an interlayer insulation layer 103, a passivation layer 104, and a planarization layer 105 disposed over the first substrate 100. For example, the passivation layer 104 may be omitted.

According to an embodiments of the present disclosure, each of the first pixels P1 and the second pixels P2 of the first pixels P1, the second pixels P2, and the third pixels P3 disposed at one horizontal line may include an additional pattern 155 disposed at a line non-disposition area LUA of a network line formation portion NFP, and thus, may compensate for, reduce or minimize a line capacitance deviation between the reference voltage lines RL disposed at each of the first pixels P1, the second pixels P2, and the third pixels P3. Therefore, a deviation of a reference voltage supplied to corresponding pixels P through the reference voltage lines RL may be compensated for, reduce or minimized, and a deviation of subpixel-based sensing raw data caused by a line capacitance deviation between the reference voltage lines RL may be reduced or minimized, whereby the accuracy of subpixel-based sensing raw data may be enhanced. Accordingly, in an external sensing mode, the display apparatus 10 according to an embodiment of the present disclosure may more accurately sense sensing raw data corresponding to a characteristic change of a driving TFT of each subpixel.

Figure 13:
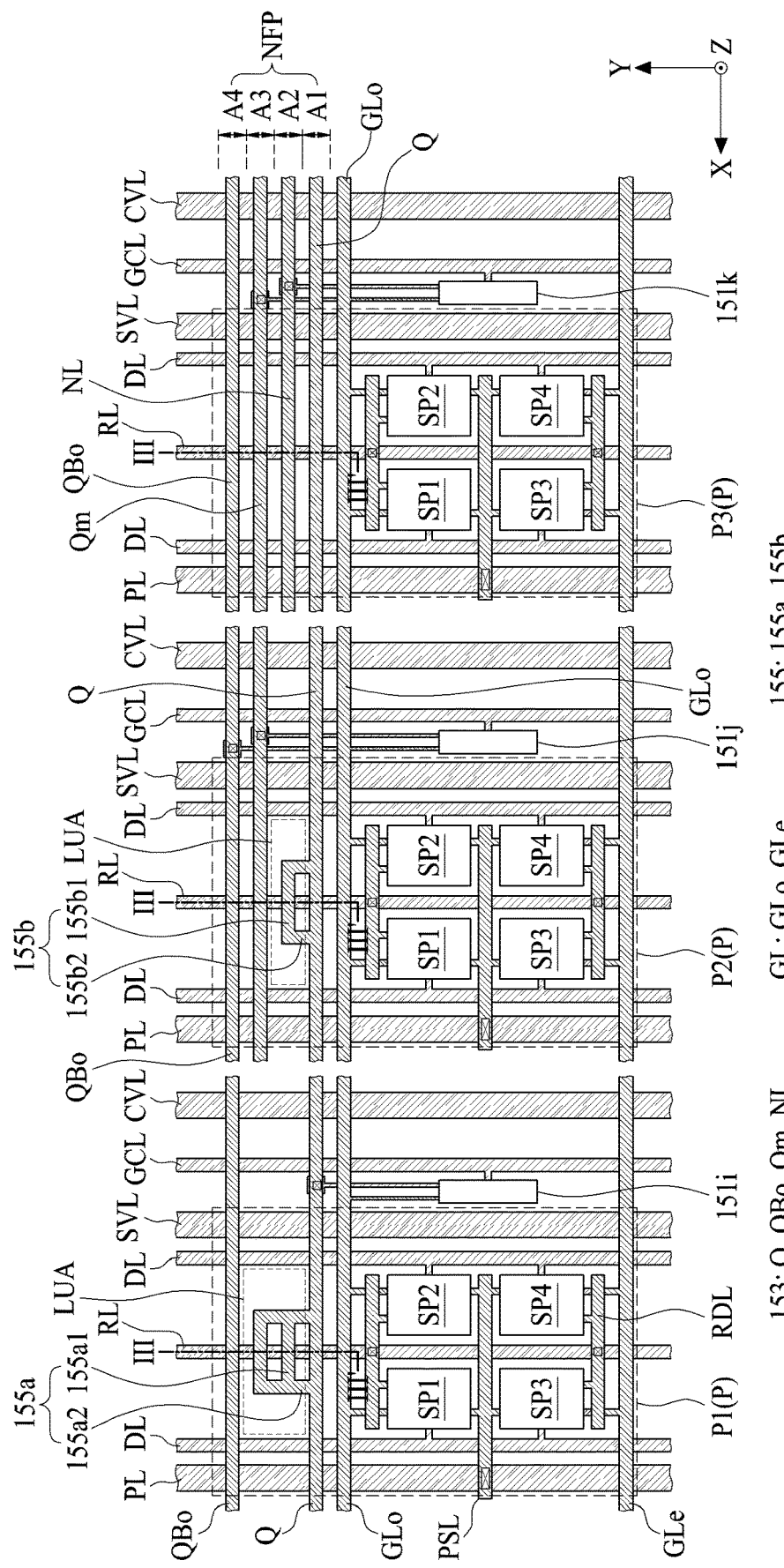
FIG. 13 is a diagram illustrating a branch network and an additional pattern according to another embodiment illustrated in FIGS. 5 and 8 to 10.

FIG. 13 is a diagram illustrating a branch network and an additional pattern according to another embodiment of the present disclosure illustrated in FIGS. 5 and 8 to 10 and illustrates an embodiment implemented by modifying the additional pattern illustrated in FIG. 11. In the following description, therefore, repeated descriptions of elements other than an additional pattern and relevant elements are omitted. A cross-sectional view taken along line III-III' illustrated in FIG. 12C is illustrated in FIG. 13.

Referring to FIGS. 12C and 13, an additional pattern 155 according to another embodiment of the present disclosure may include a first additional pattern 155a disposed at each of the first pixels P1 and a second additional pattern 155b disposed at each of the second pixels P2.

The first additional pattern 155a may include a plurality of first additional pattern lines 155a1. The first additional pattern 155a according to an embodiment of the present disclosure may include two first additional pattern lines 155a1.

Each of the two first additional pattern lines 155a1 may be disposed at each of second and third line formation areas A2 and A3 at a line non-disposition area LUA of a network line formation portion NFP to overlap reference voltage lines RL disposed at the first pixels P1. Each of the two first additional pattern lines 155a1 may have the same line width as each of other lines Q, QBo, Qm, and NL disposed at the network line formation portion NFP to overlap the reference voltage line RL. Each of the two first additional pattern lines 155a1 may be spaced apart from each of a first control node line Q and a second control node line QBo and may be spaced apart therefrom along a second direction Y. Therefore, each of the two first additional pattern lines 155a1 may overlap the reference voltage line RL, and thus, may compensate for, reduce or minimize a deviation between line capacitances of the reference voltage lines RL disposed at the first pixels P1 and line capacitances of the reference voltage lines RL disposed at the third pixels P3.

The first additional pattern 155a may further include a plurality of first connection patterns 155a2. The first additional pattern 155a according to an embodiment of the present disclosure may further include two first connection patterns 155a2.

The two first connection patterns 155a2 may electrically connect each of the two first additional pattern lines 155a1 to one of the lines Q and QBo disposed at adjacent line formation areas A1 and A4. The two first connection patterns 155a2 may not overlap the reference voltage lines RL. As an embodiment, the two first connection patterns 155a2 may protrude or extend toward the fourth line formation area A4 from the first control node line Q disposed at the first line formation area A1 and may be electrically coupled to both ends of each of the two first additional pattern lines 155a1. As another embodiment, the two first connection patterns 155a2 may protrude or extend toward the first line formation area A1 from the second control node line QBo disposed at the fourth line formation area A4 and may be electrically coupled to the both ends of each of the two first additional pattern lines 155a1. Accordingly, each of the two first additional pattern lines 155a1 may be electrically coupled to the first control node line Q (or the second control node line QBo) through the two first connection patterns 155a2, and thus, may have an equivalent potential with the first control node line Q (or the second control node line QBo).

The second additional pattern 155b may further include at least one second additional pattern 155b1. For example, the second additional pattern 155b may include one second additional pattern 155b1.

The one second additional pattern line 155b1 may be disposed at a second line formation area A2 in a line non-disposition area LUA of a network line formation portion NFP to overlap reference voltage lines RL disposed at the second pixels P2. The one first additional pattern line 155b1 may have the same line width as each of other lines Q, QBo, Qm, and NL disposed at the network line formation portion NFP to overlap the reference voltage line RL. The one second additional pattern lines 155b1 may be spaced apart from each of a first control node line Q and a second control node line QBo. Therefore, the one second additional pattern line 155b1 may overlap the reference voltage line RL, and thus, may compensate for, reduce or minimize a deviation between line capacitances of the reference voltage lines RL disposed at the second pixels P2 and line capacitances of the reference voltage lines RL disposed at the third pixels P3.

The second additional pattern 155b may further include two second connection patterns 155b2.

The two second connection patterns 155a2 may electrically connect the one second additional pattern line 155b1 to one of the lines Q and Qm disposed at adjacent line formation areas A1 and A3. The two second connection patterns 155b2 may not overlap the reference voltage lines RL. As an embodiment, the two second connection patterns 155b2 may protrude or extend toward the third line formation area A3 from the first control node line Q disposed at the first line formation area A1 and may be electrically coupled to both ends of each of the two second additional pattern lines 155b1. As another embodiment, the two second connection patterns 155b2 may protrude or extend toward the first line formation area A1 from the third control node line Qm disposed at the third line formation area A3 and may be electrically coupled to the both ends of each of the two second additional pattern lines 155b1. Accordingly, one second additional pattern line 155b1 may be electrically coupled to the first control node line Q (or the fourth control node line Qm) through the two second connection patterns 155b2, and thus, may have an equivalent potential with the first control node line Q (or the fourth control node line Qm).

Additionally, in FIG. 13, it has been described that the additional pattern 155 includes the first additional pattern 155a including two first additional pattern lines 155a1 disposed at the first pixel P1 and the second additional pattern 155b including two second additional pattern lines 155b1 disposed at the second pixel P2, but embodiments of the present disclosure are not limited thereto. For example, the first additional pattern 155a of the additional pattern 155 may include two or more first additional pattern lines 155a1 so that an overlap area between the network line and the reference voltage line RL at the first pixels P1 is the same as an overlap area between the network line and the reference voltage line RL at the third pixels P3. Likewise, the second additional pattern 155b of the additional pattern 155 may include one or more second additional pattern lines 155a1 which is less than the number of first additional pattern lines 155a1, so that an overlap area between the network line and the reference voltage line RL at the second pixels P2 is the same as the overlap area between the network line and the reference voltage line RL at the third pixels P3.

Figure 14:
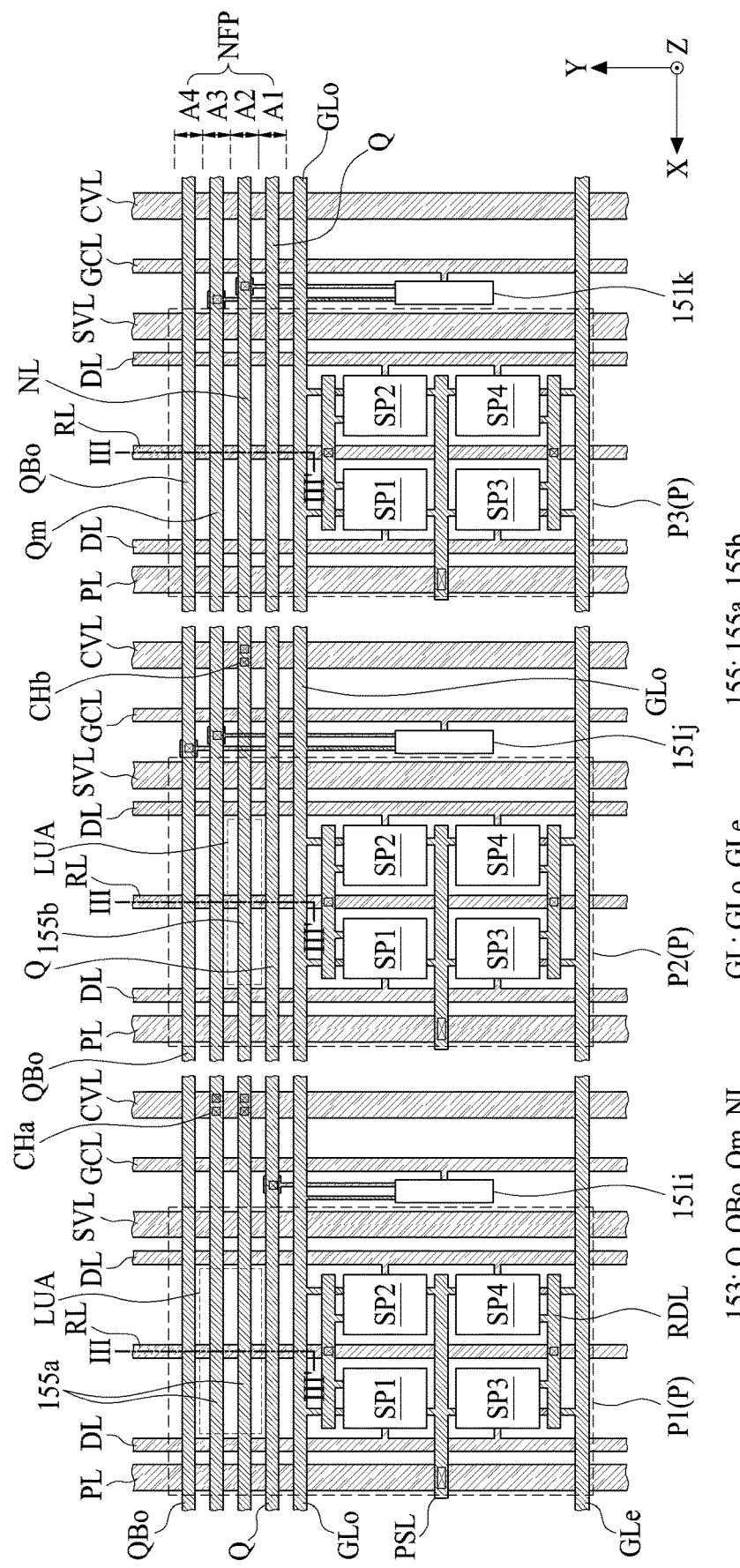
FIG. 14 is a diagram illustrating a branch network and an additional pattern according to another embodiment illustrated in FIGS. 5 and 8 to 10.

FIG. 14 is a diagram illustrating a branch network and an additional pattern according to another embodiment of the present disclosure illustrated in FIGS. 5 and 8 to 10 and illustrates an embodiment implemented by modifying the additional pattern illustrated in FIG. 11. In the following description, therefore, repeated descriptions of elements other than an additional pattern and relevant elements are omitted. A cross-sectional view taken along line III-III' illustrated in FIG. 12C is illustrated in FIG. 14.

Referring to FIGS. 12C and 14, an additional pattern 155 according to another embodiment of the present disclosure may include two first additional patterns 155a disposed at each of the first pixels P1 and one second additional pattern 155b disposed at each of the second pixels P2.

Each of the two first additional patterns 155a may be disposed at each of second and third line formation areas A2 and A3 among a line non-disposition area LUA of a network line formation portion NFP to overlap reference voltage lines RL disposed at the first pixels P1. Each of the two first additional patterns 155a may have the same line width and size as those of each of a fourth control node line Qm and a network line NL disposed at the second and third line formation areas A2 and A3 of the network line formation portion NFP to overlap the reference voltage line RL. Each of the two first additional patterns 155a may be spaced apart from each of a first control node line Q and a second control node line QBo and may be spaced apart therefrom along a second direction Y. Therefore, each of two first additional pattern lines 155a1 may overlap the reference voltage line RL, and thus, may compensate for, reduce or minimize a deviation between line capacitances of the reference voltage lines RL disposed at the first pixels P1 and line capacitances of the reference voltage lines RL disposed at the third pixels P3.

Each of the two first additional patterns 155a may be electrically coupled to a pixel common voltage line CVL disposed at the first pixels P1. For example, each of the two first additional patterns 155a may be electrically coupled to the pixel common voltage line CVL through a first pattern contact hole CHa passing through a gate insulation layer 102 and a buffer layer 103 covering the pixel common voltage line CVL disposed at the first pixels P1. Accordingly, each of the two first additional patterns 155a may have an equivalent potential with the pixel common voltage line CVL.

Each of the two second additional patterns 155b may be disposed at each of the second line formation area A2 among the line non-disposition area LUA of the network line formation portion NFP to overlap reference voltage lines RL disposed at the second pixels P2. The one second additional patterns 155b may have the same line width and size as those of the network line NL disposed at the second line formation area A2 of the network line formation portion NFP to overlap the reference voltage line RL. The one second additional pattern 155b may be spaced apart from each of the first control node line Q and the fourth control node line Qm. Therefore, each of the one second additional pattern line 155b may overlap the reference voltage line RL, and thus, may compensate for, reduce or minimize a deviation between line capacitances of the reference voltage lines RL disposed at the second pixels P2 and line capacitances of the reference voltage lines RL disposed at the third pixels P3.

The one second additional pattern 155b may be electrically coupled to the pixel common voltage line CVL disposed at the second pixels P2. For example, the one first additional pattern 155b may be electrically coupled to the pixel common voltage line CVL through a second pattern contact hole CHb passing through a gate insulation layer 102 and a buffer layer 103 covering the pixel common voltage line CVL disposed at the second pixels P2. Accordingly, the one second additional pattern 155b may have an equivalent potential with the pixel common voltage line CVL.

Moreover, according to an embodiments of the present disclosure, as the additional pattern 155 is electrically coupled to the pixel common voltage line CVL, a line resistance of the pixel common voltage line CVL may decrease, and thus, the voltage drop of a pixel common voltage supplied to the pixel common voltage line CVL may be reduced or minimized.

Figure 15:
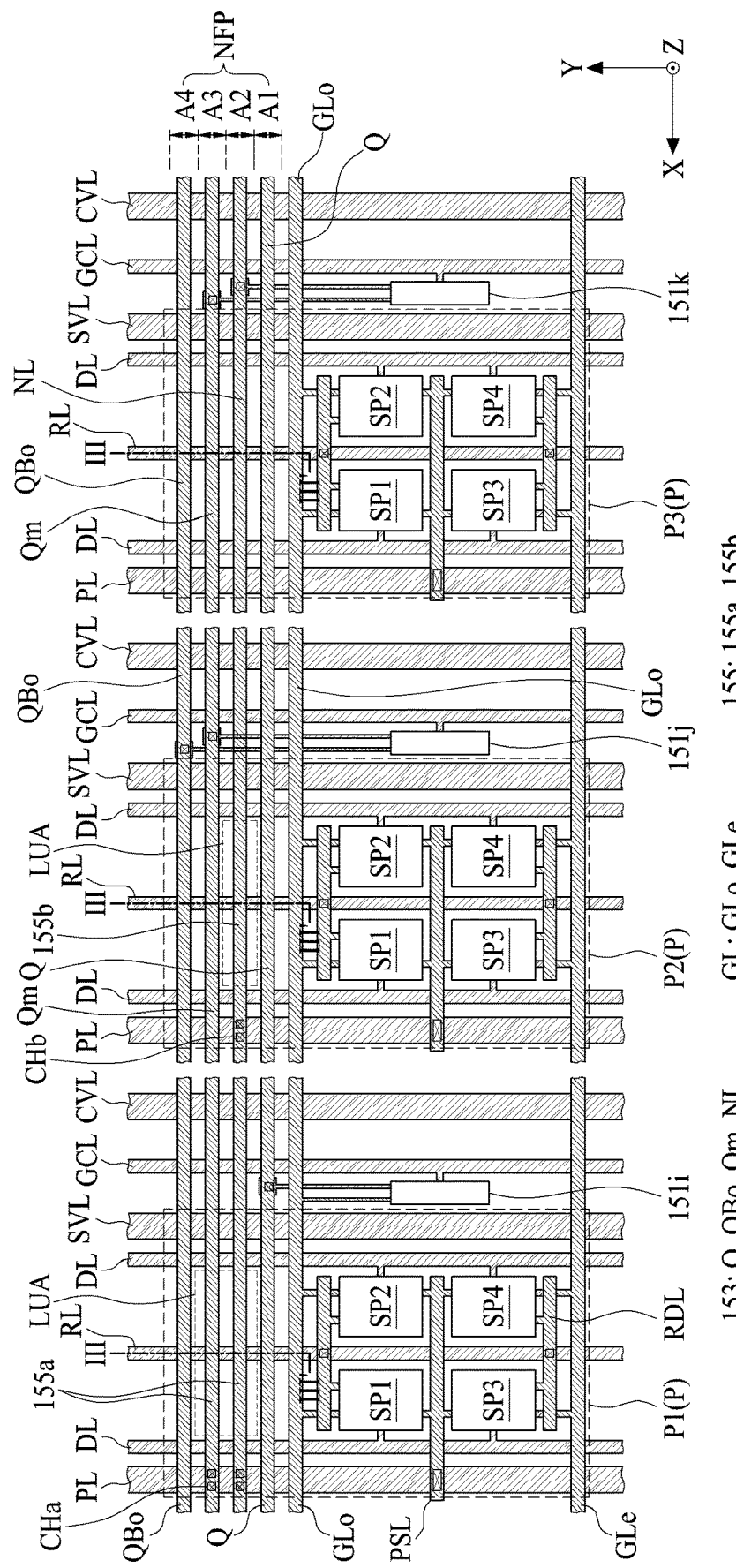
FIG. 15 is a diagram illustrating a branch network and an additional pattern according to another embodiment illustrated in FIGS. 5 and 8 to 10.

Additionally, in FIG. 14, it has been described that the additional pattern 155 is electrically coupled to the pixel common voltage line CVL, but embodiments of the present disclosure are not limited thereto. As illustrated in FIG. 15, an additional pattern 155 may be electrically coupled to a pixel driving power line PL.

Referring to FIG. 15, each of two first additional patterns 155a may be electrically coupled to a pixel driving power line PL disposed at the first pixels P1. For example, each of the two first additional patterns 155a may be electrically coupled to the pixel driving power line PL through a first pattern contact hole CHa passing through a gate insulation layer 102 and a buffer layer 103 covering the pixel driving power line PL disposed at the first pixels P1. Accordingly, each of the two first additional patterns 155a may have an equivalent potential with the pixel driving power line PL.

One second additional pattern 155b may be electrically coupled to a pixel driving power line PL disposed at the second pixels P2. For example, the one first additional pattern 155b may be electrically coupled to the pixel driving power line PL through a second pattern contact hole CHb passing through a gate insulation layer 102 and a buffer layer 103 covering the pixel driving power line PL disposed at the second pixels P2. Accordingly, the one second additional pattern 155b may have an equivalent potential with the pixel driving power line PL.

Therefore, according to an embodiments of the present disclosure, as the additional pattern 155 is electrically coupled to the pixel driving power line PL, a line resistance of the pixel driving power line PL may decrease, and thus, the voltage drop of a pixel common voltage supplied to the pixel driving power line PL may be reduced or minimized.

Moreover, in FIGS. 14 and 15, it has been described that the additional pattern 155 includes the two first additional patterns 155a disposed at the first pixel P1 and the one second additional pattern 155b disposed at the second pixel P2, but embodiments of the present disclosure are not limited thereto. For example, the additional pattern 155 may include two or more first additional patterns 155a so that an overlap area between a network line and a reference voltage line RL at the first pixels P1 is the same as an overlap area between a network line and a reference voltage line RL at the third pixels P3. Likewise, the additional pattern 155 may include one or more second additional patterns 155b which is less than the number of first additional patterns 155a, so that an overlap area between a network line and a reference voltage line RL at the second pixels P2 is the same as the overlap area between the network line and the reference voltage line RL at the third pixels P3.

Figure 16:
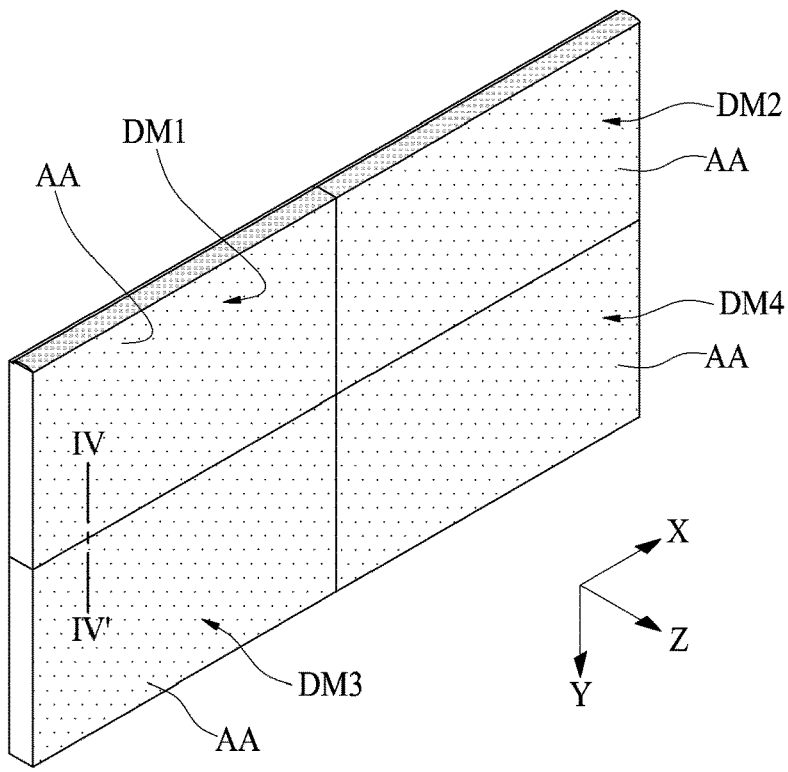
FIG. 16 is a diagram illustrating a multi-screen display apparatus according to an embodiment of the present disclosure.
Figure 17:
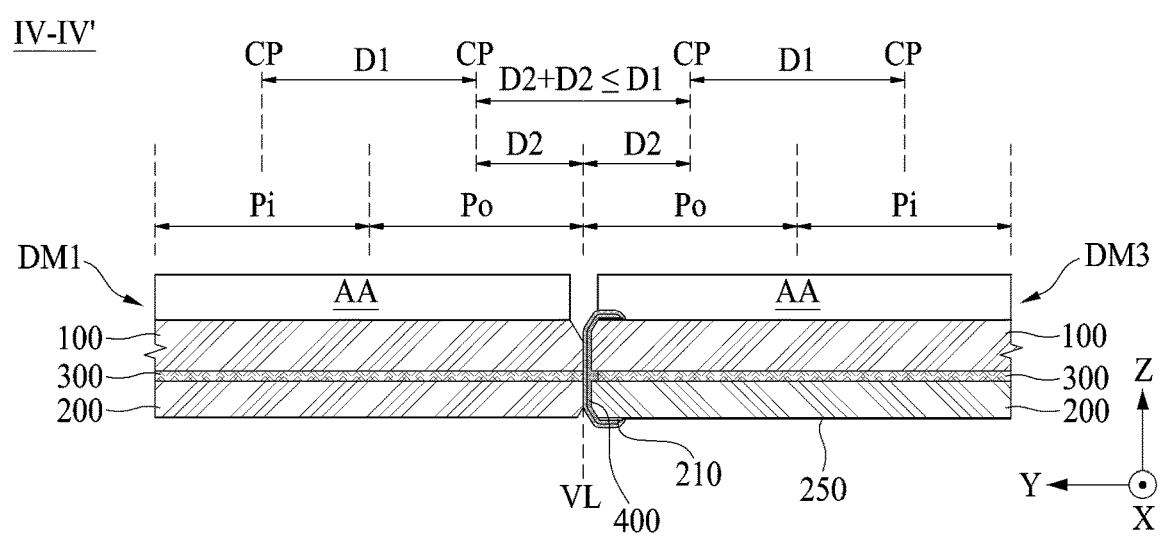
FIG. 17 is a cross-sectional view taken along line IV-IV' illustrated in FIG. 16.

FIG. 16 is a diagram illustrating a multi-screen display apparatus according to an embodiment of the present disclosure, and FIG. 17 is a cross-sectional view taken along line IV-IV' illustrated in FIG. 16. FIGS. 16 and 17 illustrate a multi-screen display apparatus implemented by tiling the light emitting display apparatus according to another embodiment of the present disclosure illustrated in FIGS. 1 to 15.

Referring to FIGS. 16 and 17, the multi-screen display apparatus (or a tiling light emitting display apparatus) according to an embodiment of the present disclosure may include a plurality of display devices DM1 to DM4.

The plurality of display devices DM1 to DM4 may each display an individual image or may divisionally display one image. Each of the plurality of display devices DM1 to DM4 may include the light emitting display apparatus according to an embodiment of the present disclosure illustrated in FIGS. 1 to 15, and thus, their repetitive descriptions are omitted or will be briefly given.

The plurality of display devices DM1 to DM4 may be tiled on a separate tiling frame to contact each other at a lateral surface thereof. For example, the plurality of display devices DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display devices DM1 to DM4 may not include a bezel area (or a non-display portion) surrounding all of a display area AA where an image is displayed, and may have an air-bezel structure where the display area AA is surrounded by air. For example, in each of the plurality of display devices DM1 to DM4, all of a first surface of a first substrate 100 may be implemented as the display area AA.

According to an embodiment of the present disclosure, in each of the plurality of display devices DM1 to DM4, a second interval D2 between a center portion CP of an outermost pixel Po and an outermost outer surface VL of the first substrate 100 may be implemented to be half or less of a first interval D1 (or a pixel pitch) between adjacent pixels. Accordingly, in two adjacent display devices DM1 to DM4 coupled to (or contacting) each other at lateral surfaces thereof along the first direction X and the second direction Y based on a lateral coupling manner, an interval "D2+D2" between adjacent outermost pixel areas PAo may be equal to or less than the first interval D1 between two adjacent pixels. Referring to FIG. 17, in first and third display devices DM1 and DM3 coupled to (or contacting) each other at lateral surfaces thereof along the second direction Y, the interval "D2+D2" between a center portion CP of an outermost pixel Po of the first display device DM1 and a center portion CP of an outermost pixel Po of the third display device DM3 may be equal to or less than the first interval D1 (or a pixel pitch) between two adjacent pixels disposed at each of the first and third display devices DM1 and DM3.

Therefore, the interval "D2+D2" between center portions CP of outermost pixels Po of two adjacent display devices DM1 to DM4 coupled to (or contacting) each other at lateral surfaces thereof along the first direction X and the second direction Y may be equal to or less than the first interval D1 between two adjacent pixels disposed at each of the display devices DM1 to DM4, and thus, there may be no seam or boundary portion between two adjacent display devices DM1 to DM4, whereby there may be no dark area caused by a boundary portion provided between the display devices DM1 to DM4. As a result, the image displayed on the multi-screen display apparatus in which the plurality of display devices DM1, DM2, DM3, and DM4 are tiled in an N×M form may be displayed continuously without a sense of disconnection (or discontinuity) at boundary portion between the plurality of display devices DM1, DM2, DM3, and DM4.

In FIGS. 15 and 16, it is illustrated that the plurality of display devices DM1 to DM4 are tiled in a 2×2 form, but embodiments of the present disclosure are not limited thereto, and the plurality of display devices DM1 to DM4 may be tiled in an x×1 form, a 1×y form, or an x×y form. For example, in the x×1 form, x may be a natural number greater than or equal to 2, in the 1×y form, y may be a natural number greater than or equal to 2, and in the x×y form, x and y may be natural numbers greater than or equal to 2 and may be equal to or different from each other. For example, in the x×y form, x may be a natural number greater than or equal to 2 and may be equal to y, or x and y may be natural numbers greater than or equal to 2 with y greater or less than x.

As described above, when display area AA of each of the plurality of display devices DM1 to DM4 is one screen and displays one image, a multi-screen display apparatus according to an embodiment of the present disclosure may display an image which is not disconnected and is continuous at a boundary portion between the plurality of display devices DM1 to DM4, and thus, the immersion of a viewer watching an image displayed by the multi-screen display apparatus may be enhanced.

A display apparatus and multi-screen display apparatus including the same according to an embodiment of the present disclosure will be described below.

A display apparatus according to an embodiment of the present disclosure may comprise a display area configured to include a plurality of pixels arranged along a first direction and a second direction crossing the first direction over a substrate, a plurality of gate lines, a plurality of data lines, and a plurality of reference voltage lines disposed at the display area and coupled to the plurality of pixels, and a gate driving circuit configured to include a plurality of stage circuit units disposed at the display area and coupled to each of the plurality of gate lines, the plurality of stage circuit units may comprise a plurality of branch circuits divisionally disposed between the plurality of pixels along the first direction, a branch network disposed at a network line formation portion defined (e.g., positioned) at one side of each of the plurality of pixels disposed along the first direction, the branch network including a plurality of control node lines and a plurality of network lines selectively coupled to the plurality of branch circuits, and an additional pattern portion disposed at the network line formation portion to overlap a reference voltage line disposed at each of some of the plurality of pixels.

According to some embodiments of the present disclosure, the plurality of pixels may be divided into first to third pixels, the number of lines of the branch network disposed at the network line formation portion of each of the first and second pixels may be less than the number of lines of the branch network disposed at the network line formation portion of the third pixel, and the additional pattern portion may be disposed at the network line formation portion of each of the first and second pixels.

According to some embodiments of the present disclosure, a size of an overlap area between the reference voltage line and an additional pattern portion disposed at the first pixel may be different from a size of an overlap area between the reference voltage line and an additional pattern portion disposed at the second pixel.

According to some embodiments of the present disclosure, the number of lines of the branch network disposed at the network line formation portion of the first pixel may be less than the number of lines of the branch network disposed at the network line formation portion of the second pixel, and a size of an overlap area between the reference voltage line and an additional pattern portion disposed at the first pixel may be greater than a size of an overlap area between the reference voltage line and an additional pattern portion disposed at the second pixel.

According to some embodiments of the present disclosure, the network line formation portion of each of the first and second pixels may comprise a line non-disposition area, and the additional pattern portion may be disposed at the line non-disposition area of each of the first pixel and the second pixel to overlap reference voltage lines disposed at each of the first pixel and the second pixel.

According to some embodiments of the present disclosure, the additional pattern portion may comprise a first additional pattern disposed at the line non-disposition area of the first pixel, and a second additional pattern disposed at the line non-disposition area of the second pixel to have a size which differs from a size of the first additional pattern.

According to some embodiments of the present disclosure, the second additional pattern may have a size which is less than a size of the first additional pattern.

According to some embodiments of the present disclosure, the first additional pattern may be configured to protrude from one of the plurality of control node lines disposed at the first pixel, and the second additional pattern be configured to protrude from one of the plurality of control node lines disposed at the second pixel.

According to some embodiments of the present disclosure, the first additional pattern may comprise a plurality of first additional pattern lines crossing a reference voltage line disposed at the first pixel, and the second additional pattern may comprise at least one second additional pattern line crossing a reference voltage line disposed at the second pixel.

According to some embodiments of the present disclosure, the first additional pattern may further comprise a plurality of first connection patterns configured to electrically connect the plurality of first additional pattern lines to one of the plurality of control node lines disposed at the first pixel, and the second additional pattern may further comprise a plurality of second connection patterns configured to electrically connect the at least one second additional pattern line to one of the plurality of control node lines disposed at the second pixel.

According to some embodiments of the present disclosure, the network line formation portion may comprise first to $z^{th}$ line formation areas, the first pixel may comprise x (where x is a natural number less than z) number of lines disposed at x number of line formation areas of the first to $z^{th}$ line formation areas, the second pixel may comprise y (where y is a natural number less than x) number of lines disposed at y number of line formation areas of the first to $z^{th}$ line formation areas, the third pixel may comprise z number of lines disposed at the first to $z^{th}$ line formation areas, each of the first pixel and the second pixel may comprise a line non-disposition area, and the additional pattern portion may be disposed at the line non-disposition area of each of the first pixel and the second pixel to overlap the reference voltage line disposed at each of the first pixel and the second pixel.

According to some embodiments of the present disclosure, a size of an overlap area between the additional pattern and the reference voltage line disposed at the first pixel may correspond to a size obtained by subtracting a size of an overlap area between the branch network and the reference voltage line disposed at the first pixel from a size of an overlap area between the branch network and the reference voltage line disposed at the third pixel, and a size of an overlap area between the additional pattern and the reference voltage line disposed at the second pixel may correspond to a size obtained by subtracting a size of an overlap area between the branch network and the reference voltage line disposed at the second pixel from the size of the overlap area between the branch network and the reference voltage line disposed at the third pixel.

According to some embodiments of the present disclosure, the display apparatus may further comprise a plurality of pixel driving power lines and a plurality of pixel common voltage lines disposed at the display area and coupled to the plurality of pixels, the lines of the branch network may cross the plurality of reference voltage lines, the plurality of pixel driving power lines, and the plurality of pixel common voltage lines, and the additional pattern portion may comprise a plurality of first additional patterns crossing the plurality of data lines, the reference voltage line, the pixel driving power line, and the pixel common voltage line disposed at the line non-disposition area of the first pixel and disposed at the first pixel, and a plurality of second additional patterns crossing the plurality of data lines, the reference voltage line, the pixel driving power line, and the pixel common voltage line disposed at the line non-disposition area of the second pixel and disposed at the second pixel.

According to some embodiments of the present disclosure, each of the plurality of first additional patterns may be electrically coupled to the pixel driving power line or the pixel common voltage line disposed at the first pixel, and each of the plurality of second additional patterns may be electrically coupled to the pixel driving power line or the pixel common voltage line disposed at the second pixel.

According to some embodiments of the present disclosure, the display apparatus may further comprise a buffer layer covering the plurality of data lines, the plurality of reference voltage lines, the plurality of pixel driving power lines, and the plurality of pixel common voltage lines disposed over the substrate, a gate insulation layer disposed between the buffer layer and each of the plurality of gate lines, the lines of the branch network, and the compensation pattern portion, and an interlayer insulation layer covering the plurality of gate lines, the lines of the branch network, and the compensation pattern portion disposed over the buffer layer, each of the plurality of first additional patterns and the at least one second additional pattern may be electrically coupled to the pixel driving power line or the pixel common voltage line through a pattern contact hole passing through the gate insulation layer and the buffer layer.

According to some embodiments of the present disclosure, a size of the display area may be the same as a size of the substrate.

According to some embodiments of the present disclosure, the display apparatus may further comprise a first pad part including a plurality of first pads disposed at one periphery portion of the substrate, a second pad part including a plurality of second pads overlapping the plurality of first pads, and a routing portion including a plurality of routing lines disposed at one lateral surface of the substrate to respectively connect the plurality of first pads to the plurality of second pads.

According to some embodiments of the present disclosure, the display apparatus may further comprise a first pad part including a plurality of first pads disposed at one periphery portion of the substrate, a wiring substrate including a second pad part including a plurality of second pads overlapping the plurality of first pads, a coupling member disposed between the substrate and the wiring substrate, and a routing portion including a plurality of routing lines disposed at one lateral surface of each of the wiring substrate and the substrate to respectively connect the plurality of first pads to the plurality of second pads.

A multi-screen display apparatus according to some embodiments of the present disclosure may comprise a plurality of display devices disposed along at least one direction of a first direction and a second direction crossing the first direction, each of the plurality of display devices may comprise a display apparatus, and the display apparatus may comprise a display area configured to include a plurality of pixels arranged along a first direction and a second direction crossing the first direction over a substrate, a plurality of gate lines, a plurality of data lines, and a plurality of reference voltage lines disposed at the display area and coupled to the plurality of pixels, and a gate driving circuit configured to include a plurality of stage circuit units disposed at the display area and coupled to each of the plurality of gate lines, the plurality of stage circuit units may comprise a plurality of branch circuits divisionally disposed between the plurality of pixels along the first direction, a branch network disposed at a network line formation portion defined (e.g., positioned) at one side of each of the plurality of pixels disposed along the first direction, the branch network including a plurality of control node lines and a plurality of network lines selectively coupled to the plurality of branch circuits, and an additional pattern portion disposed at the network line formation portion to overlap a reference voltage line disposed at each of some of the plurality of pixels.

According to some embodiments of the present disclosure, in each of the plurality of display devices, the plurality of pixels may be arranged to have a pixel pitch along the first direction and the second direction, the pixel pitch may be a distance between center portions of adjacent pixels along the first direction and the second direction, and in a first display device and a second display device adjacent along the first direction and the second direction, a distance between a center portion of an outermost pixel of the first display device and a center portion of an outermost pixel of the second display device may be less than or equal to the pixel pitch.

The display apparatus according to the present disclosure may be applied to all electronic devices including a display panel. For example, the display apparatus according to the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a display area including a plurality of pixels arranged along a first direction and a second direction crossing the first direction over a substrate;
a plurality of gate lines, a plurality of data lines, and a plurality of reference voltage lines disposed at the display area and coupled to the plurality of pixels; and
a gate driving circuit including a plurality of stage circuit units disposed at the display area and coupled to each of the plurality of gate lines,
wherein the plurality of stage circuit units includes:
   a plurality of branch circuits divisionally disposed between the plurality of pixels along the first direction;
   a branch network disposed at a network line formation portion positioned at one side of each of the plurality of pixels disposed along the first direction, the branch network including a plurality of control node lines and a plurality of network lines selectively coupled to the plurality of branch circuits; and
   an additional pattern portion disposed at the network line formation portion to overlap a reference voltage line disposed at each of some of the plurality of pixels;
wherein a size of the display area is the same as a size of the substrate.

2. The display apparatus of claim 1, further comprising:
a first pad part including a plurality of first pads disposed at one periphery portion of the substrate;
a second pad part including a plurality of second pads overlapping the plurality of first pads; and
a routing portion including a plurality of routing lines disposed at one lateral surface of the substrate to respectively connect the plurality of first pads to the plurality of second pads.

3. The display apparatus of claim 1, further comprising:
a first pad part including a plurality of first pads disposed at one periphery portion of the substrate;
a wiring substrate including a second pad part including a plurality of second pads overlapping the plurality of first pads;
a coupling member disposed between the substrate and the wiring substrate; and
a routing portion including a plurality of routing lines disposed at one lateral surface of each of the wiring substrate and the substrate to respectively connect the plurality of first pads to the plurality of second pads.

4. A display apparatus, comprising:
a display area including a plurality of pixels arranged along a first direction and a second direction crossing the first direction over a substrate;
a plurality of gate lines, a plurality of data lines, and a plurality of reference voltage lines disposed at the display area and coupled to the plurality of pixels; and
a gate driving circuit including a plurality of stage circuit units disposed at the display area and coupled to each of the plurality of gate lines,
wherein the plurality of stage circuit units includes:
   a plurality of branch circuits divisionally disposed between the plurality of pixels along the first direction;
   a branch network disposed at a network line formation portion positioned at one side of each of the plurality of pixels disposed along the first direction, the branch network including a plurality of control node lines and a plurality of network lines selectively coupled to the plurality of branch circuits; and
   an additional pattern portion disposed at the network line formation portion to overlap a reference voltage line disposed at each of some of the plurality of pixels;
wherein the plurality of pixels includes first pixels, second pixels and third pixels,
wherein a number of lines of the branch network disposed at the network line formation portion of each of the first and second pixels is less than a number of lines of the branch network disposed at the network line formation portion of the third pixel, and
wherein the additional pattern portion is disposed at the network line formation portion of each of the first and second pixels.

5. The display apparatus of claim 4, wherein a size of an overlap area between the reference voltage line and an additional pattern portion disposed at the first pixel differs from a size of an overlap area between the reference voltage line and an additional pattern portion disposed at the second pixel.

6. The display apparatus of claim 4,
wherein the number of lines of the branch network disposed at the network line formation portion of the first pixel is less than the number of lines of the branch network disposed at the network line formation portion of the second pixel, and
wherein a size of an overlap area between the reference voltage line and an additional pattern portion disposed at the first pixel is greater than a size of an overlap area between the reference voltage line and an additional pattern portion disposed at the second pixel.

7. The display apparatus of claim 4,
wherein the network line formation portion of each of the first and second pixels comprises a line non-disposition area, and
wherein the additional pattern portion is disposed at the line non-disposition area of each of the first pixel and the second pixel to overlap reference voltage lines disposed at each of the first pixel and the second pixel.

8. The display apparatus of claim 7, wherein the additional pattern portion comprises:
a first additional pattern disposed at the line non-disposition area of the first pixel; and
a second additional pattern disposed at the line non-disposition area of the second pixel and having a size which differs from a size of the first additional pattern.

9. The display apparatus of claim 8, wherein the second additional pattern has a size which is smaller than a size of the first additional pattern.

10. The display apparatus of claim 8,
wherein the first additional pattern is configured to protrude from one of the plurality of control node lines disposed at the first pixel, and
wherein the second additional pattern is configured to protrude from one of the plurality of control node lines disposed at the second pixel.

11. The display apparatus of claim 8,
wherein the first additional pattern comprises a plurality of first additional pattern lines crossing a reference voltage line disposed at the first pixel, and
wherein the second additional pattern comprises at least one second additional pattern line crossing a reference voltage line disposed at the second pixel.

12. The display apparatus of claim 11,
wherein the first additional pattern further comprises a plurality of first connection patterns configured to electrically connect the plurality of first additional pattern lines to one of the plurality of control node lines disposed at the first pixel, and
wherein the second additional pattern further comprises a plurality of second connection patterns configured to electrically connect the at least one second additional pattern line to one of the plurality of control node lines disposed at the second pixel.

13. The display apparatus of claim 4,
wherein the network line formation portion comprises first to $z^{th}$ line formation areas,
wherein the first pixel comprises x number of lines disposed at x number of line formation areas of the first to $z^{th}$ line formation areas, x being a natural number less than z,
wherein the second pixel comprises y number of lines disposed at y number of line formation areas of the first to $z^{th}$ line formation areas, y being a natural number less than x,
wherein the third pixel comprises z number of lines disposed at the first to $z^{th}$ line formation areas,
wherein each of the first pixel and the second pixel comprises a line non-disposition area, and
wherein the additional pattern portion is disposed at the line non-disposition area of each of the first pixel and the second pixel to overlap the reference voltage line disposed at each of the first pixel and the second pixel.

14. The display apparatus of claim 13,
wherein a size of an overlap area between the additional pattern portion and the reference voltage line disposed at the first pixel corresponds to a size obtained by subtracting a size of an overlap area between the branch network and the reference voltage line disposed at the first pixel from a size of an overlap area between the branch network and the reference voltage line disposed at the third pixel, and
wherein a size of an overlap area between the additional pattern portion and the reference voltage line disposed at the second pixel corresponds to a size obtained by subtracting a size of an overlap area between the branch network and the reference voltage line disposed at the second pixel from the size of the overlap area between the branch network and the reference voltage line disposed at the third pixel.

15. The display apparatus of claim 7, further comprising a plurality of pixel driving power lines and a plurality of pixel common voltage lines disposed at the display area and coupled to the plurality of pixels,
wherein the lines of the branch network cross the plurality of reference voltage lines, the plurality of pixel driving power lines, and the plurality of pixel common voltage lines, and
wherein the additional pattern portion includes:
a plurality of first additional patterns crossing the plurality of data lines, the reference voltage line, the pixel driving power line, and the pixel common voltage line disposed at the line non-disposition area of the first pixel and disposed at the first pixel; and
a plurality of second additional patterns crossing the plurality of data lines, the reference voltage line, the pixel driving power line, and the pixel common voltage line disposed at the line non-disposition area of the second pixel and disposed at the second pixel.

16. The display apparatus of claim 15,
wherein each of the plurality of first additional patterns is electrically coupled to the pixel driving power line or the pixel common voltage line disposed at the first pixel, and
wherein each of the plurality of second additional patterns is electrically coupled to the pixel driving power line or the pixel common voltage line disposed at the second pixel.

17. The display apparatus of claim 16, further comprising:
a buffer layer covering the plurality of data lines, the plurality of reference voltage lines, the plurality of pixel driving power lines, and the plurality of pixel common voltage lines disposed over the substrate;
a gate insulation layer disposed between the buffer layer and each of the plurality of gate lines, the lines of the branch network, and a compensation pattern portion; and
an interlayer insulation layer covering the plurality of gate lines, the lines of the branch network, and the compensation pattern portion disposed over the buffer layer,
wherein each of the plurality of first additional patterns and one of the plurality of second additional patterns is electrically coupled to the pixel driving power line or the pixel common voltage line through a pattern contact hole passing through the gate insulation layer and the buffer layer.

18. A multi-screen display apparatus, comprising:
a plurality of display devices disposed along at least one direction of a first direction and a second direction crossing the first direction, each of the plurality of display devices including:
a display area including a plurality of pixels arranged along the first direction and the second direction over a substrate;
a plurality of gate lines, a plurality of data lines, and a plurality of reference voltage lines disposed at the display area and coupled to the plurality of pixels; and
a gate driving circuit including a plurality of stage circuit units disposed at the display area and coupled to each of the plurality of gate lines,
wherein the plurality of stage circuit units include:
a plurality of branch circuits divisionally disposed between the plurality of pixels along the first direction;
a branch network disposed at a network line formation portion positioned at one side of each of the plurality of pixels disposed along the first direction, the branch network including a plurality of control node lines and a plurality of network lines selectively coupled to the plurality of branch circuits; and
an additional pattern portion disposed at the network line formation portion to overlap a reference voltage line disposed at each of some of the plurality of pixels, the additional pattern portion protruding from one of the plurality of control node lines.

19. The multi-screen display apparatus of claim 18,
wherein in each of the plurality of display devices, the plurality of pixels are arranged to have a pixel pitch along the first direction and the second direction,
wherein the pixel pitch is a distance between center portions of adjacent pixels along the first direction or/and the second direction, and
wherein in a first display device and a second display device adjacent along the first direction or/and the second direction, a distance between a center portion of an outermost pixel of the first display device and a center portion of an outermost pixel of the second display device is less than or equal to the pixel pitch.

20. A display apparatus, comprising:
   a plurality of pixels;
   a plurality of gate lines coupled to the plurality of pixels;
   a plurality of reference voltage lines coupled to the plurality of pixels; and
   a stage circuit coupled to one of the plurality of gate lines, the stage circuit including:
      a plurality of branch circuits disposed between the plurality of pixels;
      a branch network disposed at one side of each of the plurality of pixels, the branch network including:
         a plurality of control node lines; and
         a plurality of network lines;
      wherein each of the plurality of branch circuits is coupled to one or more of the plurality of control node lines, one or more of the plurality of network lines, or both; and
      a protrusion extending from one of the plurality of control node lines, the protrusion being disposed at an overlap of one of the plurality of reference voltage lines with the one of the plurality of control node lines.

21. The display apparatus of claim 20, further comprising:
   a second protrusion extending from the one of the plurality of control node lines, the second protrusion being disposed at a second overlap of another of the plurality of reference voltage lines with the one of the plurality of control node lines, the second protrusion being smaller than the protrusion.

* * * * *